（12） United States Patent
Ichikawa et al.

(10) Patent No.: US 8,753,796 B2
(45) Date of Patent: Jun. 17, 2014

(54) PHOTORESIST COMPOSITION

(75) Inventors: Koji Ichikawa, Osaka (JP); Hiromu Sakamoto, Osaka (JP); Yuichi Mukai, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 46 days.

(21) Appl. No.: 13/443,155

(22) Filed: Apr. 10, 2012

(65) Prior Publication Data

US 2012/0264055 A1    Oct. 18, 2012

(30) Foreign Application Priority Data

Apr. 13, 2011  (JP) ................................. 2011-089064

(51) Int. Cl.
*G03F 7/039* (2006.01)
*G03F 7/38* (2006.01)

(52) U.S. Cl.
USPC .................... 430/280.1; 430/270.1; 430/326; 430/330

(58) Field of Classification Search
None
See application file for complete search history.

(56) References Cited

U.S. PATENT DOCUMENTS

| | | | |
|---|---|---|---|
| 2005/0153233 A1 | 7/2005 | Wu et al. | |
| 2006/0234154 A1 | 10/2006 | Nishimura et al. | |
| 2007/0100096 A1 | 5/2007 | Harada et al. | |
| 2007/0298352 A1 | 12/2007 | Kobayashi et al. | |
| 2008/0124656 A1* | 5/2008 | Kobayashi et al. | 430/286.1 |
| 2009/0068590 A1 | 3/2009 | Dazai et al. | |
| 2009/0226842 A1 | 9/2009 | Shimizu et al. | |
| 2010/0063232 A1 | 3/2010 | Nagai et al. | |
| 2010/0086873 A1 | 4/2010 | Seshimo et al. | |
| 2010/0178609 A1 | 7/2010 | Dazai et al. | |
| 2010/0323296 A1 | 12/2010 | Ichikawa et al. | |
| 2011/0065041 A1 | 3/2011 | Ichikawa et al. | |
| 2011/0200936 A1* | 8/2011 | Ichikawa et al. | 430/270.1 |
| 2011/0250538 A1* | 10/2011 | Li et al. | 430/270.1 |
| 2011/0318687 A1* | 12/2011 | Saegusa et al. | 430/270.1 |
| 2012/0028188 A1 | 2/2012 | Ichikawa et al. | |
| 2012/0141939 A1* | 6/2012 | Thackeray et al. | 430/285.1 |
| 2012/0178021 A1 | 7/2012 | Kim et al. | |
| 2012/0219904 A1* | 8/2012 | Ichikawa et al. | 430/280.1 |
| 2012/0258401 A1* | 10/2012 | Ichikawa et al. | 430/280.1 |

OTHER PUBLICATIONS

Crivello, James V. Journal of Polymer Science; Part A; Polymer Chemistry, vol. 37, pp. 4241-4254 (1999).*
U.S. Final Rejection dated Sep. 18, 2013 for U.S. Appl. No. 13/290,558.
U.S. Final Rejection dated Sep. 27, 2013 for U.S. Appl. No. 13/290,618.
U.S. Office Action dated Apr. 10, 2013 for U.S. Appl. No. 13/290,558.
U.S. Office Action dated Apr. 19, 2013 for U.S. Appl. No. 13/290,618.

* cited by examiner

*Primary Examiner* — Cynthia Hamilton
(74) *Attorney, Agent, or Firm* — Birch, Stewart, Kolasch & Birch, LLP

(57) ABSTRACT

The present invention provides a photoresist composition comprising a salt represented by the formula (I):

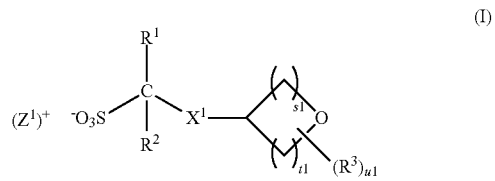

wherein $R^1$ and $R^2$ independently each represent a fluorine atom or a C1-C6 perfluoroalkyl group, $X^1$ represents a C1-C17 divalent saturated hydrocarbon group, etc., s1 represents 1 or 2, and t1 represents 0 or 1, with proviso that sum of s1 and t1 is 1 or 2, $R^3$ represents a C1-C12 saturated hydrocarbon group, etc., u1 represents an integer of 0 to 8, and $(Z^1)^+$ represents an organic cation,
a salt represented by the formula (II-0):

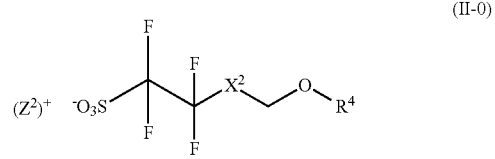

wherein $R^4$ represents a C1-C24 hydrocarbon group etc., $X^2$ represents a C1-C6 alkanediyl group etc., and $(Z^2)^+$ represents an organic cation, and
a resin being insoluble or poorly soluble in an aqueous alkali solution but becoming soluble in an aqueous alkali solution by the action of an acid.

8 Claims, No Drawings

PHOTORESIST COMPOSITION

This nonprovisional application claims priority under 35 U.S.C. §119(a) on Patent Application No. 2011-089064 filed in JAPAN on Apr. 13, 2011, the entire contents of which are hereby incorporated by reference.

FIELD OF THE INVENTION

The present invention relates to a photoresist composition.

BACKGROUND OF THE INVENTION

A photoresist composition is used for semiconductor microfabrication employing a lithography process.

US 2007/0100096 A1 discloses a photoresist composition comprises a resin comprising the following structural units:

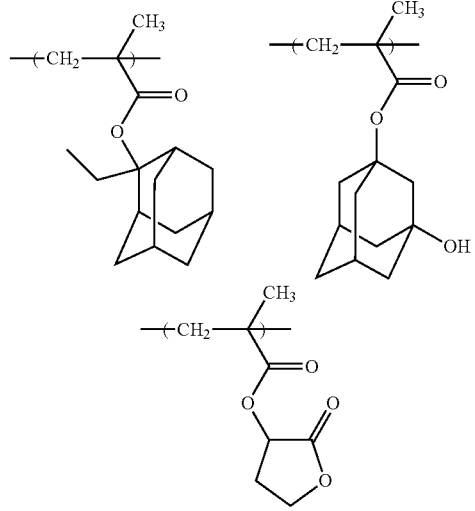

and an acid generator represented by the following formula.

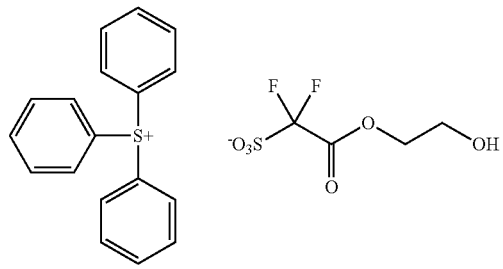

SUMMARY OF THE INVENTION

The present invention is to provide a photoresist composition.

The present invention relates to the followings:

[1] A photoresist composition comprising a salt represented by the formula (I):

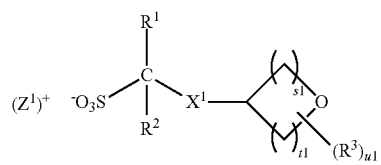

wherein $R^1$ and $R^2$ independently each represent a fluorine atom or a C1-C6 perfluoroalkyl group, $X^1$ represents a C1-C17 divalent saturated hydrocarbon group in which one or more hydrogen atoms can be replaced by a fluorine atom and in which one or more —$CH_2$— can be replaced by —O— or —CO—, s1 represents 1 or 2, and t1 represents 0 or 1, with proviso that sum of s1 and t1 is 1 or 2, $R^3$ represents a C6-C18 aromatic hydrocarbon group or a C1-C12 saturated hydrocarbon group in which one or more hydrogen atoms can be replaced by a C1-C6 alkyl group or a nitro group and in which one or more —$CH_2$— can be replaced by —O—, u1 represents an integer of 0 to 8, and $(Z^1)^+$ represents an organic cation, a salt represented by the formula (II-0):

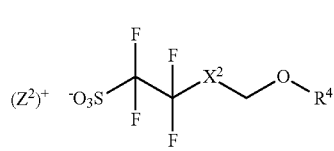

wherein $R^4$ represents a C1-C24 hydrocarbon group in which one or more hydrogen atoms can be replaced by a fluorine atom or —OH and in which one or more —$CH_2$— can be replaced by —O— or —CO—, $X^2$ represents a C1-C6 alkanediyl group in which one or more —$CH_2$— can be replaced by —O— or —CO— and in which one or more hydrogen atoms can be replaced by —OH or —$OR^5$ wherein $R^5$ represents a C1-C24 hydrocarbon group in which one or more hydrogen atoms can be replaced by a fluorine atom or —OH and in which one or more —$CH_2$— can be replaced by —O— or —CO—, and $(Z^2)^+$ represents an organic cation, and a resin being insoluble or poorly soluble in an aqueous alkali solution but becoming soluble in an aqueous alkali solution by the action of an acid;

[2] The photoresist composition according to [1], wherein the salt represented by the formula (II-0) is a salt represented by the formula (II):

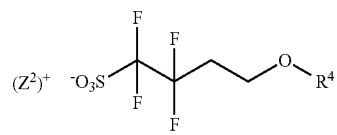

wherein $R^4$ and $(Z^2)^+$ are the same as defined in [1], a salt represented by the formula (III-A):

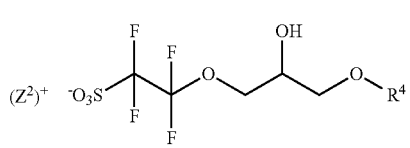

wherein $R^4$ and $(Z^2)^+$ are the same as defined in [1], or a salt represented by the formula (III-B):

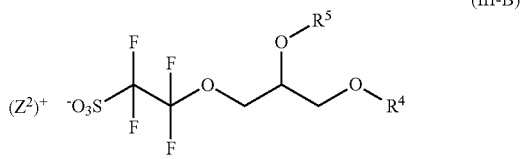

(III-B)

wherein $R^4$, $R^5$ and $(Z^2)^+$ are the same as defined in [1];

[3] The photoresist composition according to [1], wherein the salt represented by the formula (II-0) is a salt represented by the formula (II);

[4] The photoresist composition according to any one of [1] to [3], wherein $X^1$ is *—CO—O—CH$_2$— in which * represents a binding position to —C(R$^1$)(R$^2$)—;

[5] The photoresist composition according to any one of [1] to [4], wherein $(Z^1)^+$ is a triarylsulfonium cation;

[6] The photoresist composition according to any one of [1] to [5], wherein $(Z^2)^+$ is a triarylsulfonium cation;

[7] The photoresist composition according to any one of [1] to [6], which further comprises a solvent;

[8] The photoresist composition according to any one of [1] to [7], which further comprises a basic compound;

[9] A process for producing a photoresist pattern comprising:
  (1) a step of applying the photoresist composition according to any one of [1] to [8]) on a substrate to form a photoresist composition layer,
  (2) a step of forming a photoresist film by drying the photoresist composition layer formed,
  (3) a step of exposing the photoresist film to radiation,
  (4) a step of heating the photoresist film after exposing, and
  (5) a step of developing the photoresist film after heating.

DESCRIPTION OF PREFERRED EMBODIMENTS

The photoresist composition of the present invention comprises a salt represented by the formula (I) (hereinafter, simply referred to as SALT (I)), a salt represented by the formula (II-0) (hereinafter, simply referred to as SALT (II-0)) and a resin being insoluble or poorly soluble in an aqueous alkali solution but becoming soluble in an aqueous alkali solution by the action of an acid (hereinafter, simply referred to as RESIN).

First, SALT (I) will be illustrated.

SALT (1) is represented by the formula (I):

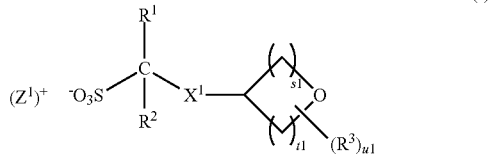

(I)

wherein $R^1$ and $R^2$ independently each represent a fluorine atom or a C1-C6 perfluoroalkyl group, $X^1$ represents a C1-C17 divalent saturated hydrocarbon group in which one or more hydrogen atoms can be replaced by a fluorine atom and in which one or more —CH$_2$— can be replaced by —O— or —CO—, s1 represents 1 or 2, and t1 represents 0 or 1, with Proviso that sum of s1 and t1 is 1 or 2, $R^3$ represents a C6-C18 aromatic hydrocarbon group or a C1-C12 saturated hydrocarbon group in which one or more hydrogen atoms can be replaced by a C1-C6 alkyl group or a nitro group and in which one or more —CH$_2$— can be replaced by —O—, u1 represents an integer of 0 to 8, and $(Z^1)^+$ represents an organic cation.

Examples of the C1-C6 perfluoroalkyl group include a trifluoromethyl group, a pentafluoroethyl group, a perfluoropropyl group, a perfluoroisopropyl group, a perfluorobutyl group, a perfluoro-sec-butyl group, a perfluoro-tert-butyl group, a perfluoropentyl group and a perfluorohexyl group, and a trifluoromethyl group is preferable. $R^1$ and $R^2$ each independently preferably represent a fluorine atom or a trifluoromethyl group, and $R^1$ and $R^2$ are more preferably fluorine atoms.

Examples of the C1-C17 divalent saturated hydrocarbon group include a C1-C17 linear or branched chain alkanediyl group, a divalent alicyclic saturated hydrocarbon group and a group formed by combining two or more groups selected from the group consisting of the above-mentioned C1-C17 linear or branched chain alkanediyl group and the above-mentioned divalent alicyclic saturated hydrocarbon group.

Examples of the linear alkanediyl group include a methylene group, an ethylene group, a propane-1,3-diyl group, a butane-1,4-diyl group, a pentane-1,5-diyl, a hexane-1,6-diyl group, a heptane-1,7-diyl group, an octane-1,8-diyl group, a nonane-1,9-diyl group, a decane-1,10-diyl group, an undecane-1,11-diyl group, a dodecane-1,12-diyl group, a tridecane-1,13-diyl group, a tetradecane-1,14-diyl group, a pentadecane-1,15-diyl group, a hexadecane-1,16-diyl group and a heptadecane-1,17-diyl group. Examples of the branched chain alkanediyl group include a butane-1,3-diyl group, a 2-methylpropane-1,3-diyl group, a 2-methylpropane-1,2-diyl group, a pentane-1,4-diyl group and a 2-methylbutane-1,4-diyl group. Examples of the divalent alicyclic saturated hydrocarbon group include a cycloalkanediyl group such as a cyclohexanediyl group and a divalent bridged alicyclic saturated hydrocarbon group such as an adamantanediyl group.

One or more hydrogen atoms in the C1-C17 divalent saturated hydrocarbon group can be replaced by a fluorine atom, and examples of the C1-C17 divalent saturated hydrocarbon group in which one or more hydrogen atoms are replaced by a fluorine atom include the following divalent groups.

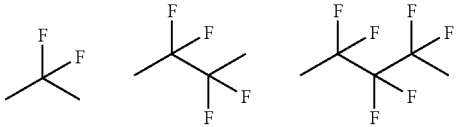

One or more —CH$_2$— in the C1-C17 divalent saturated hydrocarbon group can be replaced by —O— or —CO—, and examples of the C1-C17 divalent saturated hydrocarbon group in which one or more —CH$_2$— are replaced by —O— or —CO— include *—CO—O-L$^{b2}$-, *—CO—O-L$^{b4}$-CO—O-L$^{b3}$-, *-L$^{b5}$-O—CO—, *L$^{b7}$-O-L$^{b6}$-, *—CO—O-L$^{b8}$-O—, and *—CO—O-L$^{b10}$-O-L$^{b9}$-CO—O—, wherein $L^{b2}$ represents a single bond or a C1-C15 divalent saturated hydrocarbon group, $L^{b3}$ represents a single bond or a C1-C12 divalent saturated hydrocarbon group, $L^{b4}$ represents a C1-C13 divalent saturated hydrocarbon group, with proviso that total carbon number of $L^{b3}$ and $L^{b4}$ is 1 to 13, $L^{b5}$ represents a C1-C15 divalent saturated hydrocarbon group, $L^{b6}$ represents a C1-C15 divalent saturated hydrocarbon group, $L^{b7}$ represents a C1-C15 divalent saturated hydrocarbon group, with proviso that total carbon number of $L^{b6}$ and $L^{b7}$ is 1 to 16, $L^{b8}$ represents a C1-C14 divalent saturated hydrocarbon group, $L^{b9}$ represents a C1-C11 divalent saturated hydrocarbon group, $L^{b10}$ represents a C1-C11 divalent saturated hydrocarbon group, with proviso that total carbon number of $L^{b9}$ and $L^{b10}$ is 1 to 12, and * represents a binding position to —C($R^1$)($R^2$)—.

Among them, preferred is *—CO—O-$L^{b2}$-, *—CO—O-$L^{b4}$-CO—O-$L^{b3}$-, *-$L^{b5}$-O—CO—, or *-$L^{b7}$-O-$L^{b6}$-, and more preferred are *—CO—O-$L^{b2}$ or *—CO—O-$L^{b4}$-CO—O-$L^{b3}$-, and still more preferred is *—CO—O-$L^{b2}$-, and especially preferred is *—CO—O-$L^{b2}$- in which $L^{b2}$ is a single bond or —CH$_2$—.

Examples of *—CO—O-$L^{b2}$- include *—CO—O— and *—CO—O—CH$_2$—. Examples of *—CO—O-$L^{b4}$-CO—O-$L^{b3}$- include *—CO—O—CH$_2$—CO—O—, *—CO—O—(CH$_2$)$_2$—CO—O—, *—CO—O—(CH$_2$)$_3$—CO—O—, *—CO—O—(CH$_2$)$_4$—CO—O—, *—CO—O—(CH$_2$)$_6$—CO—O—, *—CO—O—(CH$_2$)$_8$—CO—O—, *—CO—O—CH$_2$—CH(CH$_3$)—CO—O— and *—CO—O—CH$_2$—C(CH$_3$)$_2$—CO—O—. Examples of *-$L^{b5}$-O—CO— include *—CH$_2$—O—CO—, *—(CH$_2$)$_2$—O—CO—, *—(CH$_2$)$_3$—O—CO—, *—(CH$_2$)$_4$—O—CO—, *—(CH$_2$)$_6$—O—CO— and *—(CH$_2$)$_8$—O—CO—. Examples of *-$L^{b7}$-O-$L^{b6}$- include *—CH$_2$—O—CH$_2$—. Examples of *—CO—O-$L^{b0}$-O— include *—CO—O—CH$_2$—O—, *—CO—O—(CH$_2$)$_2$—O—, *—CO—O—(CH$_2$)$_3$—O—, *—CO—O—(CH$_2$)$_4$—O— and *—CO—O—(CH$_2$)$_6$—O—. Examples of *—CO—O-$L^{b10}$-O-$L^{b9}$-CO—O— include the followings.

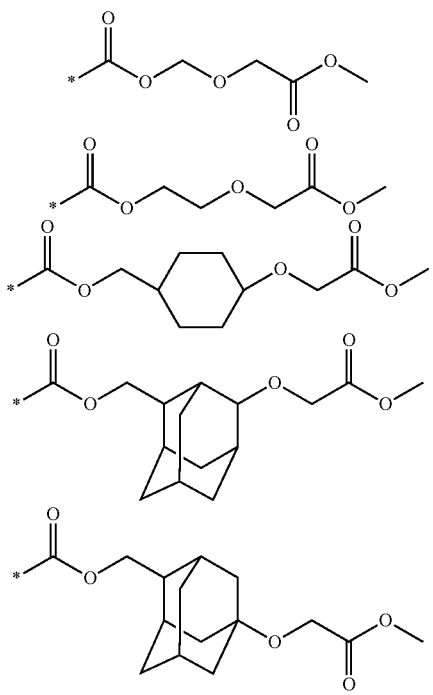

Examples of the C1-C12 saturated hydrocarbon group represented by $R^3$ include an alkyl group and an alicyclic hydrocarbon group, and a C1-C12 alkyl group and a C3-C12 alicyclic hydrocarbon group are preferable. Examples of the alkyl group include a methyl group, an ethyl group, a propyl group, a butyl group, a pentyl group and a hexyl group. The alicyclic hydrocarbon group may be monocyclic or polycyclic. Examples of the monocyclic alicyclic hydrocarbon group include a cycloalkyl group such as a cyclopentyl group, a cyclohexyl group, a methylcyclohexyl group, a dimethyl- cyclohexyl group, a cycloheptyl group and a cyclooctyl group. Examples of the polycyclic alicyclic hydrocarbon group include a decahydronaphthyl group, an adamantyl group, a norbornyl group, a methylnorbornyl group and the following groups.

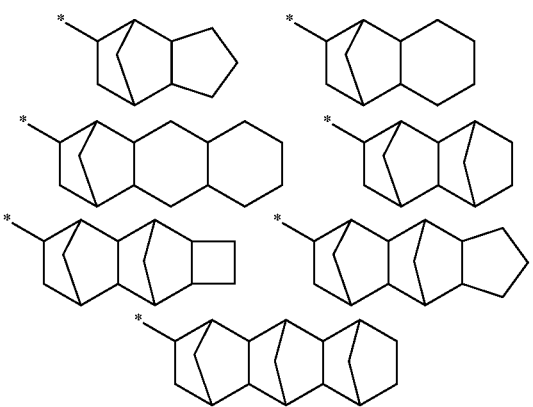

Among them, preferred are a cyclohexyl group and an adamantyl group.

One or more hydrogen atoms in the C1-C12 saturated hydrocarbon group can be replaced by a C1-C6 alkyl group or a nitro group, and examples of the C1-C12 saturated hydrocarbon group in which one or more hydrogen atoms are replaced by a C1-C6 alkyl group or a nitro group include a methoxyethoxyethyl group and the following group.

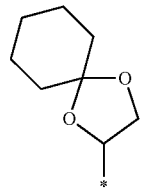 [SMILES: *C1COC2(CCCCC2)O1]

Examples of the C6-C18 aromatic hydrocarbon group represented by $R^3$ include a phenyl group and a naphthyl group.

In the formula (I), s1 is preferably 1, and t1 is preferably 0 or 1.

Examples of SALT (I) include the following.

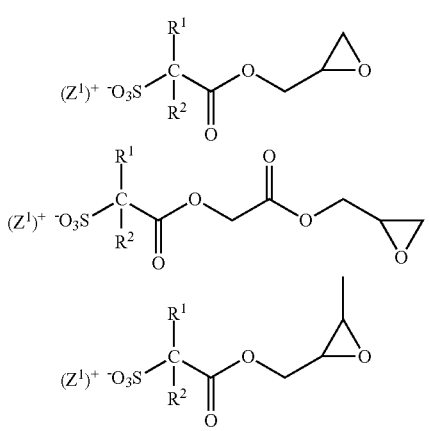

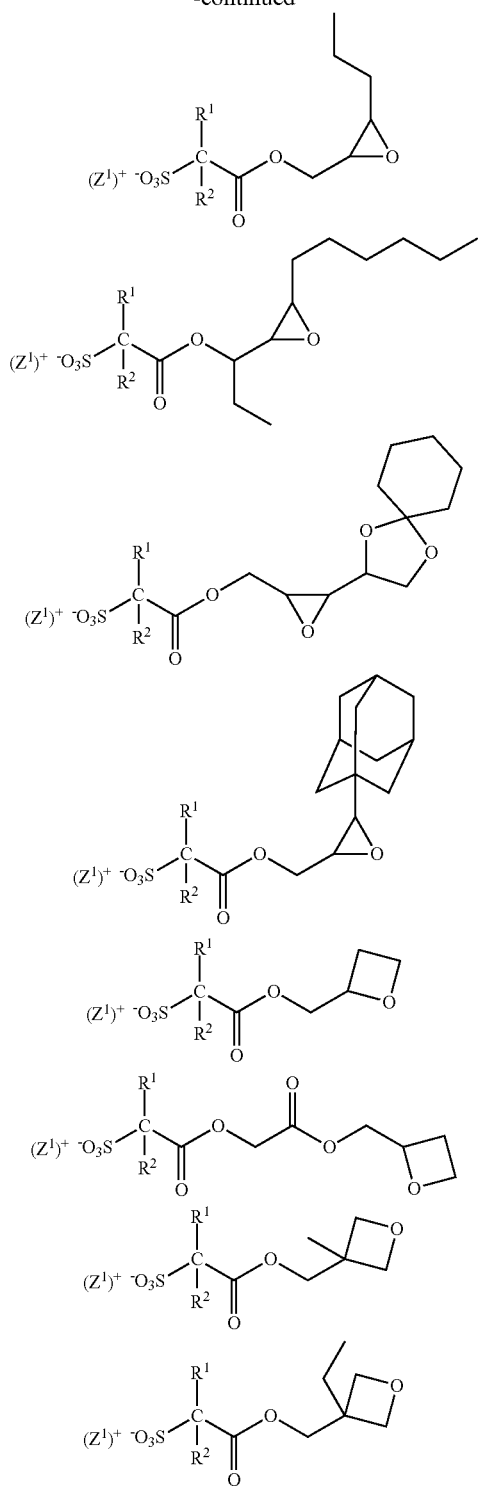

Examples of the organic cation represented by $(Z^1)^+$ include an onium cation such as an organic sulfonium cation, an organic iodonium cation, an organic ammonium cation, a benzothiazolium cation and an organic phosphonium cation, and an organic sulfonium cation and an organic iodonium cation are preferable, and an organic sulfonium cation is more preferable, and a triarylsulfonium cation is still more preferable.

Preferable examples of the organic cation represented by $(Z^1)^+$ include the organic cations represented by the formulae (b2-1) to (b2-4)

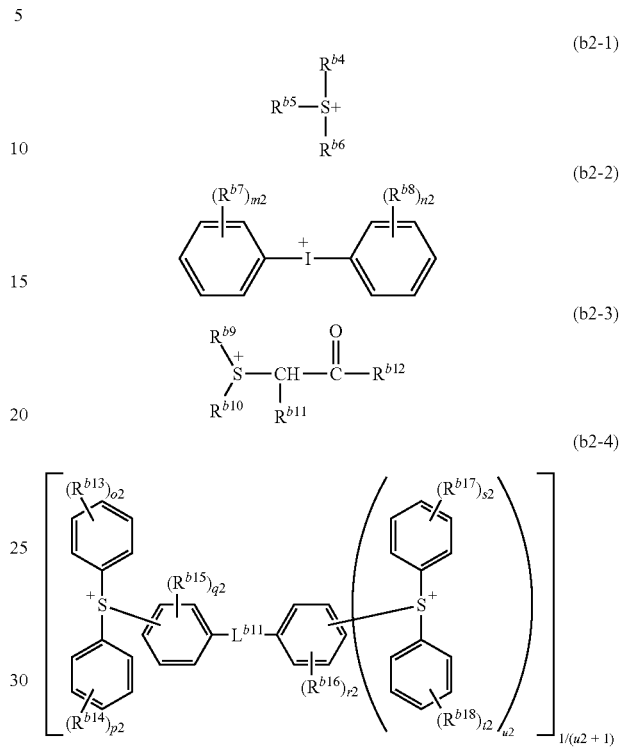

wherein $R^{b4}$, $R^{b5}$ and $R^{b6}$ independently represent a C1-C30 alkyl group which can have one or more substituents selected from the group consisting of a hydroxyl group, a C1-C12 alkoxy group and a C6-C18 aromatic hydrocarbon group, a C3-C18 alicyclic hydrocarbon group which can have one or more substituents selected from the group consisting of a halogen atom, a C2-C4 acyl group and a glycidyloxy group, or a C6-C18 aromatic hydrocarbon group which can have one or more substituents selected from the group consisting of a halogen atom, a hydroxyl group, a C1-C18 aliphatic hydrocarbon group, a C3-C18 alicyclic hydrocarbon group and a C1-C12 alkoxy group, and $R^{b4}$ and $R^{b5}$ can be bonded each other to form a ring containing $S^+$, $R^{b7}$ and $R^{b8}$ are independently in each occurrence a hydroxyl group, a C1-C12 alkyl group or a C1-C12 alkoxy group, m2 and n2 independently represents an integer of 0 to 5, $R^{b9}$ and $R^{b10}$ independently represent a C1-C18 alkyl group or a C3-C18 alicyclic hydrocarbon group, or $R^{b9}$ and $R^{b10}$ are bonded to form a C2-C11 divalent acyclic hydrocarbon group which forms a ring together with the adjacent $S^+$, and one or more —$CH_2$— in the divalent acyclic hydrocarbon group may be replaced by —CO—, —O— or —S—, and $R^{b11}$ represents a hydrogen atom, a C1-C18 alkyl group, a C3-C18 alicyclic hydrocarbon group or a C6-C18 aromatic hydrocarbon group, $R^{b12}$ represents a C1-C12 alkyl group, a C3-C18 alicyclic hydrocarbon group or a C6-C18 aromatic hydrocarbon group and the aromatic hydrocarbon group can have one or more substituents selected from the group consisting of a C1-C12 alkyl group, a C1-C12 alkoxy group, a C3-C18 alicyclic hydrocarbon group and a C2-C13 acyloxy group, or $R^{b11}$ and $R^{b12}$ are bonded each other to form a C1-C10 divalent acyclic hydrocarbon group which forms a 2-oxocycloalkyl group together with the adjacent —CHCO—, and one or more —CH$_2$— in the divalent acyclic hydrocarbon group may be replaced by —CO—, —O— or —S—, and R$^{b13}$, R$^{b14}$, R$^{b15}$, R$^{b16}$, R$^{b17}$ and R$^{b18}$ independently represent a hydroxyl group, a C1-C12 alkyl group or a C1-C12 alkoxy group, L$^{b11}$ represents —S— or —O— and o2, p2, s2 and t2 each independently represents an integer of 0 to 5, q2 and r2 each independently represents an integer of 0 to 4, and u2 represents 0 or 1.

The alkyl group represented by R$^{b4}$, R$^{b5}$ and R$^{b6}$ has preferably 1 to 12 carbon atoms. The alicyclic hydrocarbon group represented by R$^{b4}$, R$^{b5}$ and R$^{b6}$ has preferably 4 to 12 carbon atoms.

The alkyl group represented by R$^{b9}$ to R$^{b11}$ has preferably 1 to 12 carbon atoms. The alicyclic hydrocarbon group represented by R$^{b9}$ to R$^{b11}$ has preferably 4 to 12 carbon atoms. The alicyclic hydrocarbon group represented by R$^{b12}$ has preferably 4 to 12 carbon atoms.

Preferable examples of the alkyl group include a methyl group, an ethyl group, a propyl group, an isopropyl group, a butyl group, a sec-butyl group, a tert-butyl group, a pentyl group, a hexyl group, an octyl group, a 2-ethylhexyl group, a decyl group, a dodecyl group, a hexadecyl group, a pentadecyl group, a heptadecyl group and an octadecyl group, and more preferable examples thereof include a methyl group, an ethyl group, a propyl group, an isopropyl group, a butyl group, a sec-butyl group, a tert-butyl group, a pentyl group, a hexyl group, an octyl group and a 2-ethylhexyl group. The alicyclic hydrocarbon group may be monocyclic or polycyclic.

Preferable examples of the monocyclic alicyclic hydrocarbon group include a cycloalkyl group such as a cyclopropyl group, a cyclobutyl group, a cyclopentyl group, a cyclohexyl group, a cycloheptyl group and a cyclodecyl group. Preferable examples of the polycyclic alicyclic hydrocarbon group include a decahydronaphthyl group, an adamantyl group, a 2-alkyladamantan-2-yl group, a 1-(adamantan-1-yl)alkan-1-yl group, an isobornyl group, a methylnorbornyl group and the following groups.

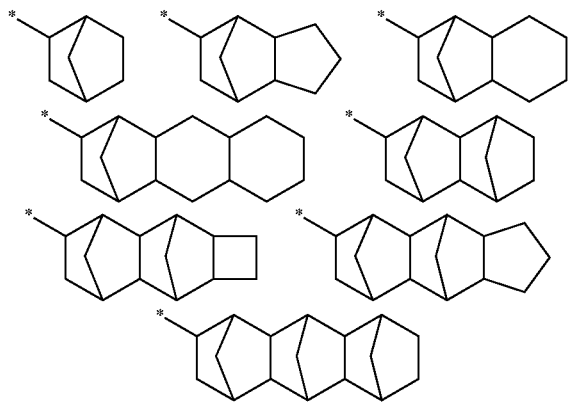

More preferable examples of the alicyclic hydrocarbon group include a cyclopropyl group, a cyclobutyl group, a cyclopentyl group, a cyclohexyl group, a cycloheptyl group, a cyclodecyl group, a 2-alkyladamantan-2-yl group, a 1-(adamantan-1-yl)alkan-1-yl group, and an isobornyl group.

Preferable examples of the aromatic group include a phenyl group, a 4-methylphenyl group, a 4-ethylphenyl group, a 4-tert-butylphenyl group, a 4-cyclohexylphenyl group, a 4-methoxyphenyl group, a biphenyl group, a naphthyl group, an anthryl group, a p-adamantylphenyl group, a tolyl group, a mesityl group, a phenathryl group, a 2,6-diethylphenyl group and a 2-methyl-6-ethylphenyl group.

Examples of the C1-C12 alkoxy group include a methoxy group, an ethoxy group, a propoxy group, a butoxy group, a pentyloxy group, a hexyloxy group, a heptyloxy group, an octyloxy group, a decyloxy group and a dodecyloxy group. Examples of the halogen atom include a fluorine atom, a chlorine atom, a bromine atom and an iodine atom. Examples of the C2-C4 acyl group include an acetyl group, propionyl group, a butyryl group, isopropylcarbonyloxy group, a butylcarbonyloxy group, a sec-butylcarbonyloxy group, a tert-butylcarbonyloxy group, a pentylcarbonyloxy group, a hexylcarbonyloxy group, an octylcarbonyloxy group and a 2-ethylhexylcarbonyloxy group.

The ring containing S$^+$ formed by bonding R$^{b4}$ and R$^{b5}$ each other may be a monocyclic ring, a polycyclic ring, an aromatic ring, a non-aromatic ring, a saturated ring or a unsaturated ring.

The ring can contain one or more sulfur atom or oxygen atom in addition to S$^+$. The ring preferably has 3 to 18 carbon atoms, and more preferably has 4 to 13 carbon atoms.

Examples of the aliphatic hydrocarbon group having an aromatic hydrocarbon group include an aralkyl group such as a benzyl group.

Examples of the C3-C12 divalent acyclic hydrocarbon group formed by bonding R$^{b9}$ and R$^{b10}$ include a trimethylene group, a tetramethylene group and a pentamethylene group. Examples of the ring group formed together with the adjacent S$^+$ and the divalent acyclic hydrocarbon group include a thiolan-1-ium ring (tetrahydrothiphenium ring), a thian-1-ium ring and a 1,4-oxathian-4-ium ring. A C3-C7 divalent acyclic hydrocarbon group is preferable.

Examples of the C1-C10 divalent acyclic hydrocarbon group formed by bonding R$^{b11}$ and R$^{b12}$ include a methylene group, an ethylene group, a trimethylene group, a tetramethylene group and a pentamethylene group and examples of the ring group include the followings.

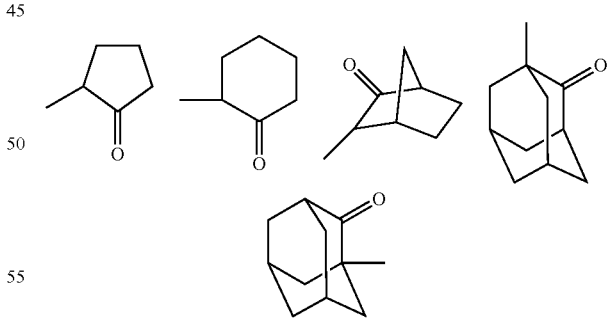

A C1-C5 divalent acyclic hydrocarbon group is preferable.

Examples of the cations represented by the formulae (b2-1) to (b2-4) include those described in JP 2010-204646 A.

Among the above-mentioned cations, preferred is the cation represented by the formula (b2-1), and more preferred is the cation represented by the formula (b2-1-1). A triphenylsulfonium cation and a trytolysulfonium cation are especially preferable.

(b2-1-1)

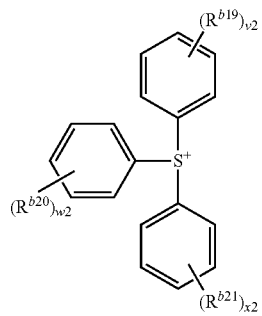

wherein $R^{b19}$, $R^{b20}$ and $R^{b21}$ are independently in each occurrence a halogen atom (preferably a fluorine atom), a hydroxyl group, a C1-C18 alkyl group, a C3-C18 alicyclic hydrocarbon group or a C1-C12 alkoxy group, and two selected from the group consisting of $R^{b19}$, $R^{b20}$ and $R^{b21}$ can be bonded each other to form a ring optionally having a heteroatom, and v2, w2 and x2 independently each represent an integer of 0 to 5.

The alkyl group has preferably 1 to 12 carbon atoms, and the alicyclic hydrocarbon group has preferably 4 to 18 carbon atoms, and v2, w2 and x2 independently each preferably represent 0 or 1.

It is preferred that $R^{b19}$, $R^{b20}$ and $R^{b21}$ are independently in each occurrence a halogen atom, a hydroxyl, group, a C1-C12 alkyl group or a C1-C12 alkoxy group, and v2, w2 and x2 independently each represent an integer of 0 to 5. It is more preferred that $R^{b19}$, $R^{b20}$ and $R^{b21}$ are independently in each occurrence a fluorine atom, a hydroxyl group, a C1-C12 alkyl group or a C1-C12 alkoxy group, and v2, w2 and x2 independently each represent 0 or 1.

Examples of SALT (I) include a salt wherein the anion part is any one of the above-mentioned anion and the cation part is any one of the above-mentioned cation.

Preferable examples of SALT (I) include the salts represented by the following formulae (I-1) to (I-44).

(I-1)

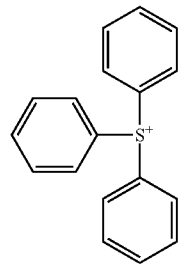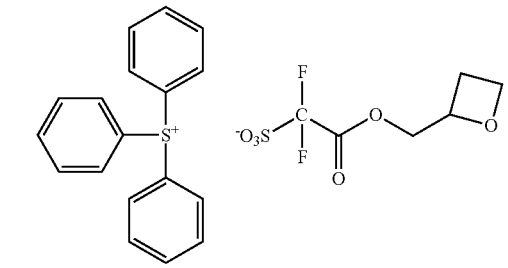

(I-2)

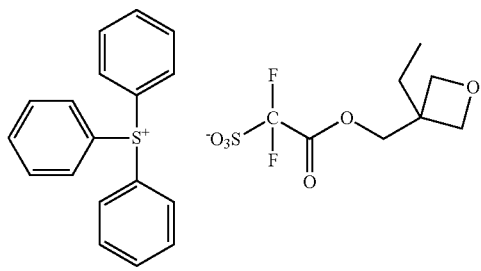

(I-3)

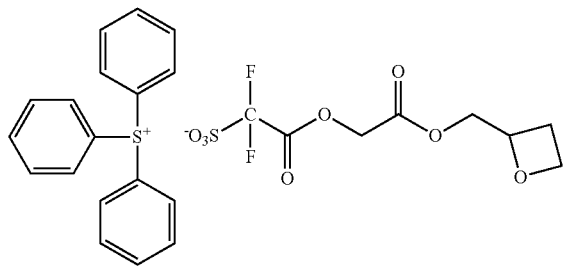

(I-4)

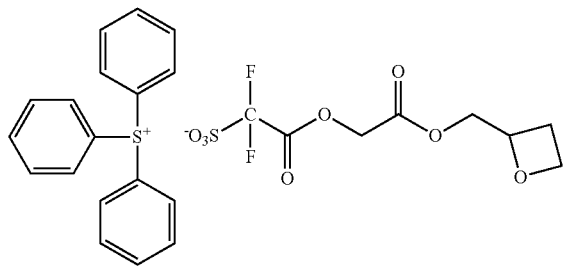

(I-5)

(I-6)

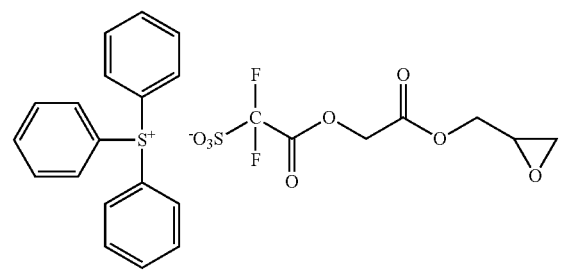

(I-7)

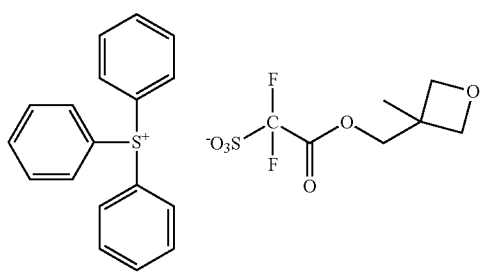

(I-8)
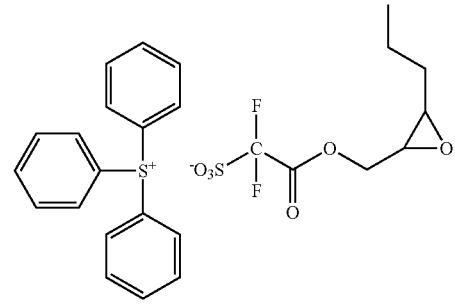
(I-9)
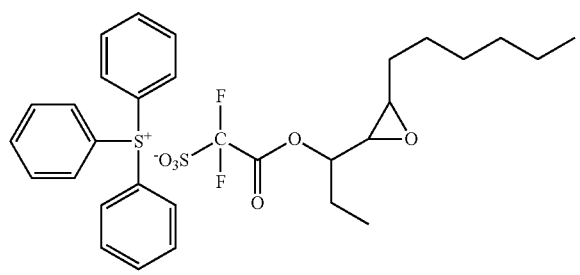
(I-10)
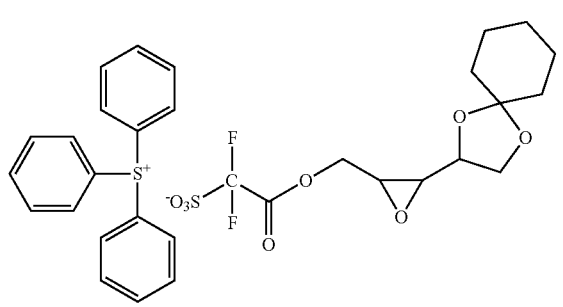
(I-11)
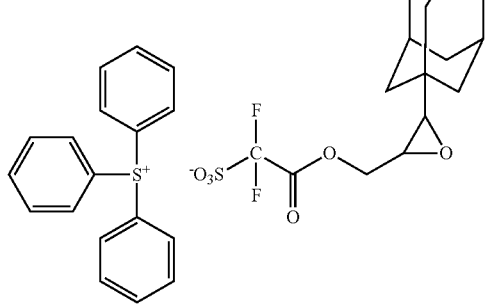
(I-12)
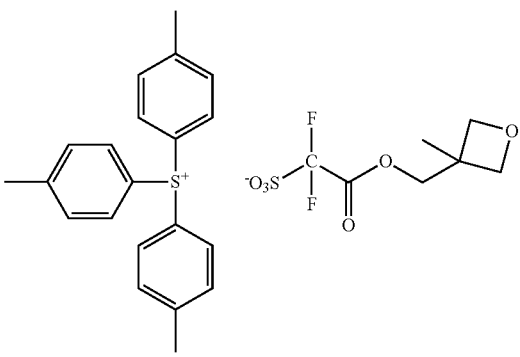
(I-13)
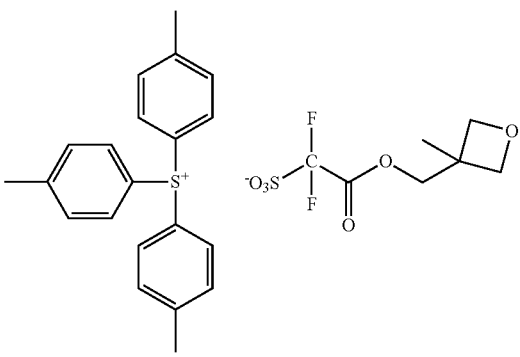
(I-14)
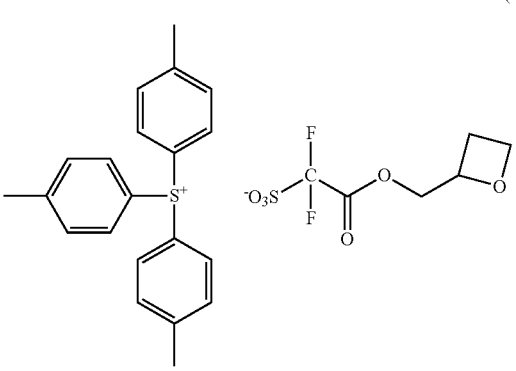
(I-15)
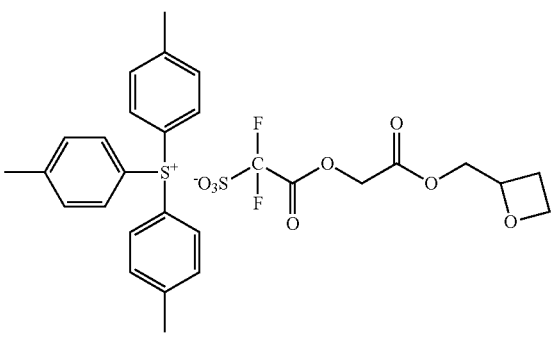
(I-16)
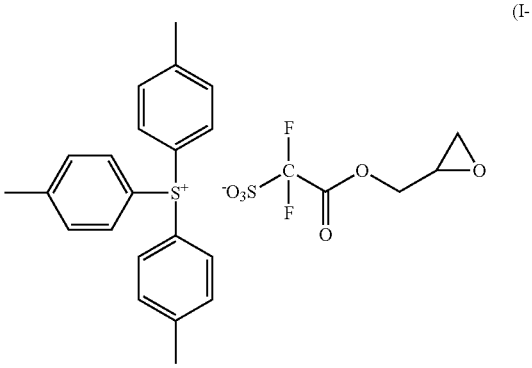

(I-17)
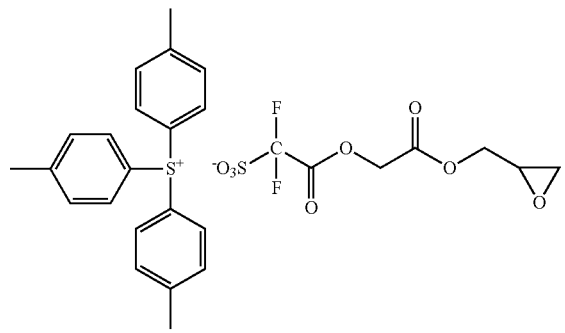
(I-21)
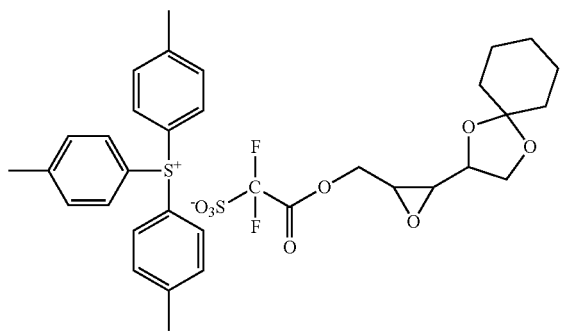
(I-18)
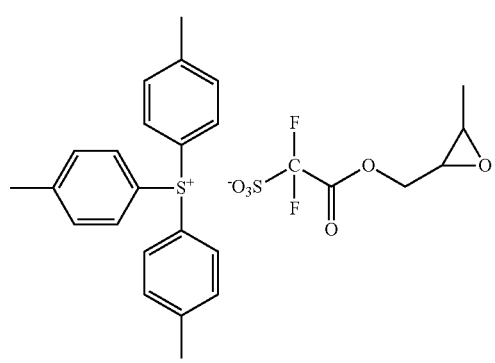
(I-22)
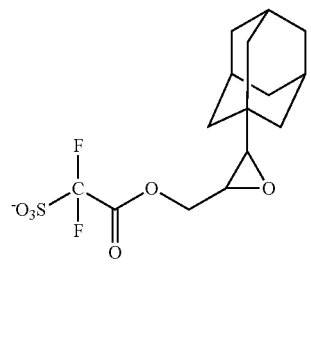
(I-19)
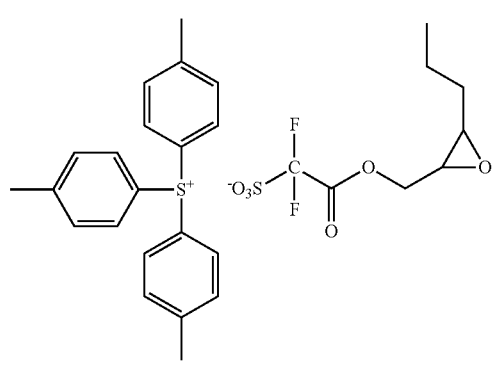
(I-23)
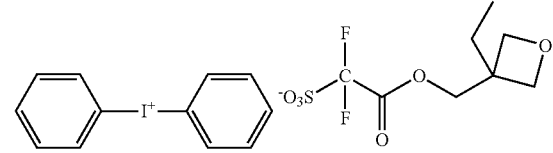
(I-24)
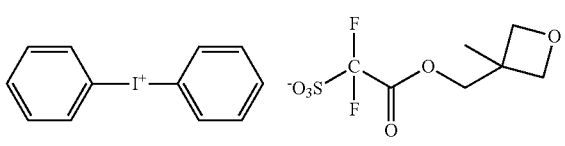
(I-25)
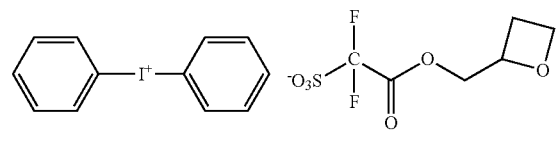
(I-26)
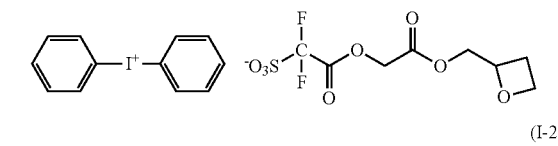
(I-20)
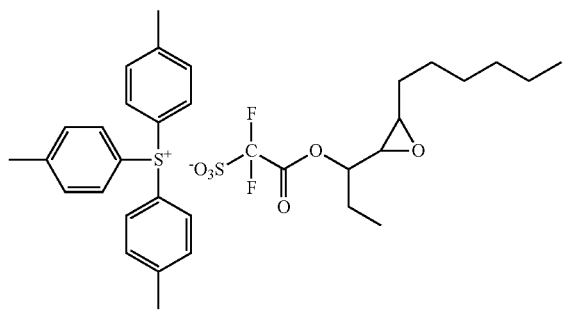
(I-27)

-continued
(I-28)
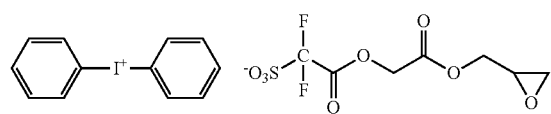
(I-29)
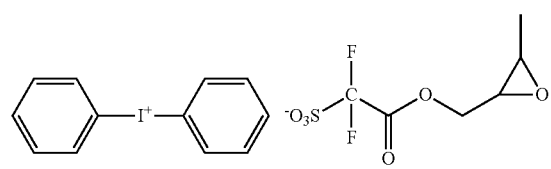
(I-30)
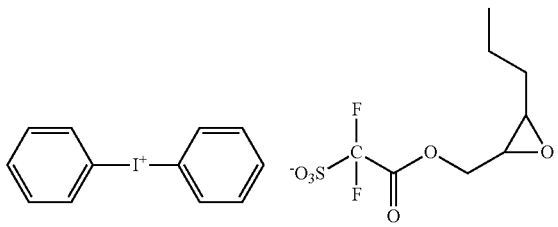
(I-31)
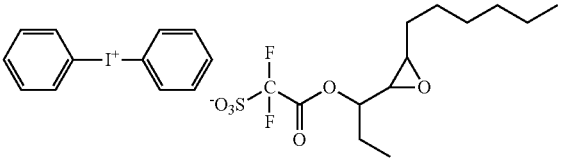
(I-32)
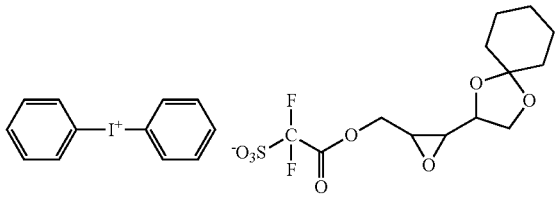
(I-33)
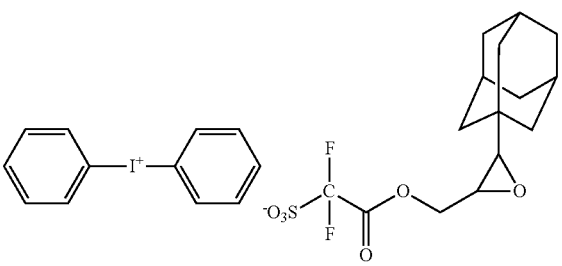
(I-34)
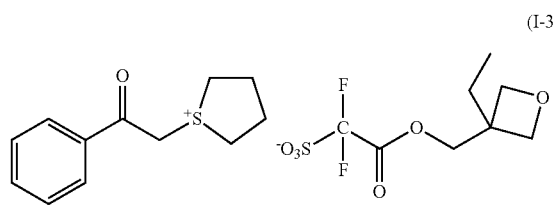
-continued
(I-35)
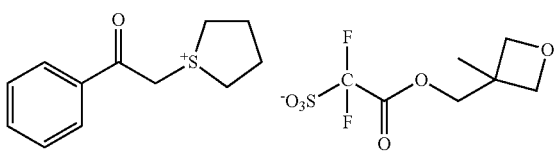
(I-36)
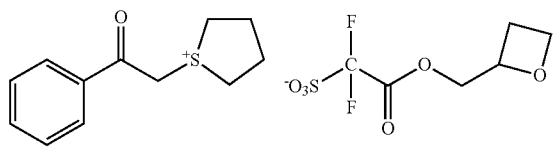
(I-37)
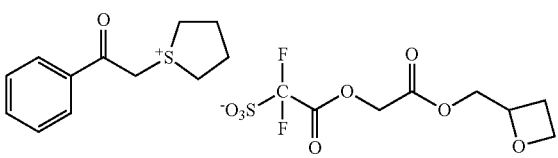
(I-38)
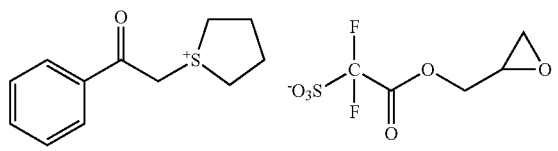
(I-39)
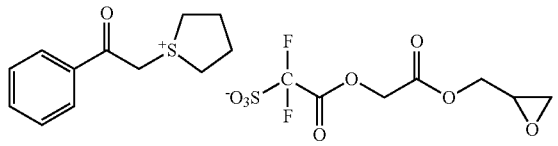
(I-40)
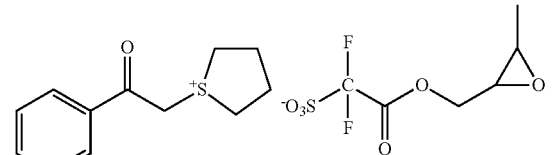
(I-41)
(I-42)
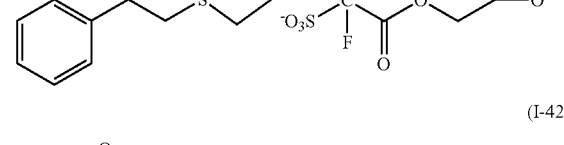

(I-43)

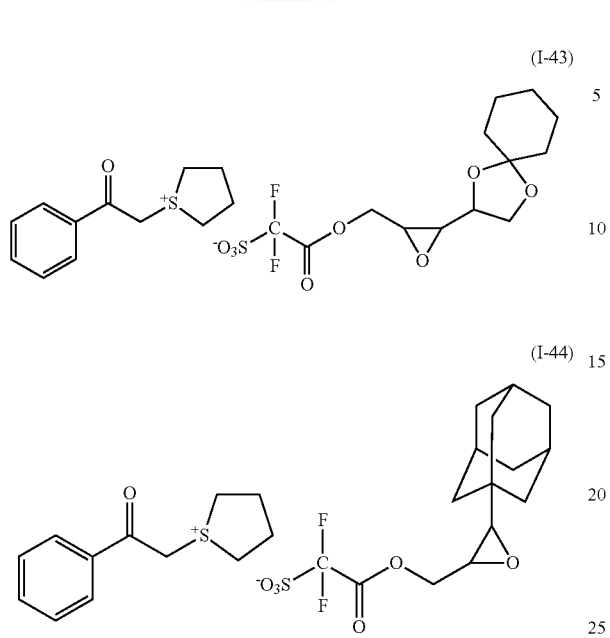

(I-44)

SALT (I) wherein $X^1$ is *—CO—O-$L^{b2}$- can be produced by reacting a salt represented by the formula (IA-1) with a compound represented by the formula (IA-2) in a solvent such as acetonitrile.

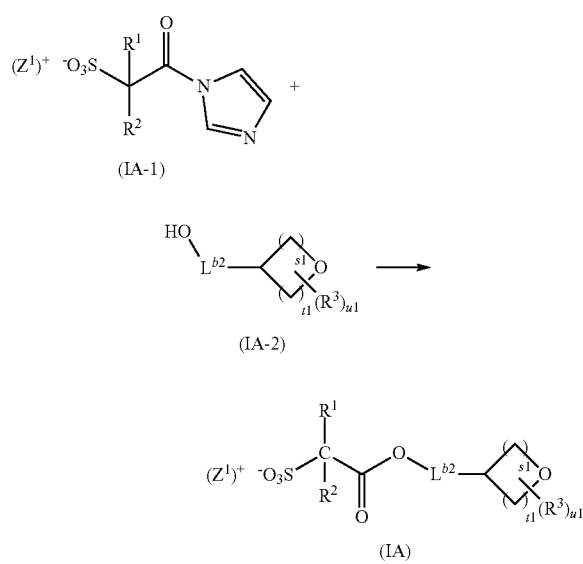

wherein $R^1$, $R^2$, s1, t1, $R^3$, u1, $(Z^1)^+$ and $L^{b2}$ are the same as described above.

Examples of the compound represented by the formula (IA-2) include glycidol, 2-hydroxymethyloxetane and 3-ethyl-3-oxetanemethanol.

The salt represented by the formula (IA-1) can be produced by reacting a salt represented by the formula (IA-3) with a compound represented by the formula (IA-4) (carbonyldiimidazole) in a solvent such as aacetonirile.

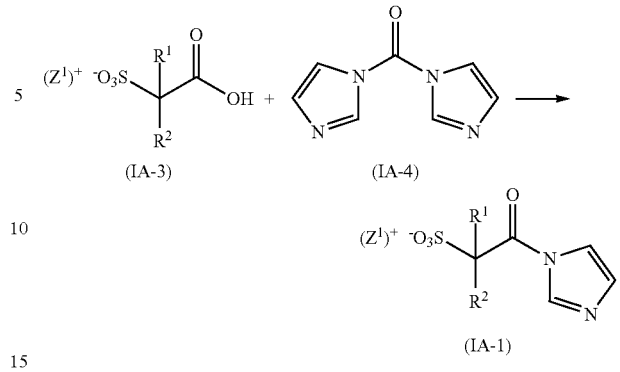

wherein $R^1$, $R^2$, and $(Z^1)^+$ are the same as descried above.

The salt represented by the formula (IA-3) can be produced according to the method described in JP 2008-127367 A.

The photoresist composition of the present invention can contain two or more kinds of SALT (I).

The content of SALT (I) in the photoresist composition of the present invention is preferably 1 part by mass or more per 100 parts by mass of RESIN, and more preferably 3 parts by mass or more. The content of SALT (I) in the photoresist composition of the present invention is preferably 40 parts by mass or less per 100 parts by mass of RESIN, and more preferably 35 parts by mass or less.

Next, SALT (II-0) will be illustrated.

SALT (II-0) is represented by the formula (II-0):

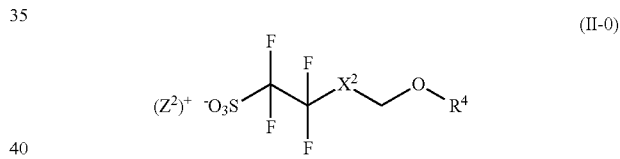

(II-0)

wherein $R^4$ represents a C1-C24 hydrocarbon group in which one or more hydrogen atoms can be replaced by a fluorine atom or —OH and in which one or more —$CH_2$— can be replaced by —O— or —CO—, $X^2$ represents a C1-C6 alkanediyl group in which one or more —$CH_2$— can be replaced by —O— or —CO— and in which, one or more hydrogen atoms can be replaced by —OH or —CO— wherein $R^5$ represents a C1-C24 hydrocarbon group in which one or more hydrogen atoms can be replaced by a fluorine atom or —OH and in which one or more —$CH_2$— can be replaced by —O— or —CO—, and $(Z^2)^+$ represents an organic cation.

Examples of the C1-C6 alkanediyl group represented by $X^2$ include a methylene group, an ethylene group, a propane-1,3-diyl group, a propane-1,2-diyl group, a butane-1,4-diyl group, a pentane-1,5-diyl group, a hexane-1,6-diyl group, an ethane-1,1-diyl group, a propane-1,1-diyl group, a propane-2,2-diyl group, a butane-1,3-diyl group, a 2-methylpropane-1,3-diyl group, a 2-methylpropane-1,2-diyl group, a pentane-1,4-diyl group, and a 2-methylbutane-1,4-diyl group.

One or more —$CH_2$— in the C1-C6 alkanediyl group can be replaced by —O— or —CO—, and examples of the C1-C6 alkanediyl group in which one or more —$CH_2$— are replaced by —O— or —CO— include the following divalent groups.

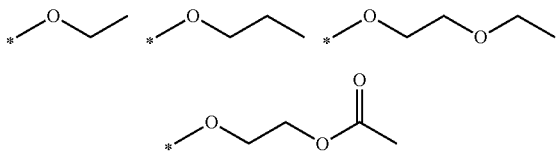

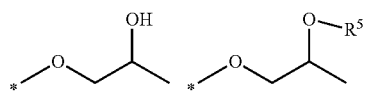

wherein * represents a binding position to —CF$_2$—.

One or more hydrogen atoms in the C1-C6 alkanediyl group can be replaced by —OH or —OR$^5$. Examples of the C1-C6 alkanediyl group in which one or more —CH$_2$— are replaced by —O— or —CO— and in which one or more hydrogen atoms can be replaced by —OH or —OR$^5$ include the following divalent groups.

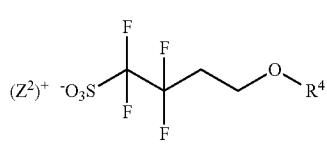

wherein * represents a binding position to —CF$_2$—.

The C1-C24 hydrocarbon group represented by R$^4$ may be saturated or unsaturated. Examples thereof include a linear or branched chain alkyl group, a linear or branched chain alkenyl group, a monocyclic or polycyclic alicyclic hydrocarbon group, an aromatic hydrocarbon group and a group formed by combining two or more groups selected from the group consisting of the above-mentioned linear or branched chain alkyl group, the above-mentioned linear or branched chain alkenyl group, the above-mentioned monocyclic or polycyclic alicyclic hydrocarbon group and the above-mentioned aromatic hydrocarbon group.

Examples of the linear alkyl group include a methyl group, an ethyl group, a propyl group, a butyl group, a pentyl group and a hexyl group. Examples of the branched chain alkyl group include an isopropyl group, a sec-butyl group and a tert-butyl group. Examples of the linear or branched chain alkenyl group include a vinyl group and an o-methylvinyl group. Examples of the monocyclic alicyclic hydrocarbon group include a cyclobutyl group, a cyclopentyl group, a cyclohexyl group and a cyclooctyl group. Examples of the polycyclic alicyclic hydrocarbon group include a norbornyl group and an adamantyl group. Examples of the aromatic hydrocarbon group include a phenyl group, a naphthyl group, a p-methylphenyl group, a p-tert-butylphenyl group, a p-adamantylphenyl group, a tolyl group, a xylyl group, a 2,6-diethylphenyl group and a 2-methyl-6-ethylphenyl group.

SALT (II-0) is preferably a salt represented by the formula (II):

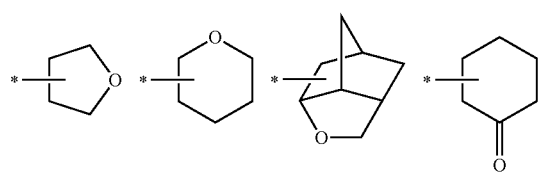

wherein R$^4$ and (Z$^2$)$^+$ are the same as defined above, a salt represented by the formula (III-A):

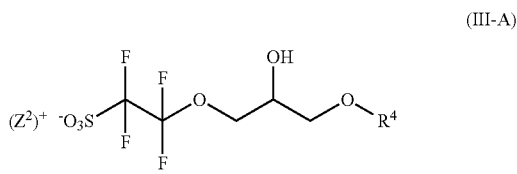

wherein R$^4$ and (Z$^2$)$^+$ are the same as defined above, or a salt represented by, the formula (III-B);

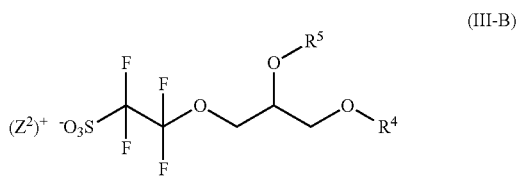

wherein R$^4$, R$^5$ and (Z$^2$)$^+$ are the same as defined above.

Preferable examples of the hydrocarbon group represented by R$^4$ and R$^5$ include groups represented by the formulae (II-A) and (II-B):

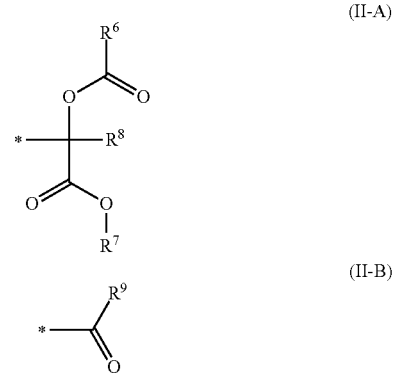

wherein R$^6$ represents a C1-C17 hydrocarbon group in which one or more hydrogen atoms can be replaced by a fluorine atom or —OH and in which one or more —CH$_2$— can be replaced by —O— or —CO—, R$^7$ represents a C1-C6 alkyl group, R$^8$ represents a C1-C6 fluorinated alkyl group, R$^9$ represents a C1-C23 hydrocarbon group in which one or more hydrogen atoms can be replaced by a fluorine atom or —OH and in which one or more —CH$_2$— can be replaced by —O— or —CO—.

Examples of the hydrocarbon group in which one or more —CH$_2$— are replaced by —O— or —CO— include the following.

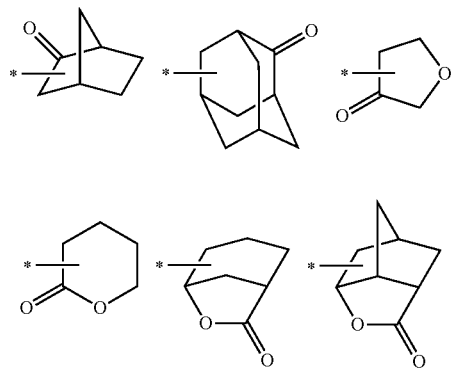
Examples of the C1-C6 fluorinated alkyl group include a trifluoromethyl group, a perfluoroethyl group, a 1,1,2,2-tetrafluoroethyl group, a perfluorobutyl group and a 1,1,2,2,3,3,4,4-octafluorobutyl group.
Examples of the C1-C6 alkyl group include a methyl group, an ethyl group, a propyl group and a butyl group.
Examples of SALT (II-0) include the following.
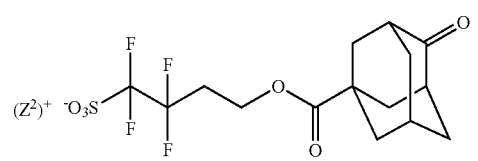
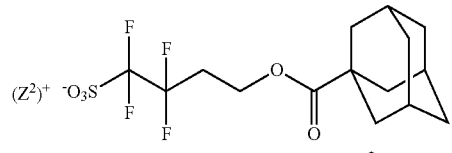
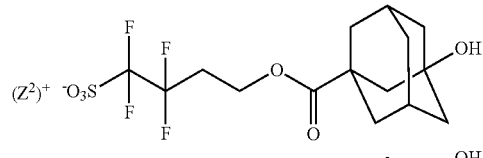
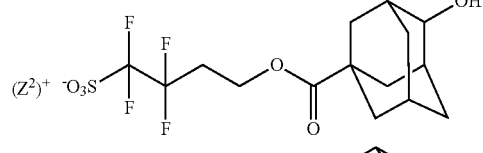
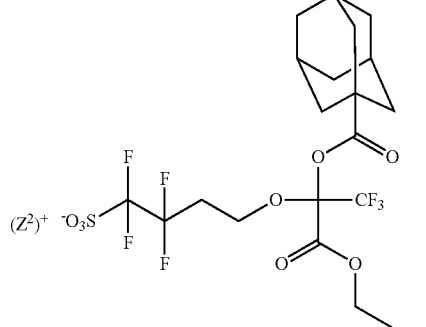
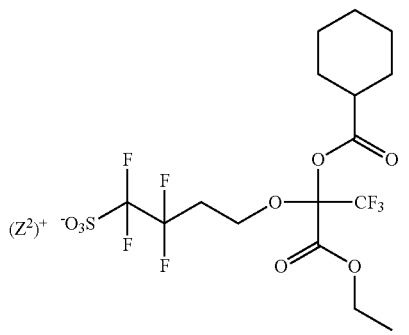
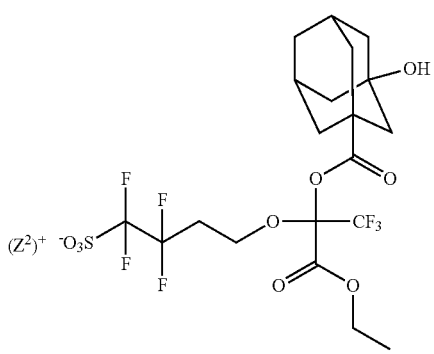
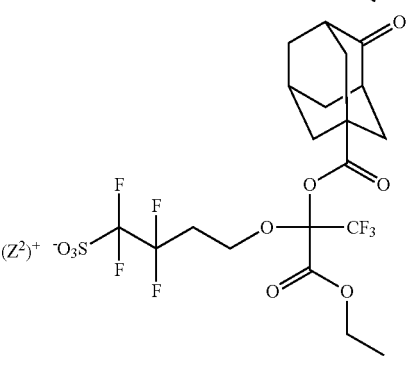
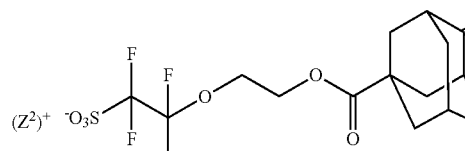
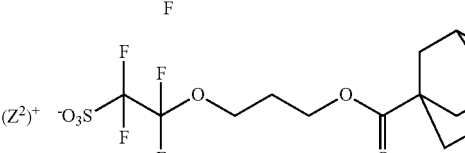
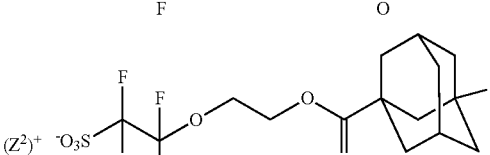
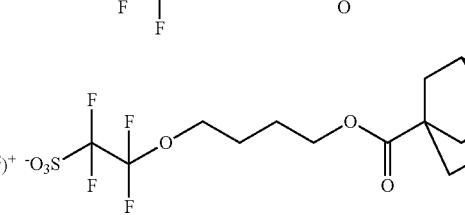

-continued

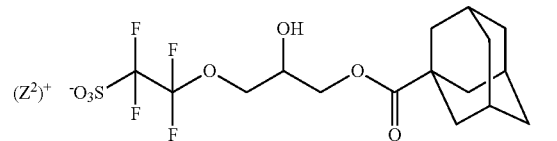
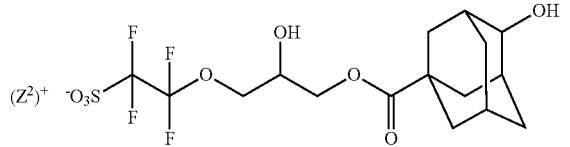
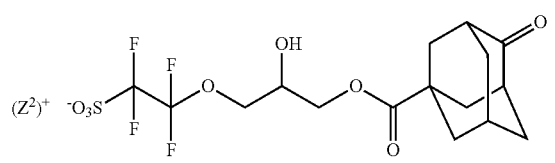
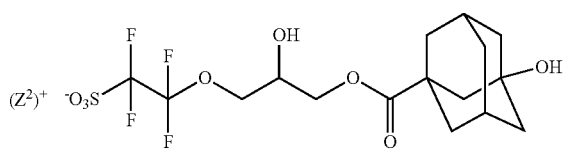
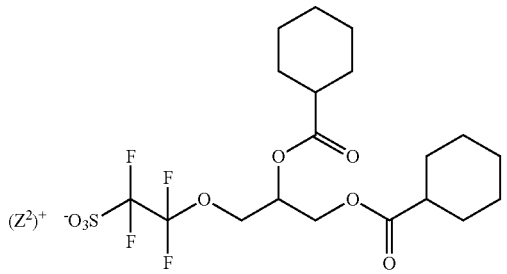
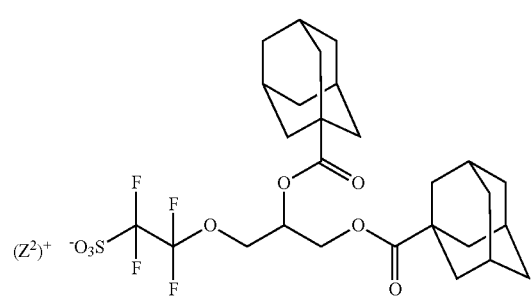
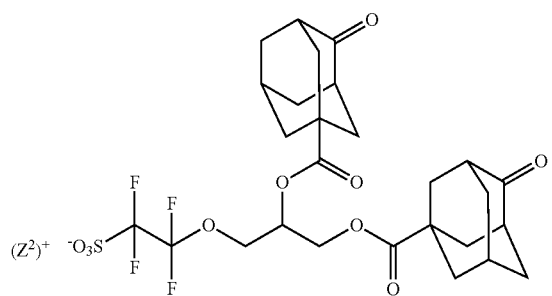

-continued

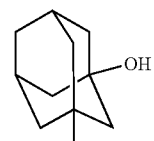
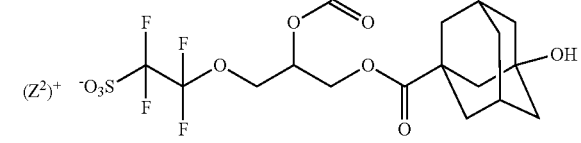

Examples of the organic cation represented by $(Z^2)^+$ include an onium cation such as an organic sulfonium cation, an organic iodonium cation, an organic ammonium cation, a benzothiazolium cation and an organic phosphonium cation, and an organic sulfonium cation and an organic iodonium cation are preferable, and an organic sulfonium cation is more preferable, and a triarylsulfonium cation is still more preferable.

Preferable examples of the organic cation represented by $(Z^2)^+$ include the organic cations represented by the above-mentioned formulae (b2-1) to (b2-4).

Examples of SALT (II-0) include a salt wherein the anion part is any one of the above-mentioned anion and the cation part is any one of the above-mentioned cation.

Preferable examples of SALT (II-0) include the Baits represented by the following formulae (II-1) to (II-40).

(II-1)

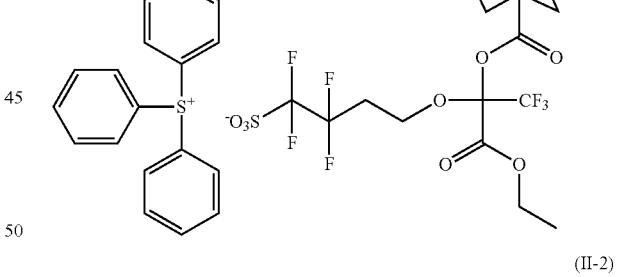

(II-2)

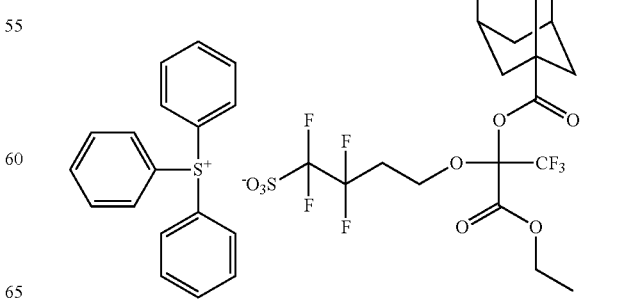

(II-3)
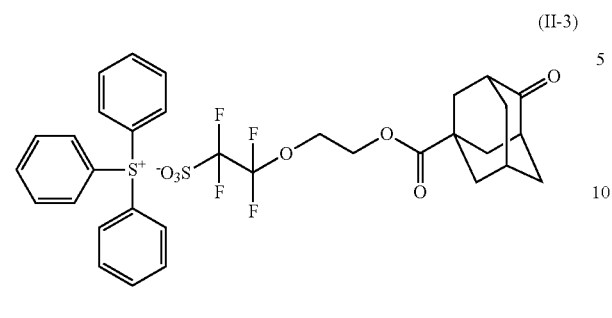
(II-4)
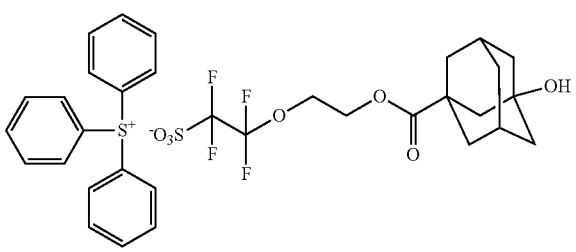
(II-5)
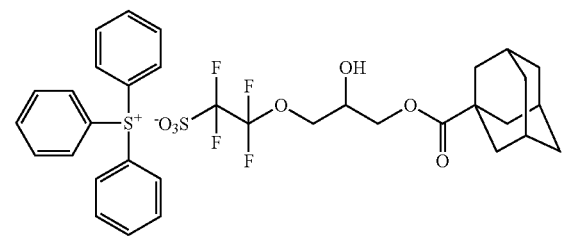
(II-6)
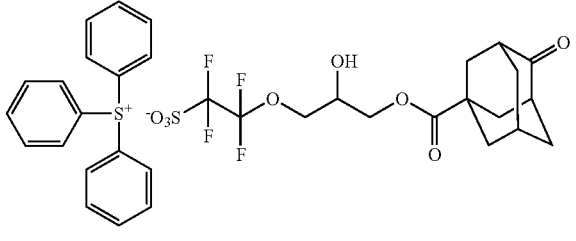
(II-7)
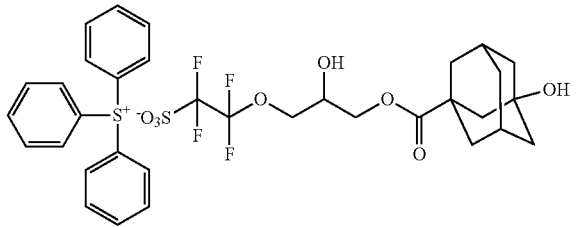
(II-8)
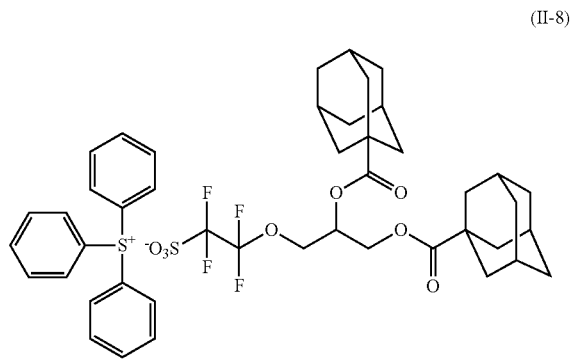
(II-9)
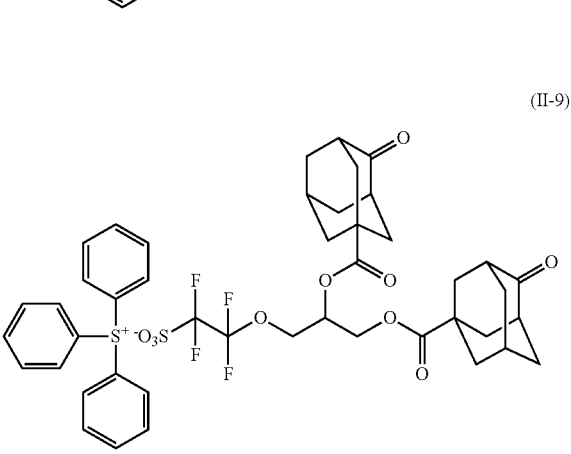
(II-10)
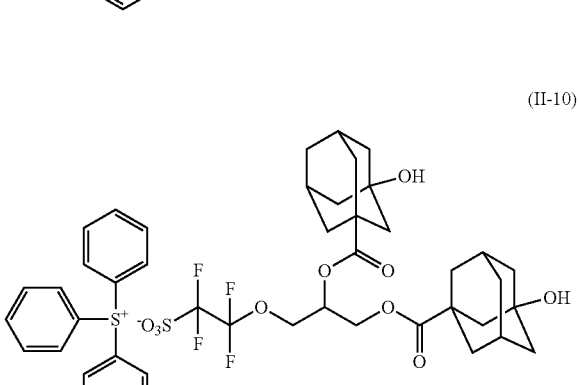
(II-11)
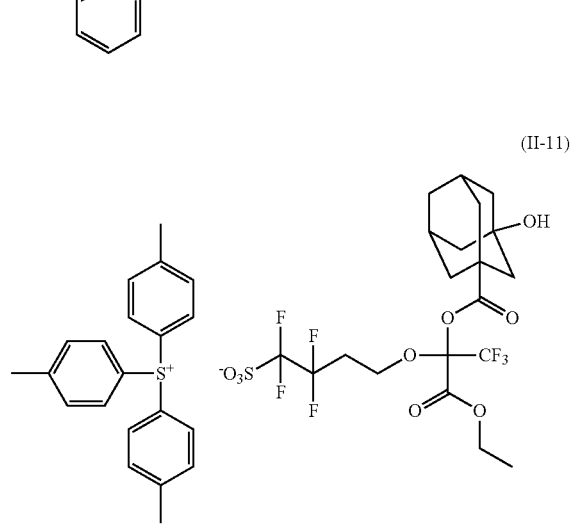

(II-12)
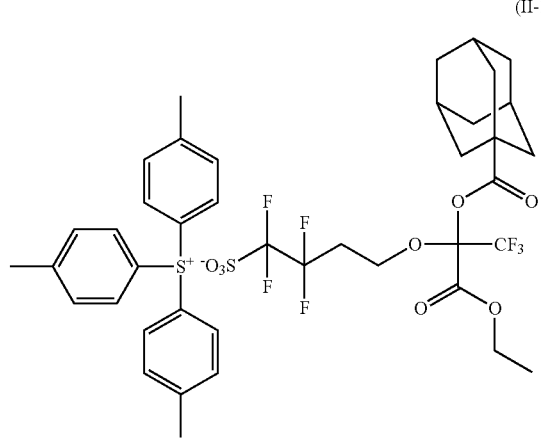
(II-13)
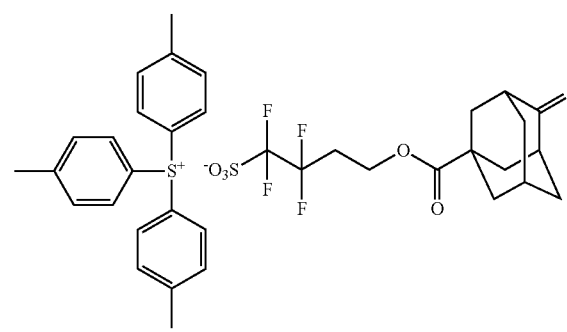
(II-14)
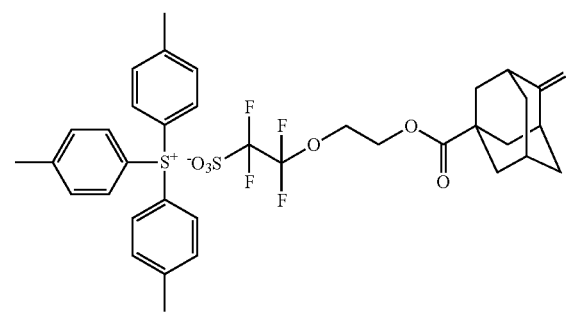
(II-15)
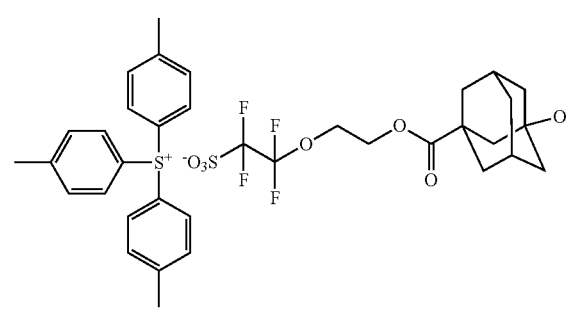
(II-16)
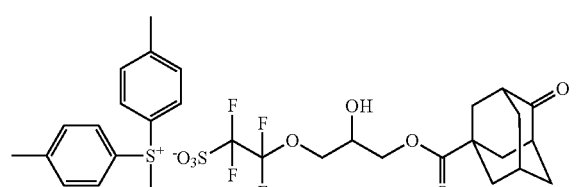
(II-17)
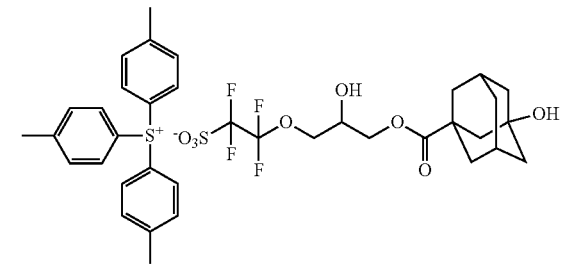
(II-18)
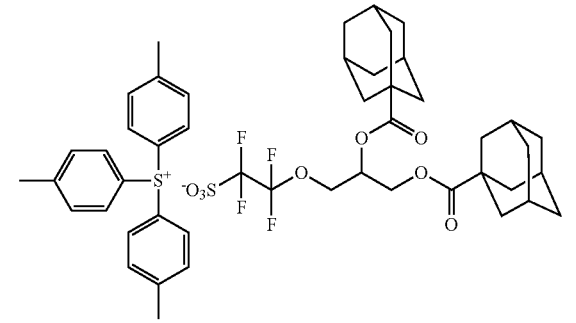
(II-19)
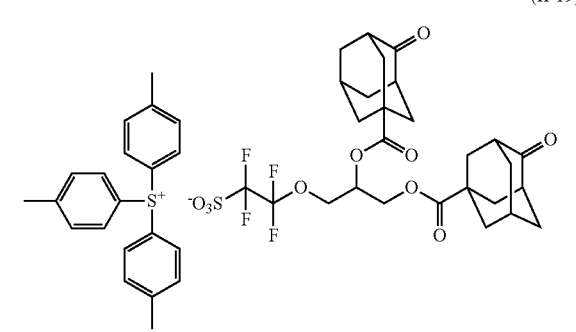
(II-20)
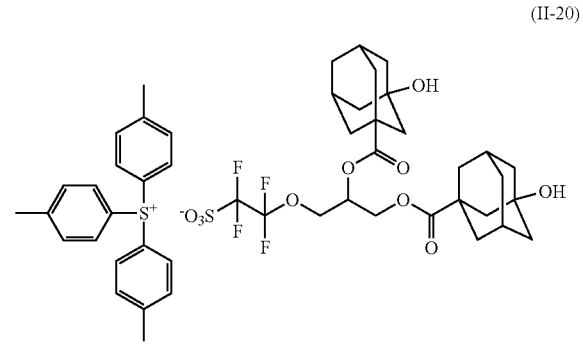

(II-21)
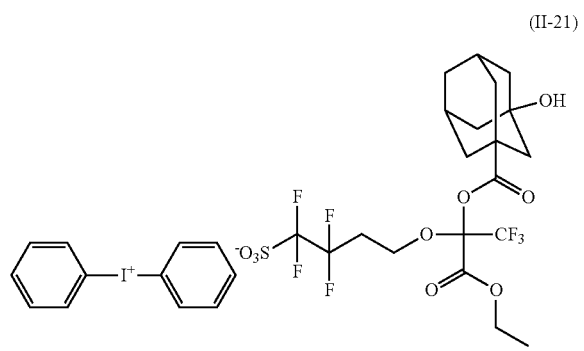
(II-22)
(II-23)
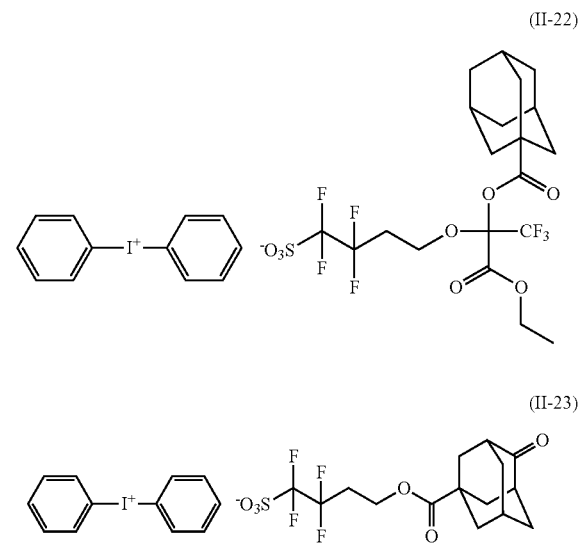
(II-24)
(II-25)
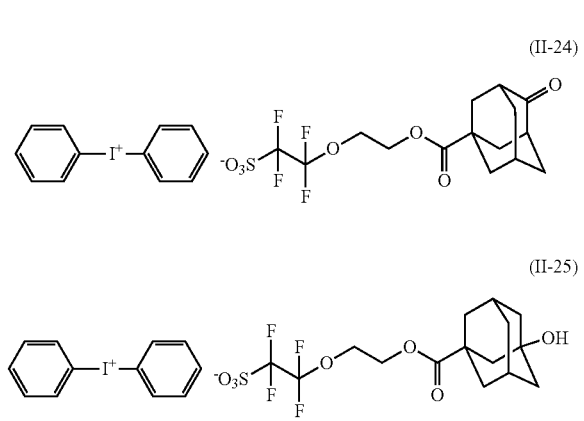
(II-26)
(II-27)
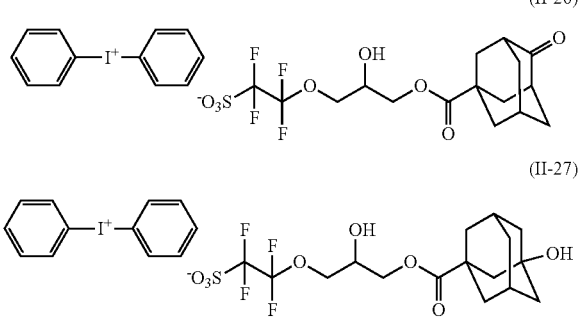
(II-28)
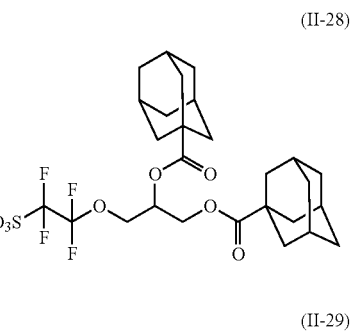
(II-29)
(II-30)
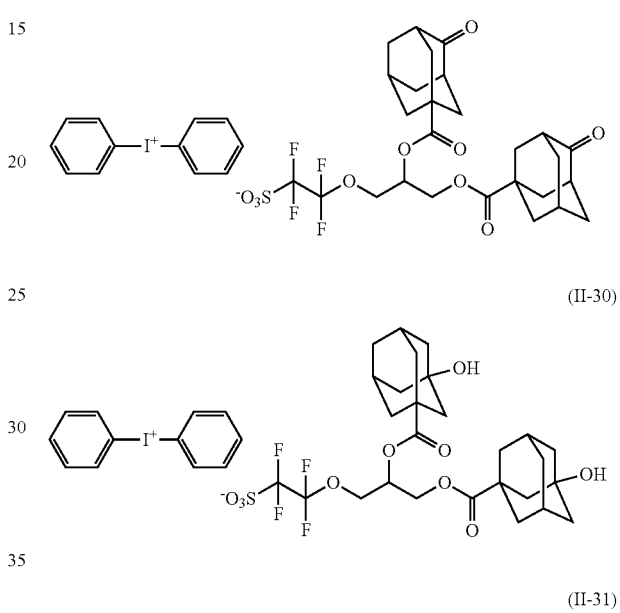
(II-31)
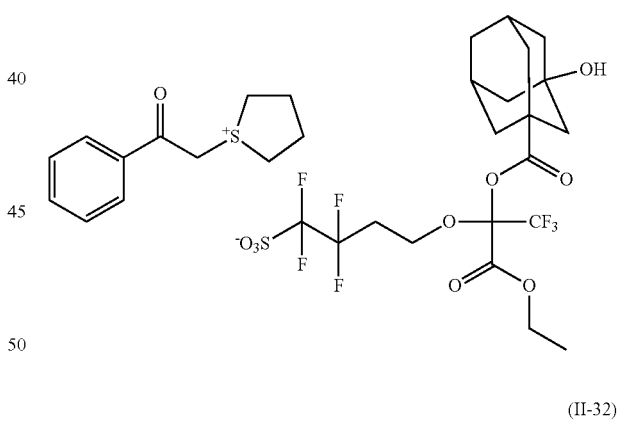
(II-32)
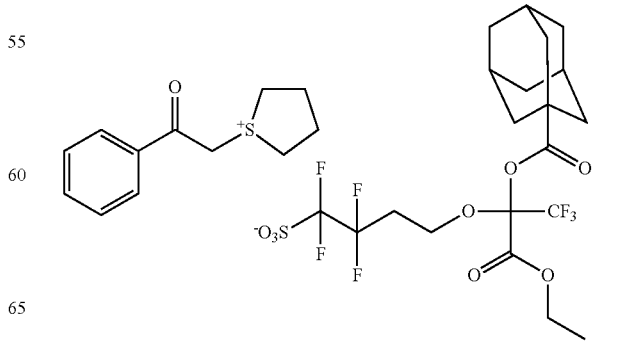

(II-33)
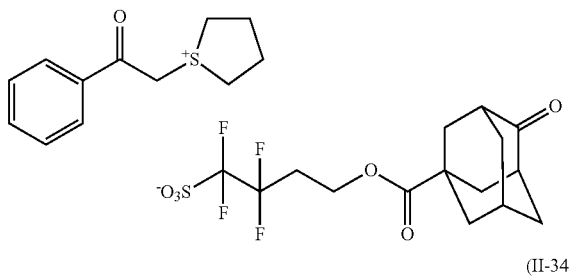
(II-34)
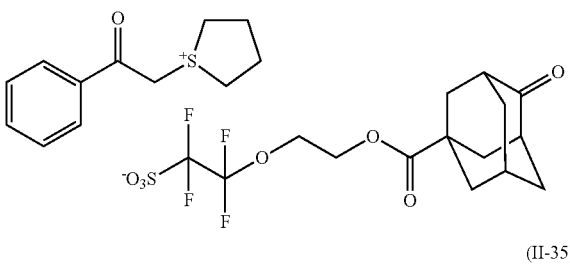
(II-35)
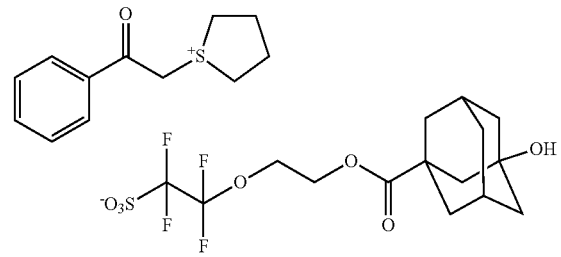
(II-36)
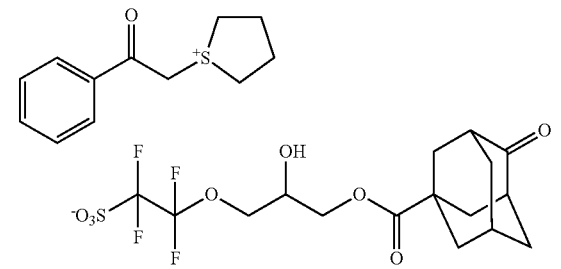
(II-37)
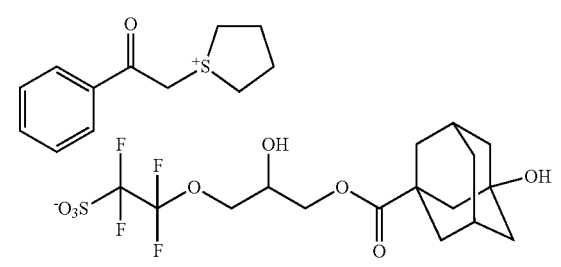
(II-38)
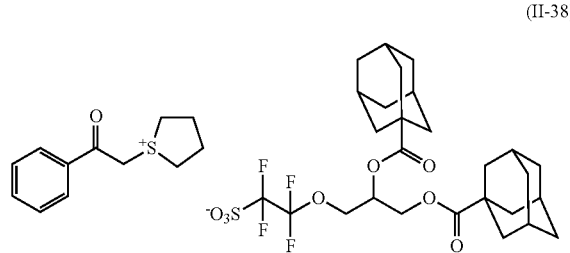
(II-39)
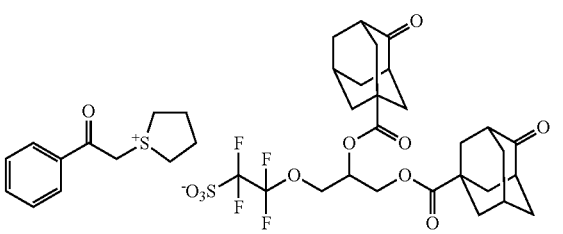
(II-40)
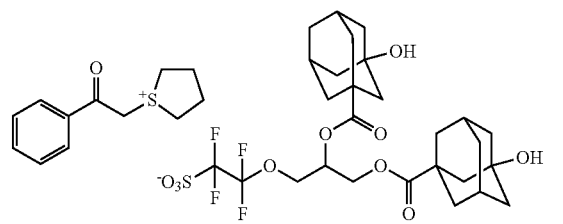
SALT (II-0) can be produced by reacting a salt represented by the formula (II-0-1) with a compound represented by the formula (II-0-2) in a solvent such as chloroform.
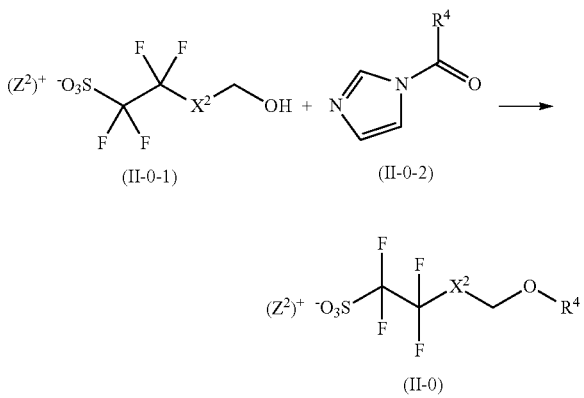
wherein $X^2$, $R^4$ and $(Z^2)^+$ are the same as defined above.
Examples of the salt represented by the formula (II-0-1) include the following.
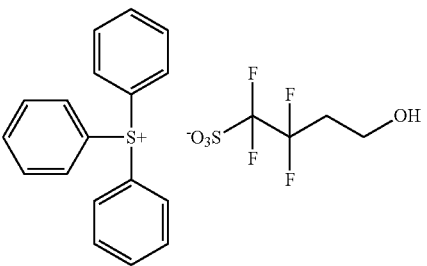

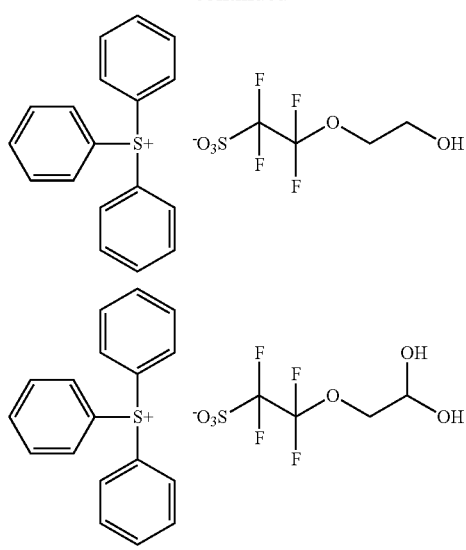

The compound represented by the formula (II-0-2) can be produced by reacting a compound represented by the formula (II-0-3) with a compound represented by the formula (II-0-4) in a solvent such as chloroform.

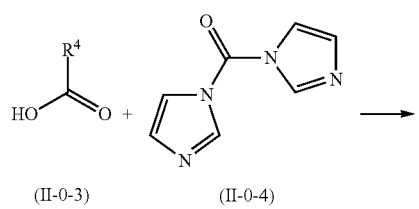

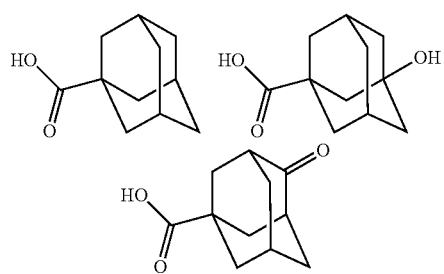

wherein $R^4$ is the same as defined above.

Examples of the compound represented by the formula (II-0-3) include the following.

SALT (II-0) wherein $R^4$ is the group represented by the formula (II-A) can be produced by reacting a salt represented by the formula (IIA-1) with a compound represented by the formula (IIA-2) in a solvent such as chloroform.

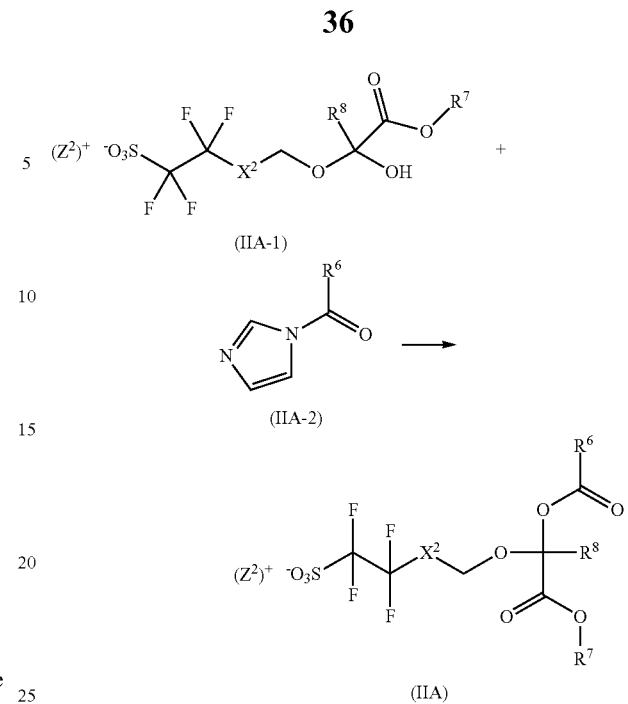

wherein $X^2$, $R^6$, $R^7$, $R^8$ and $(Z^2)^+$ are the same as defined above.

The salt represented by the formula (IIA-1) can be produced by reacting a salt represented by the formula (IIA-3) with a compound represented by the formula (IIA-4) in the presence of an acid catalyst such as p-toluenesulfonic acid in a solvent such as N,N-dimethylformamide.

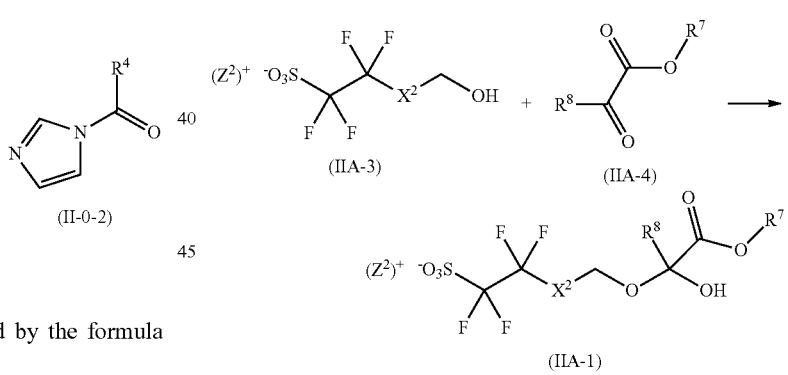

wherein $X^2$, $R^7$, $R^8$ and $(Z^2)^+$ are the same as defined above.

Examples of the salt represented by the formula (IIA-3) include the following salts.

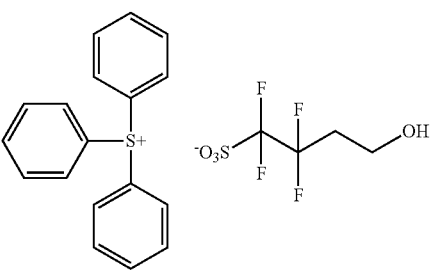

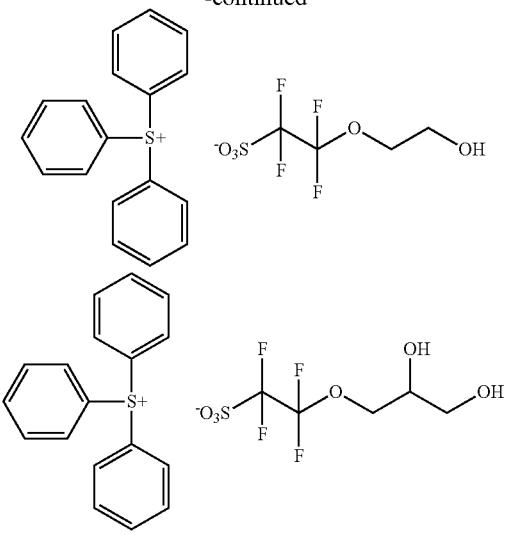

Examples of the compound represented by the formula (IIA-4) include ethyl trifluoropyruvate.

The compound represented by the formula (IIA-2) can be produced by reacting a compound represented by the formula (IIA-5) with a compound represented by the formula (IIA-6) in a solvent such as chloroform.

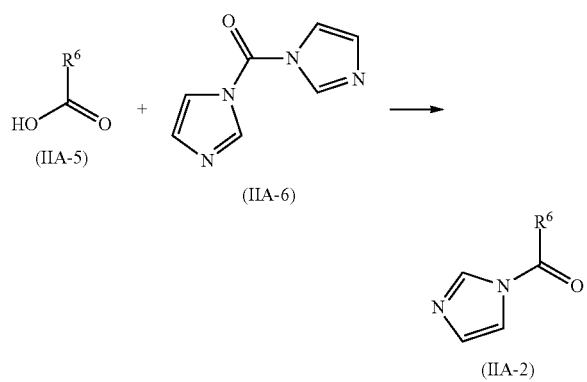

wherein $R^6$ is the same as defined above.

Examples of the compound represented by the formula (IIA-5) include the following.

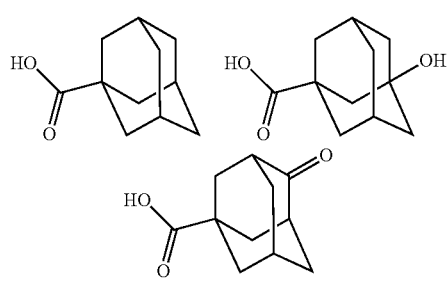

The photoresist composition of the present invention can contain two or more kinds of SALT (II-0).

The content of SALT (II-0) in the photoresist composition of the present invention is preferably 1 part by mass or more per 100 parts by mass of RESIN, and more preferably 3 parts by mass or more. The content of SALT (II-0) in the photoresist composition of the present invention is preferably 40 parts by mass or less per 100 parts by mass of RESIN, and more preferably 35 parts by mass or less.

Examples of a combination of SALT (I) and SALT (II-0) include a combination of any one of the above-mentioned SALT (I) and any one of the above-mentioned SALT (II-0).

Preferable combination of SALT (I) and SALT (II-0) include the combinations shown in Table 1 to 4.

TABLE 1

| Combination | SALT (I) | SALT (II-0) |
| --- | --- | --- |
| 1 | (I-1) | (II-1) |
| 2 | (I-1) | (II-2) |
| 3 | (I-1) | (II-6) |
| 4 | (I-1) | (II-9) |
| 5 | (I-1) | (II-11) |
| 6 | (I-1) | (II-12) |
| 7 | (I-1) | (II-16) |
| 8 | (I-1) | (II-19) |
| 9 | (I-1) | (II-21) |
| 10 | (I-1) | (II-22) |
| 11 | (I-1) | (II-26) |
| 12 | (I-1) | (II-29) |
| 13 | (I-1) | (II-31) |
| 14 | (I-1) | (II-32) |
| 15 | (I-1) | (II-36) |
| 16 | (I-1) | (II-39) |
| 17 | (I-2) | (II-1) |
| 18 | (I-2) | (II-2) |
| 19 | (I-2) | (II-6) |
| 20 | (I-2) | (II-9) |
| 21 | (I-2) | (II-11) |
| 22 | (I-2) | (II-12) |
| 23 | (I-2) | (II-16) |
| 24 | (I-2) | (II-19) |
| 25 | (I-2) | (II-21) |
| 26 | (I-2) | (II-22) |
| 27 | (I-2) | (II-26) |
| 28 | (I-2) | (II-29) |
| 29 | (I-2) | (II-31) |
| 30 | (I-2) | (II-32) |
| 31 | (I-2) | (II-36) |
| 32 | (I-2) | (II-39) |

TABLE 2

| Combination | SALT (I) | SALT (II-0) |
| --- | --- | --- |
| 33 | (I-3) | (II-1) |
| 34 | (I-3) | (II-2) |
| 35 | (I-3) | (II-6) |
| 36 | (I-3) | (II-9) |
| 37 | (I-3) | (II-11) |
| 38 | (I-3) | (II-12) |
| 39 | (I-3) | (II-16) |
| 40 | (I-3) | (II-19) |
| 41 | (I-3) | (II-21) |
| 42 | (I-3) | (II-22) |
| 43 | (I-3) | (II-26) |
| 44 | (I-3) | (II-29) |
| 45 | (I-3) | (II-31) |
| 46 | (I-3) | (II-32) |
| 47 | (I-3) | (II-36) |
| 48 | (I-3) | (II-39) |
| 49 | (I-5) | (II-1) |
| 50 | (I-5) | (II-2) |
| 51 | (I-5) | (II-6) |
| 52 | (I-5) | (II-9) |
| 53 | (I-5) | (II-11) |
| 54 | (I-5) | (II-12) |
| 55 | (I-5) | (II-16) |
| 56 | (I-5) | (II-19) |
| 57 | (I-5) | (II-21) |
| 58 | (I-5) | (II-22) |

TABLE 2-continued

| Combination | SALT (I) | SALT (II-0) |
|---|---|---|
| 59 | (I-5) | (II-26) |
| 60 | (I-5) | (II-29) |
| 61 | (I-5) | (II-31) |
| 62 | (I-5) | (II-32) |
| 63 | (I-5) | (II-36) |
| 64 | (I-5) | (II-39) |

TABLE 3

| Combination | SALT (I) | SALT (II-0) |
|---|---|---|
| 65 | (I-12) | (II-1) |
| 66 | (I-12) | (II-2) |
| 67 | (I-12) | (II-6) |
| 68 | (I-12) | (II-9) |
| 69 | (I-12) | (II-11) |
| 70 | (I-12) | (II-12) |
| 71 | (I-12) | (II-16) |
| 72 | (I-12) | (II-19) |
| 73 | (I-12) | (II-21) |
| 74 | (I-12) | (II-22) |
| 75 | (I-12) | (II-26) |
| 76 | (I-12) | (II-29) |
| 77 | (I-12) | (II-31) |
| 78 | (I-12) | (II-32) |
| 79 | (I-12) | (II-36) |
| 80 | (I-12) | (II-39) |
| 81 | (I-13) | (II-1) |
| 82 | (I-13) | (II-2) |
| 83 | (I-13) | (II-6) |
| 84 | (I-13) | (II-9) |
| 85 | (I-13) | (II-11) |
| 86 | (I-13) | (II-12) |
| 87 | (I-13) | (II-16) |
| 88 | (I-13) | (II-19) |
| 89 | (I-13) | (II-21) |
| 90 | (I-13) | (II-22) |
| 91 | (I-13) | (II-26) |
| 92 | (I-13) | (II-29) |
| 93 | (I-13) | (II-31) |
| 94 | (I-13) | (II-32) |
| 95 | (I-13) | (II-36) |
| 96 | (I-13) | (II-39) |

TABLE 4

| Combination | SALT (I) | SALT (II-0) |
|---|---|---|
| 97 | (I-14) | (II-1) |
| 98 | (I-14) | (II-2) |
| 99 | (I-14) | (II-6) |
| 100 | (I-14) | (II-9) |
| 101 | (I-14) | (II-11) |
| 102 | (I-14) | (II-12) |
| 103 | (I-14) | (II-16) |
| 104 | (I-14) | (II-19) |
| 105 | (I-14) | (II-21) |
| 106 | (I-14) | (II-22) |
| 107 | (I-14) | (II-26) |
| 108 | (I-14) | (II-29) |
| 109 | (I-14) | (II-31) |
| 110 | (I-14) | (II-32) |
| 111 | (I-14) | (II-36) |
| 112 | (I-14) | (II-39) |
| 113 | (I-16) | (II-1) |
| 114 | (I-16) | (II-2) |
| 115 | (I-16) | (II-6) |
| 116 | (I-16) | (II-9) |
| 117 | (I-16) | (II-11) |
| 118 | (I-16) | (II-12) |
| 119 | (I-16) | (II-16) |
| 120 | (I-16) | (II-19) |
| 121 | (I-16) | (II-21) |

TABLE 4-continued

| Combination | SALT (I) | SALT (II-0) |
|---|---|---|
| 122 | (I-16) | (II-22) |
| 123 | (I-16) | (II-26) |
| 124 | (I-16) | (II-29) |
| 125 | (I-16) | (II-31) |
| 126 | (I-16) | (II-32) |
| 127 | (I-16) | (II-36) |
| 128 | (I-16) | (II-39) |

The mass ratio of SALT (I) to SALT (II-0) in the photoresist composition of the present invention (SALT (I)/SALT (II-0)) is usually 5/95 to 95/5, and preferably 10/90 to 90/10 and more preferably 15/85 to 85/15.

The photoresist composition of the present invention can contain one or more acid generators other than SALT (I) and SALT (II-0).

Examples of the acid generator other than SALT (I) and SALT (II-0) include a nonionic acid generator, an ionic acid generator and the combination thereof. Examples of the nonionic acid generator include an organo-halogen compound, a sulfone compound such as a disulfone, a ketosulfone and a sulfonyldiazomethane, a sulfonate compound such as a 2-nitrobenzylsulfonate, an aromatic sulfonate, an oxime sulfonate, an N-sulfonyloxyimide, a sulfonyloxyketone and diazonaphthoquinone 4-sulfonate. Examples of the ionic acid generator include an onium salt compound such as a diazonium salt, a phosphonium salt, a sulfonium salt and an iodonium salt. Examples of the anion of the onium salt include a sulfonic acid anion, a sulfonylimide anion and a sulfonulmethide anion. The onium salt compound is preferable.

Other examples of the acid generator other than SALT (I) and SALT (II-0) include acid generators described in JP 63-26653 A, JP 55-164824 A, JP 62-69263 A, JP 63-146038 A, JP 63-163452 A, JP 62-153853 A, JP 63-146029 A, U.S. Pat. No. 3,779,778, U.S. Pat. No. 3,849,137, DE Patent No. 3914407 and EP Patent No. 126,712.

A fluorine-containing acid generator is preferable.

Preferable examples of the acid generator other than SALT (I) and SALT (II-0) include a salt represented by the formula (B1):

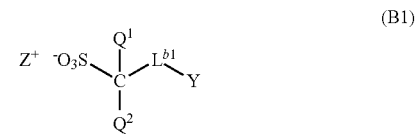

(B1)

wherein $Q^1$ and $Q^2$ each independently represent a fluorine atom or a C1-C6 perfluoroalkyl group, $L^{b1}$ represents a single bond or a C1-C17 divalent saturated hydrocarbon group which can have one or more substituents, and one or more —CH$_2$— in the divalent saturated hydrocarbon group can be replaced by —O— or —CO—, Y represents a C1-C18 alkyl group which can have one or more substituents and in which one or more —CH$_2$— can be replaced by —O—, —CO— or —SO$_2$—, or a C3-C18 alicyclic hydrocarbon group which can have one or more substituents and in which one or more —CH$_2$— can be replaced by —O—, —CO— or —SO$_2$—, and $Z^+$ represents an organic cation.

Examples of the C1-C6 perfluoroalkyl group include a trifluoromethyl group, a pentafluoroethyl group, a heptafluoropropyl group, a nonafluorobutyl group, an undecafluoropentyl group and a tridecafluorohexyl group, and a trifluoromethyl group is preferable. $Q^1$ and $Q^2$ each independently preferably represent a fluorine atom or a trifluoromethyl group, and $Q^1$ and $Q^2$ are more preferably fluorine atoms.

Examples of the C1-C17 divalent saturated hydrocarbon group include a C1-C17 linear or branched chain alkandiyl group, a monocyclic or polycyclic divalent alicyclic hydrocarbon group and a group formed by combining two or more groups selected from the group consisting of the above-mentioned alkandiyl group and the above-mentioned monocyclic or polycyclic divalent alicyclic hydrocarbon group.

Examples thereof include those described in $X^1$.

Examples of the C1-C17 saturated hydrocarbon group in which one or more —$CH_2$— are replaced by —O— or —CO— include *—CO—O-$L^{b2}$-, *—CO—O-$L^{b4}$-CO—O-$L^{b3}$, *-$L^{b5}$-O—CO—, *-$L^{b7}$-O-$L^{b6}$-, *—CO—O-$L^{b8}$-O—, and *—CO—O-$L^{b10}$-O-$L^{b9}$-CO—O—, wherein $L^{b2}$, $L^{b3}$, $L^{b4}$, $L^{b5}$, $L^{b6}$, $L^{b7}$, $L^{b8}$, $L^{b9}$, $L^{b10}$ and * are the same as defined above. Among them, preferred is *—CO—O-$L^{b2}$-, *—CO—O-$L^{b4}$-CO—O-$L^{b3}$-, *-$L^{b5}$-O—CO—, or *-$L^{b7}$-O-$L^{b6}$-, and more preferred are *—CO—O-$L^{b2}$- or *—CO—O-$L^{b4}$-CO—O-$L^{b3}$-, and still more preferred is *—CO—O-$L^{b2}$-, and especially preferred is *—CO—O-$L^{b2}$- in which $L^{b2}$ is a single bond or —$CH_2$—.

Examples of the substituent in Y include a halogen atom, a hydroxyl group, an oxo group, a glycidyloxy group, a C2-C4 acyl group, a C1-C12 alkoxy group, a C2-C7 alkoxycarbonyl group, a C1-C12 alkyl group, a C1-C12 hydroxy-containing alkyl group, a C3-C16 alicyclic hydrocarbon group, a C6-C18 aromatic hydrocarbon group, a C7-C21 aralkyl group and —$(CH_2)_{j2}$—O—CO—$R^{b1}$— in which represents a C1-C16 alkyl group, a C3-C16 alicyclic hydrocarbon group or a C6-C18 aromatic hydrocarbon group and j2 represents an integer of 0 to 4. Examples of the halogen atom include a fluorine atom, a chlorine atom, a bromine atom and an iodine atom. Examples of the acyl group include an acetyl group and a propionyl group, and examples of the alkoxy group include a methoxy group, an ethoxy group, a propoxy group, an isopropoxy group and a butoxy group.

Examples of the alkoxycarbonyl group include a methoxycarbonyl group, an ethoxycarbonyl group, a propoxycarbonyl group, an isopropoxycarbonyl group and a butoxycarbonyl group. Examples of the alkyl group include the same as described above. Examples of the hydroxyl-containing alkyl group include a hydroxymethyl group.

Examples of the C3-C16 alicyclic hydrocarbon group include the same as described above, and examples of the aromatic hydrocarbon group include a phenyl group, a naphthyl group, an anthryl group, a p-methylphenyl group, a p-tert-butylphenyl group and a p-adamantylphenyl group. Examples of the aralkyl group include a benzyl group, a phenethyl group, a phenylpropyl group, a trityl group, a naphthylmethyl group and a naphthylethyl group.

The C1-C18 alkyl group represented by Y includes a linear alkyl group and a branched chain alkyl group, and preferred is a C1-C6 alkyl group.

Examples of the C1-C18 alkyl group represented by Y include a methyl group, an ethyl group, a propyl group, an isopropyl group, a butyl group, an isobutyl group, a sec-butyl group, a tert-butyl group, a pentyl group, a neopentyl group, a 1-methylbutyl group, a 2-methylbutyl group, a 1,2-dimethylpropyl group, a 1-ethylpropyl group, a hexyl group, a 1-methylpentyl group, a heptyl group, an octyl group, a 2-ethylhexyl group, a nonyl group, a decyl group, an undecyl group and a dodecyl group.

Examples of the alicyclic hydrocarbon group in which one or more —$CH_2$— are replaced by —O—, —CO— or —$SO_2$— include a group having an ether structure or a cyclic ether structure, a saturated cyclic hydrocarbon group having an oxo group, a sultone ring group and a lactone ring group. Examples of the C3-C18 alicyclic hydrocarbon group represented by Y include the groups represented by the formulae (Y1) to (Y26):

(Y1)

(Y2)

(Y3)

(Y4)

(Y5)

(Y6)

(Y7)

(Y8)

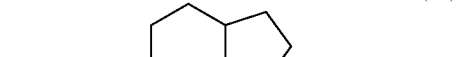
(Y9)

(Y10)

(Y11)

(Y12)

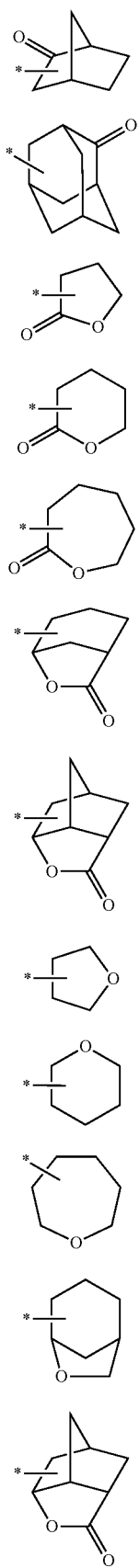

(Y13) 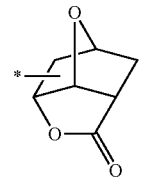

(Y25)

(Y14)

(Y26) 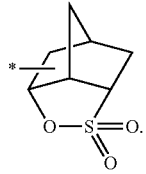

(Y15)

(Y16)

Among them, preferred are the groups represented by the formulae (Y1) to (Y19), and more preferred are the groups represented by the formulae (Y11), (Y14), (Y15) and (Y19), and still more preferred are the groups represented by the formulae (Y11) and (Y14).

Examples of Y having one or more substituents include the followings:

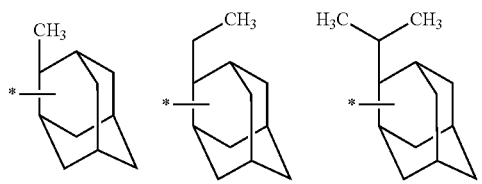

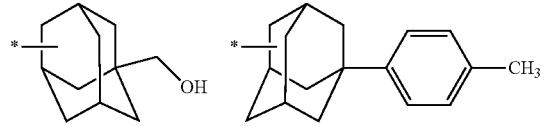

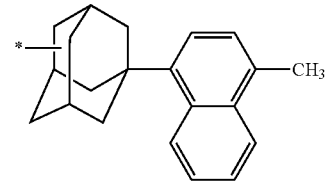

Y is preferably a C3-C18 alicyclic hydrocarbon group which can have one or more substituents, and more preferably an adamantyl group which can have one or more substituents, and still more preferably an adamantyl group, a hydroxyadamantyl group or an oxoadamantyl group.

Among the sulfonic acid anions of the acid generator represented by the formula (B1), preferred is a sulfonic acid anion having *—CO—O-$L^{b2}$-, and more preferred are anions represented by the formulae (b1-1-1) to (b1-1-9)

(b1-1-1)
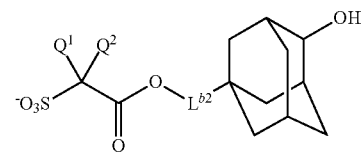

(b1-1-2)
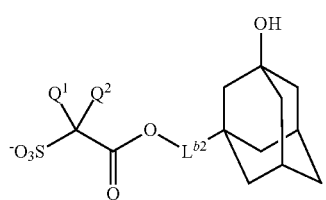

(b1-1-3)
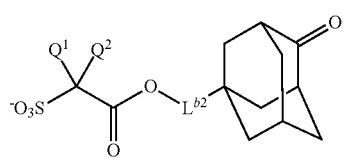

(b1-1-4)
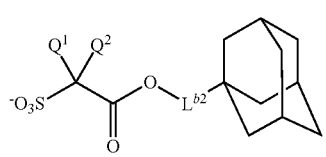

(b1-1-5)
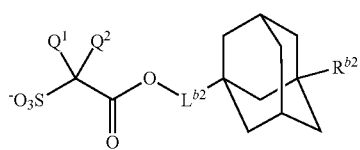

(b1-1-6)
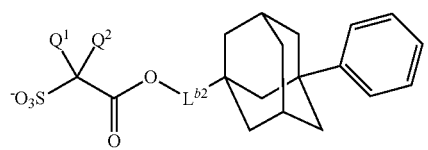

(b1-1-7)
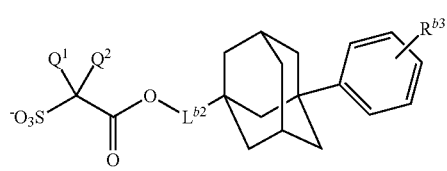

(b1-1-8)
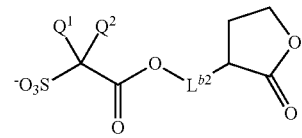

(b1-1-9)
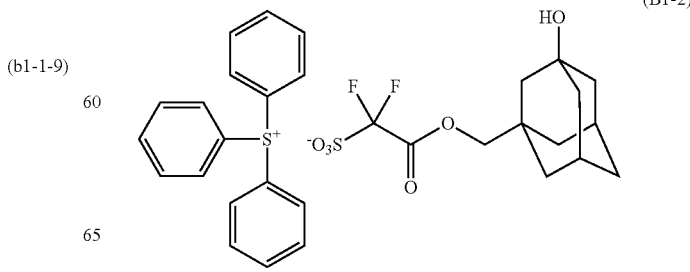

wherein $Q^1$, $Q^2$ and $L^{b2}$ are the same as defined above, and $R^{b2}$ and $R^{b3}$ each independently represent a C1-C4 aliphatic hydrocarbon group and it is more preferred that $R^{b2}$ and $R^{b3}$ each independently represent a methyl group.

Examples of the anions represented by the formulae (b1-1-1) to (b1-1-9) include anions described in JP 2010-204646 A.

Examples of the organic cation represented by $Z^+$ in the formula (B1) include an onium cation such as an organic sulfonium cation, an organic iodonium cation, an organic ammonium cation, a benzothiazolium cation and an organic phosphonium cation, and an organic sulfonium cation and an organic iodonium cation are preferable, and an organic sulfonium cation is more preferable. An arylsulfonium cation is still more preferable, and a triarylsulfonium cation is especially preferable. "Arylsulfonium cation" means a sulfonium cation having at least one aryl group.

Preferable examples of the organic cation represented by $Z^+$ include the organic cations represented by the above-mentioned formulae (b2-1) to (b2-4). Among them, preferred is the cation represented by the formula (b2-1), and more preferred is the cation represented by the formula (b2-1-1). A triphenylsulfonium cation and a trytolysulfonium cation are especially preferable.

Examples of the salt represented by the formula (B1) include a salt wherein the anion part is any one of the above-mentioned anion and the cation part is any one of the above-mentioned cation.

Preferable examples of the salt include a combination of any one of anions represented by the formulae (b1-1-1) to (b1-1-9) and the cation represented by the formulae (b2-1-1), and a combination of any one of anions represented by the formulae (b1-1-3) to (b1-1-5) and the cation represented by the formulae (b2-3).

Examples of the salt represented by the formula (B1) include the salts represented by the formulae (B1-1) to (B1-20), and the salt represented by the formulae (B1-1), (B1-2), (B1-3), (B1-6), (B1-7), (B1-11), (B1-12), (B1-13) and (B1-14) which contain a triphenylsulfonium cation or a tritolylsulfonium cation are preferable.

(B1-1)
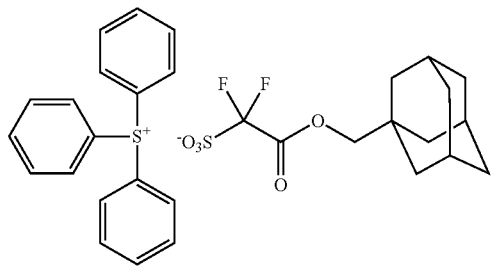

(B1-2)
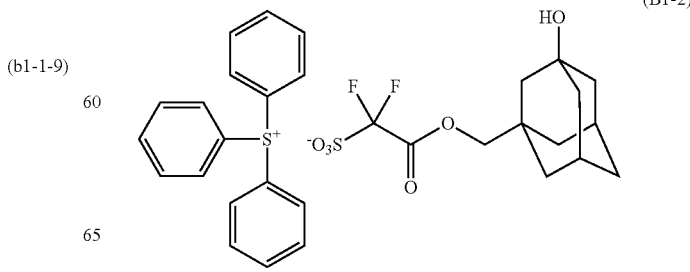

(B1-3)
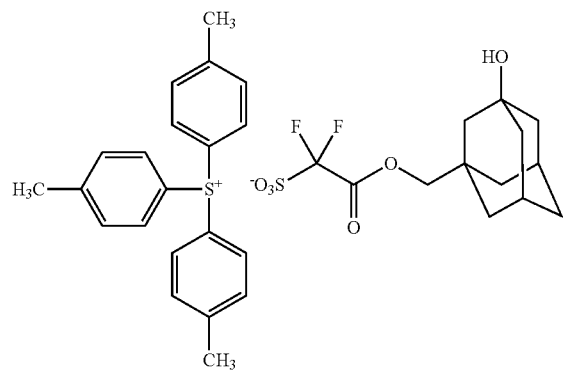
(B1-4)
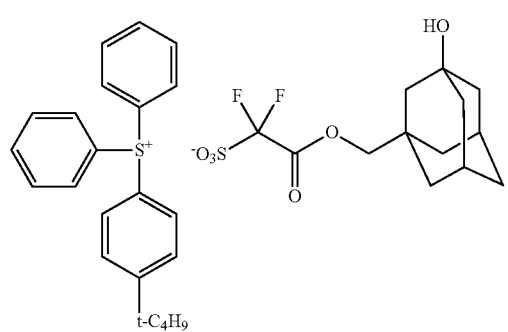
(B1-5)
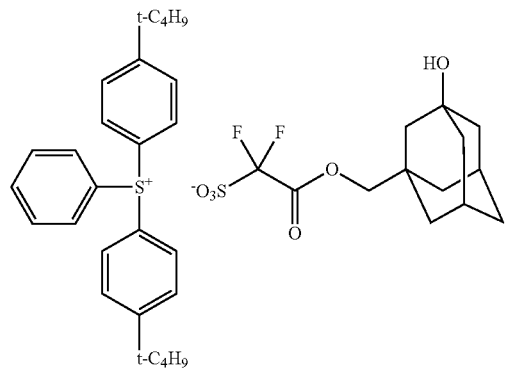
(B1-6)
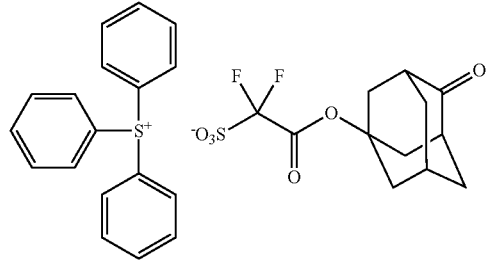
(B1-7)
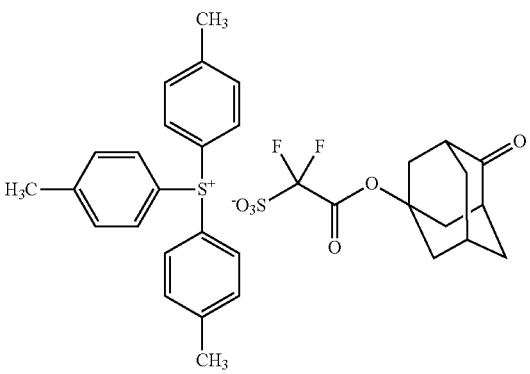
(B1-8)
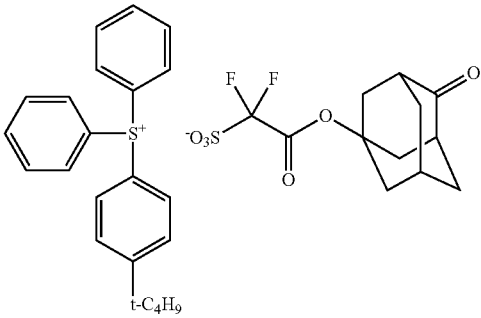
(B1-9)
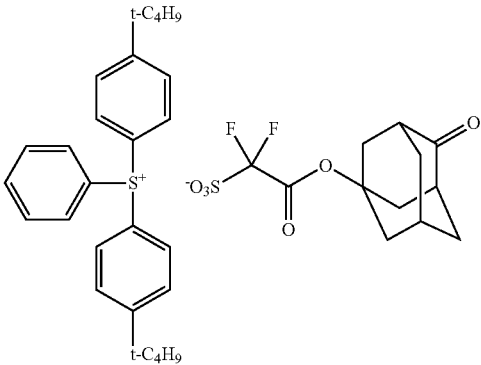
(B1-10)
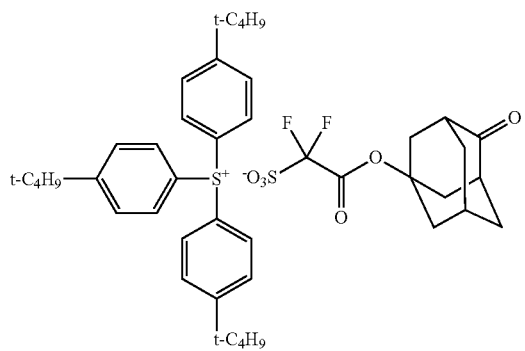

(B1-11)
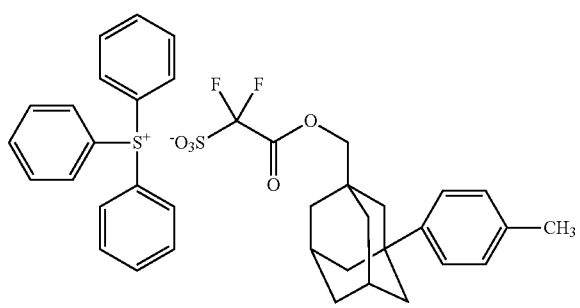

(B1-17)
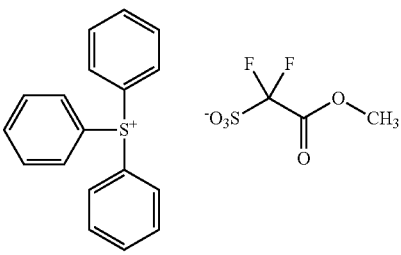

(B1-12)
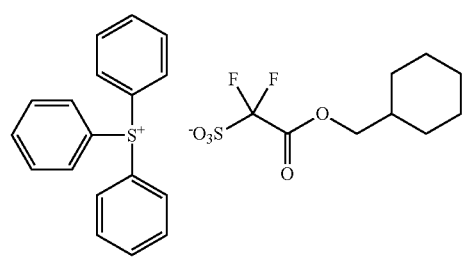

(B1-18)
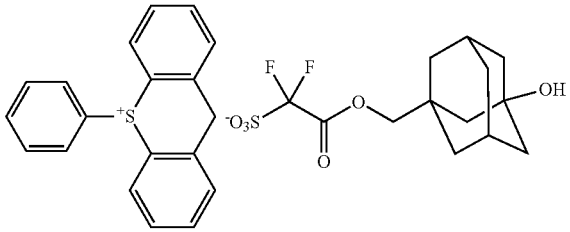

(B1-13)
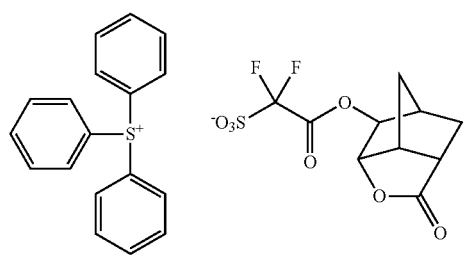

(B1-19)
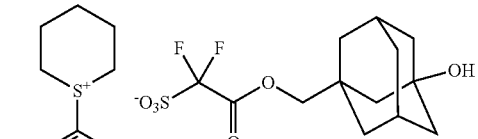

(B1-14)
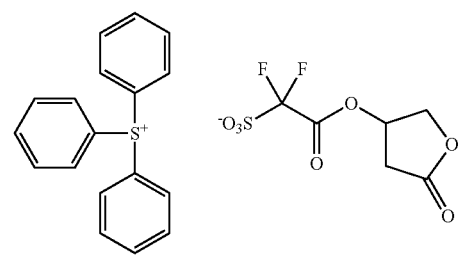

(B1-20)

(B1-15)

(B1-16)
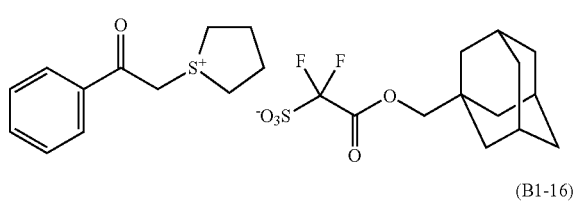

Two or more kinds of the acid generator other than SALT (I) and SALT (II-0) can be used in combination.

The total content of SALT (I), SALT (II-0) and the acid generator other than SALT (I) and SALT (II-0) is usually 2 parts by mass or more per 100 parts by mass of RESIN, and preferably 3 parts by mass or more. The total content of SALT (I), SALT (II-0) and the acid generator other than SALT (I) and SALT (II-0) is usually 40 parts by mass or less per 100 parts by mass of RESIN, and preferably 35 parts by mass or less.

In this specification, "solid component" means components other than solvent in the photoresist composition.

Next, RESIN will be illustrated.

RESIN has an acid-labile group, and is insoluble or poorly soluble in an aqueous alkali solution, and RESIN is capable of being soluble in an aqueous alkali solution by the action of an acid.

In the photoresist composition of the present invention, an acid is generated from SALT (I), SALT (II-0) and/or the acid generator other than SALT (I) and SALT (IT-0) contained therein by exposure. The acid catalytically acts against the acid-labile group in RESIN to cleave the acid-labile group, and RESIN becomes soluble in an aqueous alkali solution. In this specification, "an acid-labile group" means a group capable of being eliminated by the action of an acid.

Examples of the acid-labile group include a group represented by the formula (1):

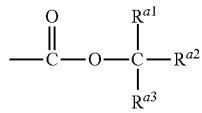
(1)

wherein $R^{a1}$, $R^{a2}$ and $R^{a3}$ independently each represent a C1-C8 alkyl group or a C3-C20 alicyclic hydrocarbon group, and $R^{a1}$ and $R^{a2}$ can be bonded each other to form a C2-C20 divalent hydrocarbon group which forms a ring together with the carbon atom to which they are bonded, and one or more —$CH_2$— in the C1-C8 alkyl group, the C3-C20 alicyclic hydrocarbon group and the C3-C20 divalent hydrocarbon group can be replaced by —O—, —S— or —CO—.

Examples of the C1-C8 alkyl group include a methyl group, an ethyl group, a propyl group, an isopropyl group, a butyl group, a pentyl group, a hexyl group, a heptyl group and an octyl group.

The alicyclic hydrocarbon group may be monocyclic or polycyclic, and may be saturated or non-aromatic unsaturated. Examples thereof include a monocyclic alicyclic hydrocarbon group such as a C3-C20 cycloalkyl group (e.g. a cyclopentyl group, a cyclohexyl group, a methylcyclohexyl group, a dimethylcyclohexyl group, a cycloheptyl group and a cyclooctyl group) and a polycyclic alicyclic hydrocarbon group such as a decahydronaphthyl group, an adamantyl group, a norbornyl group, a methylnorbornyl group, and the followings;

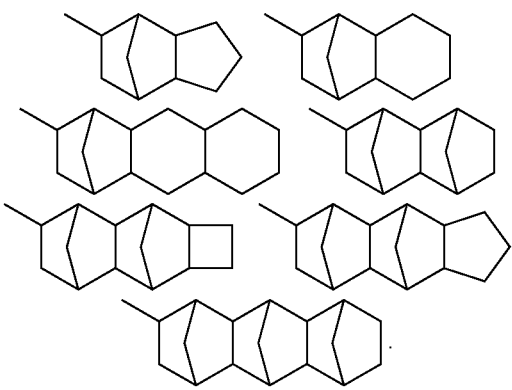

The alicyclic hydrocarbon group is preferably a saturated cyclic hydrocarbon group, and preferably has 5 to 16 carbon atoms.

Examples of the ring formed by bonding $R^{a1}$ and $R^{a2}$ each other include the following groups and the ring preferably has 3 to 12 carbon atoms.

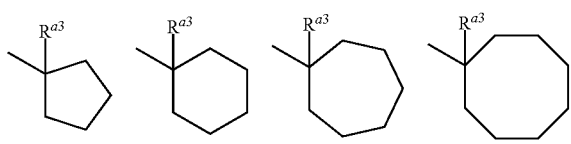

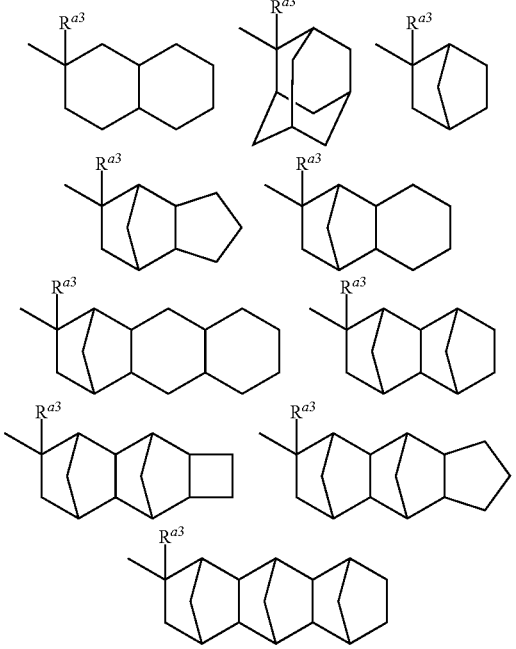

wherein $R^{a3}$ is the same as defined above.

The group represented by the formula (1) wherein $R^{a1}$, $R^{a2}$ and $R^{a3}$ independently each represent a C1-C8 alkyl group such as a tert-butyl group, the group represented by the formula (1) wherein $R^{a1}$ and, $R^{a2}$ are bonded each other to form an adamantyl ring and $R^{a3}$ is a C1-C8 alkyl group such as a 2-alkyl-2-adamantyl group, and the group represented by the formula (1) wherein $R^{a1}$ and $R^{a2}$ are C1-C8 alkyl groups and $R^{a3}$ is an adamantyl group such as a 1-(1-adamantyl)-1-alkylalkoxycarbonyl group are preferable.

Examples of the acid-labile group include a group represented by the formula (2):

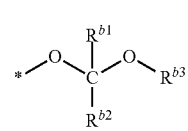
(2)

wherein $R^{b1}$ and $R^{b2}$ independently each represent a hydrogen atom or a C1-C12 hydrocarbon group, and $R^{b3}$ represents a C1-C20 hydrocarbon group, and $R^{b2}$ and $R^{b3}$ can be bonded each other to form a C2-C20 divalent hydrocarbon group which forms a ring together with the carbon atom and the oxygen atom to which they are bonded, and one or more —$CH_2$— in the hydrocarbon group and the divalent hydrocarbon group can be replaced by —O—, —S— or —CO—.

The group represented by the formula (2) has an acetal structure.

Examples of the hydrocarbon group include an aliphatic hydrocarbon group, an alicyclic hydrocarbon group and an aromatic hydrocarbon group. Examples of the aromatic hydrocarbon group include an aryl group such as a phenyl group, a naphthyl group, an anthryl group, a p-methylphenyl group, a p-tert-butylphenyl group, a p-adamantylphenyl group, a tolyl group, a xylyl group, a cumyl group, a mesityl group, a biphenyl group, a phenathryl group, a 2,6-diethylphenyl group and a 2-methyl-6-ethylphenyl group.

It is preferred that at least one of $R^{b1}$ and $R^{b2}$ is a hydrogen atom.

Examples of the group represented by the formula (2) include the following.

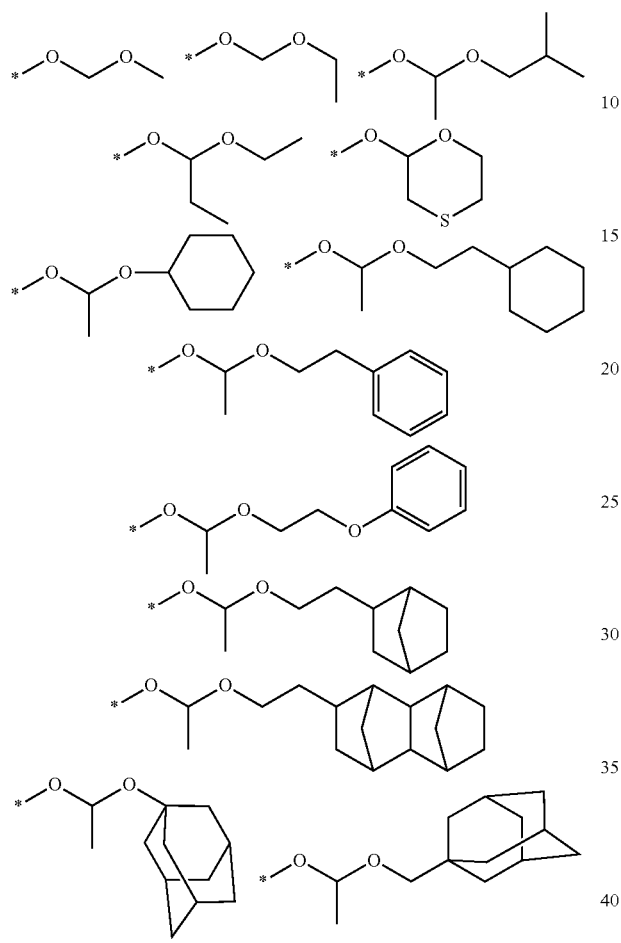

The compound having an acid-labile group is preferably a monomer having an acid-labile group in its side chain and a carbon-carbon double bond, and is more preferably an acrylate monomer having an acid-labile group in its side chain or a methacryalte monomer having an acid-labile group in its side chain.

A monomer having the group represented by the formula (1) or (2) in its side chain and a carbon-carbon double bond is preferable, and an acrylate monomer having the group represented by the formula (1) in its side chain or a methacryalte monomer having the group represented by the formula (1) in its side chain is more preferable.

An acrylate monomer having the group represented by the formula (1) in which $R^{a1}$ and $R^{a2}$ are bonded each other to form a C5-C20 alicycle together with the carbon atom to which they are bonded in its side chain or a methacryalte monomer having the group represented by the formula (1) in which $R^{a1}$ and $R^{a2}$ are bonded each other to form a C5-C20 alicycle together with the carbon atom to which they are bonded in its side chain is especially preferable. When the photoresist composition contains a resin derived from a monomer having a bulky structure such as a saturated alicyclic hydrocarbon group, the photoresist composition having excellent resolution tends to be obtained.

Preferable examples of the structural unit derived from the monomer having an acid-labile group include the structural units represented by the formulae (a1-1) and (a1-2):

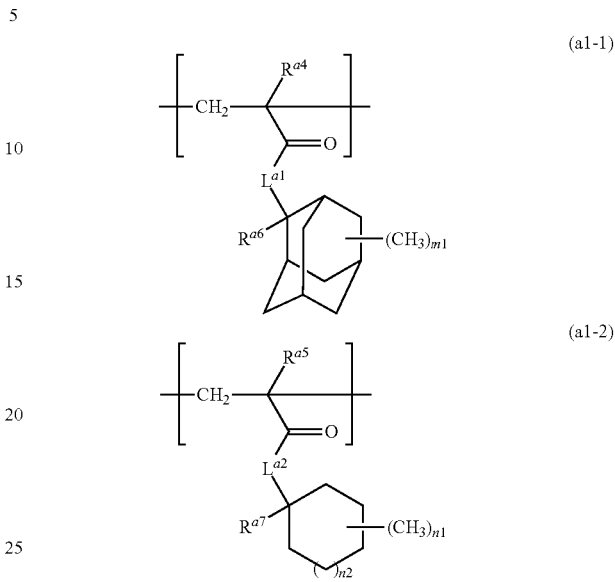

wherein $R^{a4}$ and $R^{a5}$ each independently represents a hydrogen atom or a methyl group, $R^{a6}$ and $R^{a7}$ each independently represents a C1-C10 aliphatic hydrocarbon group, $L^{a1}$ and $L^{a2}$ each independently represents *—O— or *—O—$(CH_2)_{k1}$—CO—O— in which * represents a binding position to —CO—, and k1 represents an integer of 1 to 7, and m1 represents an integer of 0 to 14, n1 represents an integer of 0 to 10, and n2 represents an integer of 0 to 3.

$L^{a1}$ is preferably *—O— or *—O—$(CH_2)_{f1}$—CO—O— in which * represents a binding position to —CO—, and f1 represents an integer of 1 to 4, and is more preferably *—O— or *—O—$CH_2$—CO—O—, and is especially preferably *—O—. $L^{a2}$ is preferably *—O— or *—O—$(CH_2)_{f1}$—CO—O— in which * represents a binding position to —CO—, and f1 is the same as defined above, and is more preferably *—O— or *—O—$CH_2$—CO—O—, and is especially preferably *—O—.

$R^{a4}$ and $R^{a5}$ are preferably methyl groups.

The aliphatic hydrocarbon group represented by $R^{a6}$ and $R^{a7}$ is preferably C1-C8 alkyl group or C3-C10 alicyclic hydrocarbon group. It is preferred that $R^{a6}$ and $R^{a7}$ independently each represent C1-C8 alkyl group or C3-C8 alicyclic hydrocarbon group, and it is more preferred that $R^{a6}$ and $R^{a7}$ independently each represent C1-C6 alkyl group or C3-C6 alicyclic hydrocarbon group. The alicyclic hydrocarbon group is preferably a saturated aliphatic cyclic hydrocarbon group. Examples of the aliphatic hydrocarbon group include a methyl group, an ethyl group, a propyl group, an isopropyl group, a tert-butyl group, a 2,2-dimethylethyl group, a propyl group, a 1-methylpropyl group, a 2,2-dimethylpropyl group, a 1-ethylpropyl group, a butyl group, a 1-methylbutyl group, a 2-methylbutyl group, a 3-methylbutyl group, a 1-propylbutyl group, a pentyl group, a 1-methylpentyl group, a hexyl group, a 1,4-dimethylhexyl group, a heptyl group, a 1-methylheptyl group and an octyl group. Examples of the alicyclic hydrocarbon group include a cyloheptyl group, a methylcyloheptyl group, a cyclohexyl group, a methylcyclohexyl group, a dimethylcyclohexyl group, a norbornyl group and a methylnorbornyl group.

In the formula (a1-1), m1 is preferably an integer of 0 to 3, and is more preferably 0 or 1. In the formula (a1-2), n1 is preferably an integer of 0 to 3, and is more preferably 0 or 1, and n2 is preferably 0, 1 or 2, and more preferably 0 or 1. It is preferred that k1 is an integer of 1 to 4, and it is more preferred that k1 is 1.

Examples of the monomer giving the structural unit represented by the formula (a1-1) include the monomers described in JP 2010-204646 A. Among them, preferred are the monomers represented by the formulae (a1-1-1) to (a1-1-8)

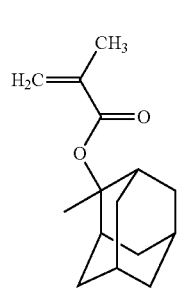

(a1-1-1)

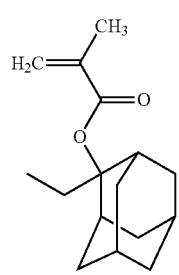

(a1-1-2)

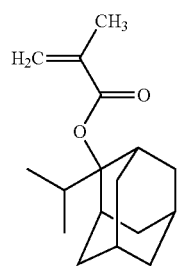

(a1-1-3)

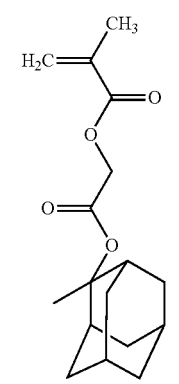

(a1-1-4)

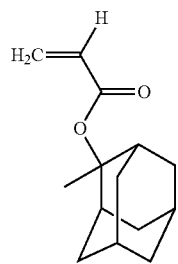

(a1-1-5)

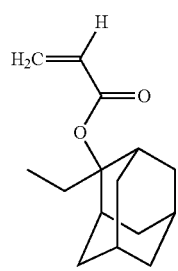

(a1-1-6)

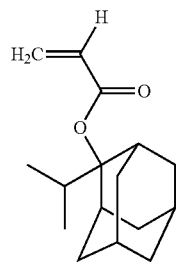

(a1-1-7)

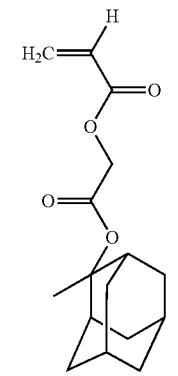

(a1-1-8)

Examples of the monomer giving the structural unit represented by the formula (a1-2) include 1-ethylcyclopentan-1-yl acrylate, 1-ethylcyclopentan-1-yl methacrylate, 1-ethylcyclohexan-1-yl acrylate, 1-ethylcyclohexan-1-yl methacrylate, 1-ethylcycloheptan-1-yl acrylate, 1-ethylcycloheptan-1-yl methacrylate, 1-methylcyclopentan-1-yl acrylate, 1-methylcyclopentan-1-yl methacrylate, 1-isopropylcyclopentan-1-yl acrylate and 1-isopropylcyclopentan-1-yl methacrylate. Among them, preferred are the monomers represented by the formulae (a1-2-1) to (a1-2-6), and more preferred are the monomers represented by the formulae (a1-2-3) and (a1-2-4), and still more preferred is the monomer represented by the formula (a1-2-3).

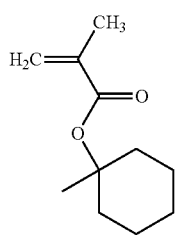
(a1-2-1)

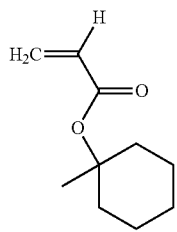
(a1-2-2)

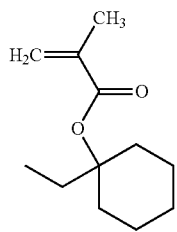
(a1-2-3)

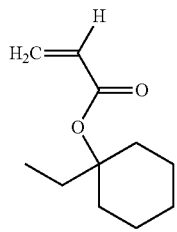
(a1-2-4)

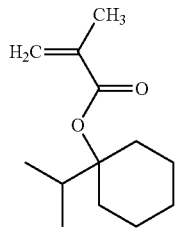
(a1-2-5)

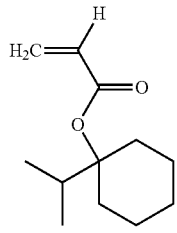
(a1-2-6)

The content of the structural unit represented by the formula (a1-1) or (a1-2) in RESIN is usually 10 to 95% by mole, preferably 15 to 90% by mole and more preferably 20 to 85% by mole and especially preferably 20 to 60% by mole based on 100% by mole of all the structural units of RESIN.

The content of the structural unit represented by the formula (a1-1) or (a1-2) in RESIN can be adjusted by adjusting the amount of the monomer giving the structural unit represented by the formula (a1-1) or (a1-2) based on the total amount of the monomers used for producing RESIN. Specifically, the amount of the monomer giving the structural unit represented by the formula (a1-1) or (a1-2) is usually 10 to 95% by mole, preferably 15 to 90% by mole and more preferably 20 to 85% by mole and especially preferably 20 to 60% by mole based on 100% by mole of all the monomers used for producing RESIN.

The content of the structural unit having an adamantyl group, especially the structural unit represented by the formula (a1-1) is preferably 15% by mole or more based on 100% by mole of all the structural units of RESIN from the viewpoint of dry-etching resistance of the photoresist composition.

Other examples of the monomer having an acid-labile group include a monomer represented by the formula (a1-5):

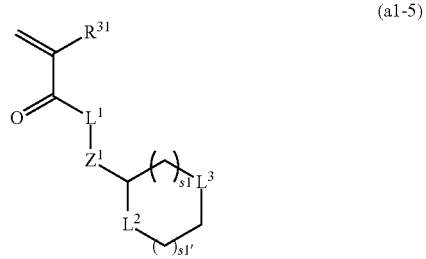
(a1-5)

wherein $R^{31}$ represents a hydrogen atom, a halogen atom, a C1-C6 alkyl group which may be substituted with a halogen atom, $L^1$ represents —O—, —S— or *—O—$(CH_2)_{k1}$—CO—O—, k1 represents an integer of 1 to 7, * represents a binding position to —CO—, $L^2$ and $L^3$ independently each represent —O— or —S—, $Z^1$ represents a single bond or a C1-C6 alkylene group in which one or more —$CH_2$— may be replaced by —O— or —CO—, s1 and s1' independently each represent an integer of 0 to 4.

Examples of the halogen atom include a fluorine atom, a chlorine atom and a bromine atom.

Examples of the C1-C6 alkyl group which may be substituted with a halogen atom include a methyl group, an ethyl group, a propyl group, an isopropyl group, a butyl group, an isobutyl group, a sec-butyl group, a tert-butyl group, a pentyl group, a hexyl group, a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group, a perfluorohexyl group, a perchloromethyl group, a perbromomethyl group and a periodomethyl group, and a C1-C4 alkyl group is preferable and a C1-C2 alkyl group is more preferable and a methyl group is especially preferable.

$R^{31}$ is preferably a hydrogen atom or a methyl group.

$L^1$ is preferably —O—.

It is preferred that one of $L^2$ and $L^3$ is —O— and the other is —S—.

In the formula (a1-5), s1 is preferably 1 and s1' is preferably 0, 1 or 2.

$Z^1$ is preferably a single bond, *—$(CH_2)_{n4}$—O— or *—$(CH_2)_{n4}$—CO—O— in which n4 represents an integer of 1 to 4, and * represents a binding position to $L^4$, and more preferably a single bond, —$CH_2$—O— or —$CH_2$—CO—O—.

Examples of the monomer represented by the formula (a1-5) include the following.

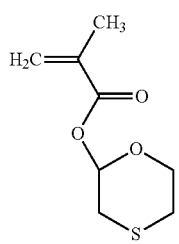
(a1-5-1)

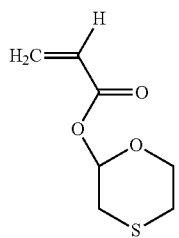
(a1-5-2)

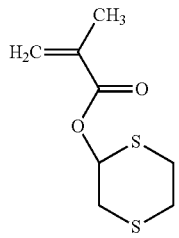
(a1-5-3)

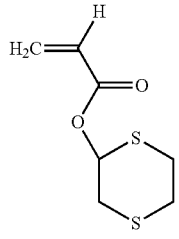
(a1-5-4)

When RESIN contains the structural unit derived form the monomer represented by the formula (a1-5), the content of the structural unit derived from the monomer represented by the formula (a1-5) is usually 1 to 95% by mole and preferably 3 to 90% by mole and more preferably 5 to 85% by mole based on total molar of all the structural units of RESIN.

RESIN can have two or more kinds of structural units derived from the monomers having an acid-labile group.

RESIN preferably contains the structural unit derived from the monomer having an acid-labile group and a structural unit derived from the monomer having no acid-labile group. RESIN can have two or more kinds of structural units derived from the monomers having no acid-labile group. When RESIN contains the structural unit derived from the monomer having an acid-labile group and the structural unit derived from the monomer having no acid-labile group, the content of the structural unit derived from the monomer having an acid-labile group is usually 10 to 80% by mole and preferably 20 to 60% by mole based on total molar of all the structural units of RESIN.

The monomer having no acid-labile group preferably contains one or more hydroxyl groups or a lactone ring. When the resin contains the structural unit derived from the monomer having no acid-labile group and having one or more hydroxyl groups or a lactone ring, a photoresist composition having good resolution and adhesiveness of photoresist to a substrate tends to be obtained.

Examples of the monomer having no acid-labile group and having one or more hydroxyl groups include the monomer represented by the formula (a2-0);

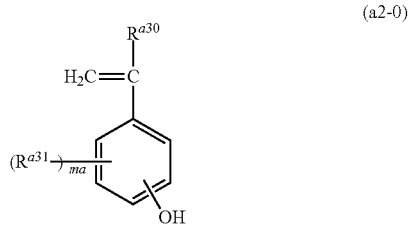
(a2-0)

wherein $R^{a30}$ represents a hydrogen atom, a halogen atom, a C1-C6 alkyl, group or a C1-C6 halogenated alkyl group, $R^{a31}$ is independently in each occurrence a halogen atom, a hydroxyl group, a C1-C6 alkyl group, a C1-C6 alkoxy group, a C2-C4 acyl group, a C2-C4 acyloxy group, an acryloyl group or a methacryloyl group, ma represents an integer of 0 to 4, and
the monomer represented by the formula (a2-1):

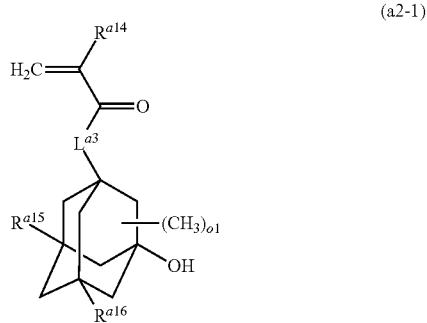
(a2-1)

wherein $R^{a14}$ represents a hydrogen atom or a methyl group, $R^{a15}$ and $R^{a16}$ each independently represent a hydrogen atom, a methyl group or a hydroxyl group, $L^{a3}$ represents *—O— or *—O—$(CH_2)_{k2}$—CO—O— in which * represents a binding position to —CO—, and k2 represents an integer of 1 to 7, and o1 represents an integer of 0 to 10.

When KrF excimer laser (wavelength; 248 nm) lithography system, or a high energy laser such as electron beam and extreme ultraviolet is used as an exposure system, the resin containing the structural unit derived from the monomer represented by the formula (a2-0) is preferable, and when ArF excimer laser (wavelength: 193 nm) is used as an exposure system, the resin containing the structural unit derived from the monomer represented by the formula (a2-1) is preferable.

In the formula (a2-0), examples of the halogen atom include a fluorine atom, examples of the C1-C6 alkyl group include a methyl group, an ethyl group, a propyl group, an isopropyl group, a butyl group, an isobutyl group, a sec-butyl group, a tert-butyl group, a pentyl group and a hexyl group, and a C1-C4 alkyl group is preferable and a C1-C2 alkyl group is more preferable and a methyl group is especially preferable. Examples of the C1-C6 halogenated alkyl group include a trifluoromethyl group, a pentafluoroethyl group, a heptafluoropropyl group, a heptafluoroisopropyl group, a nonafluorobutyl group, a nonafluoro-sec-butyl group, a nonafluoro-tert-butyl group, a perfluoropentyl group and a perfluorohexyl group. Examples of the C1-C6 alkoxy group include a methoxy group, an ethoxy group, a propoxy group, an isopropoxy group, a butoxy group, an isobutoxy group, a sec-butoxy group, a tert-butoxy group, a pentyloxy group and a hexyloxy group, and a C1-C4 alkoxy group is preferable and a C1-C2 alkoxy group is more preferable and a methoxy group is especially preferable. Examples of the C2-C4 acyl group include an acetyl group, a propionyl group and a butyryl group, and examples of the C2-C4 acyloxy group include an acetyloxy group, a propionyloxy group and a butyryloxy group. In the formula (a2-0), ma is preferably 0, 1 or 2, and is more preferably 0 or 1, and especially preferably 0.

RESIN containing the structural unit derived from the monomer represented by the formula (a2-0) can be produced, for example, by polymerizing a monomer obtained by protecting a hydroxyl group of the monomer represented by the formula (a2-0) with a protecting group such as an acetyl group followed by conducting deprotection of the obtained polymer with an acid or a base.

Preferable examples of the monomer represented by the formula (a2-0) include those described in JP 2010-204634 A, and the monomers represented by the formulae (a2-0-1) to (a2-0-2) are preferable.

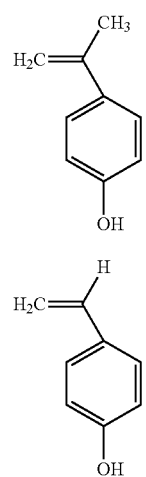

(a2-0-1)

(a2-0-2)

RESIN containing the structural unit derived from the monomer represented by the formula (a2-0) can be produced, for example, by polymerizing a monomer obtained by protecting a hydroxyl group of the monomer represented by the formula (a2-0) with a protecting group such as an acetyl group followed by conducting deprotection of the obtained polymer with a base.

When RESIN contains the structural unit derived from the monomer represented by the formula (a2-0), the content of the structural unit derived from the monomer represented by the formula (a2-0) is usually 5 to 90% by mole and preferably 10 to 85% by mole and more preferably 15 to 80% by mole based on total molar of all the structural units of RESIN.

In the formula (a2-1), $R^{a14}$ is preferably a methyl group, $R^{a15}$ is preferably a hydrogen atom, $R^{a16}$ is preferably a hydrogen atom or a hydroxyl group, $L^{a3}$ is preferably *—O— or *—O—$(CH_2)_{f2}$—CO—O— in which * represents a binding position to —CO—, and f2 represents an integer of 1 to 4, and is more preferably *—O— or *—O—$CH_2$—CO—O—, and especially preferably *—O—, and o1 is preferably 0, 1, 2 or 3 and is more preferably 0 or 1.

Examples of the monomer represented by the formula (a2-1) include the monomers represented by the formulae (a2-1-1) to (a2-1-6).

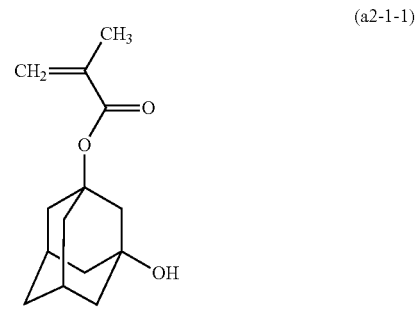

(a2-1-1)

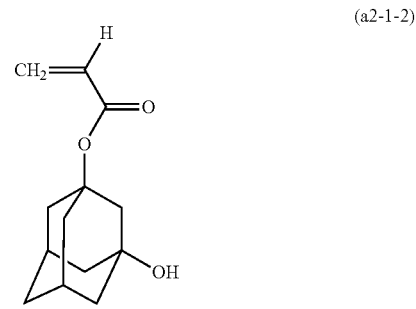

(a2-1-2)

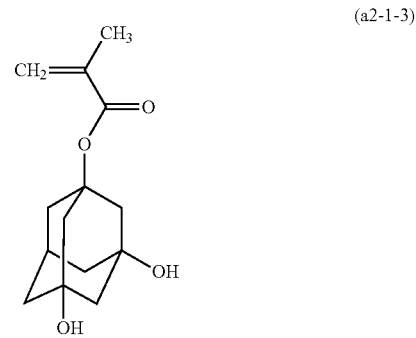

(a2-1-3)

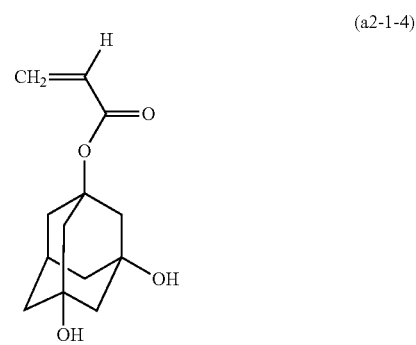

(a2-1-4)

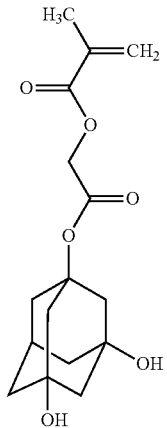

(a2-1-5)

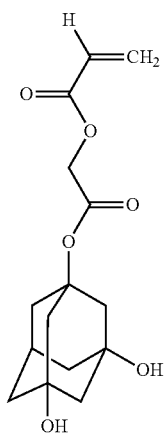

(a2-1-6)

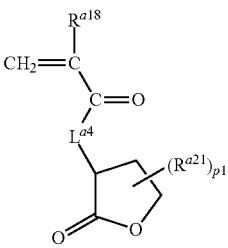

(a3-1)

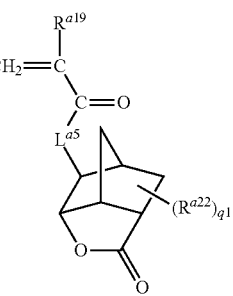

(a3-2)

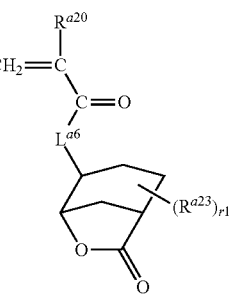

(a3-3)

Preferable examples of the monomer represented by the formula (a2-1) include the monomers represented by the formulae (a2-1-1) to (a2-1-4), and the monomers represented by the formulae (a2-1-1) and (a2-1-3) are more preferable.

Examples of the monomer represented by the formula (a2-1) include the monomers described in JP 2010-204646 A.

When RESIN contains the structural unit derived from the monomer represented by the formula (a2-1), the content of the structural unit derived from the monomer represented by the formula (a2-1) is usually 3 to 45% by mole based on total molar of all the structural units of RESIN, and preferably 5 to 40% by mole, and more preferably 5 to 35% by mole, and especially preferably 5 to 20% by mole.

Examples of the lactone ring of the monomer having no acid-labile group and a lactone ring include a monocyclic lactone ring such as β-propiolactone ring, γ-butyrolactone ring and γ-valerolactone ring, and a condensed ring formed from a monocyclic lactone ring and the other ring. Among them, preferred are γ-butyrolactone ring and a condensed lactone ring formed from γ-butyrolactone ring and the other ring.

Preferable examples of the monomer having no acid-labile group and a lactone ring include the monomers represented by the formulae (a3-1), (a3-2) and (3-3):

wherein $L^{a4}$, $L^{a5}$ and $L^{a6}$ each independently represent *—O— or *—O—$(CH_2)_{k3}$—CO—O— in which * represents a binding position to —O— and k3 represents an integer of 1 to 7, $R^{a18}$, $R^{a19}$ and $R^{a20}$ each independently represent a hydrogen atom or a methyl group, $R^{a21}$ represents a C1-C4 alkyl group, $R^{a22}$ and $R^{a23}$ are independently in each occurrence a carboxyl group, a cyano group or a C1-C4 alkyl group, and p1 represents an integer of 0 to 5, q1 and r1 independently each represent an integer of 0 to 3.

It is preferred that $L^{a4}$ $L^{a5}$ and $L^{a6}$ each independently represent *—O— or *—O—$(CH_2)_{d1}$—CO—O— in which * represents a binding position to —CO— and d1 represents an integer of 1 to 4, and it is more preferred that $L^{a4}$, $L^{a5}$ and $L^{a6}$ are *—O— or *—O—$CH_2$—CO—O—, and it is especially preferred that $L^{a4}$, $L^{a5}$ and $L^{a6}$ are *—O—. $R^{a18}$, $R^{a19}$ and $R^{a20}$ are preferably methyl groups. $R^{a21}$ is preferably a methyl group. It is preferred that $R^{a22}$ and $R^{a23}$ are independently in each occurrence a carboxyl group, a cyano group or a methyl group. It is preferred that p1 is an integer of 0 to 2, and it is more preferred that p1 is 0 or 1. It is preferred that q1 and r1 independently each represent an integer of 0 to 2, and it is more preferred that q1 and r1 independently each represent 0 or 1.

Examples of the monomers represented by the formula (a3-1), (a3-2) and (a3-3) include the monomers represented by the formulae (a3-1-1) to (a3-1-4), (a3-2-1) to (a3-2-4) and (a3-3-1) to (a3-3-4).

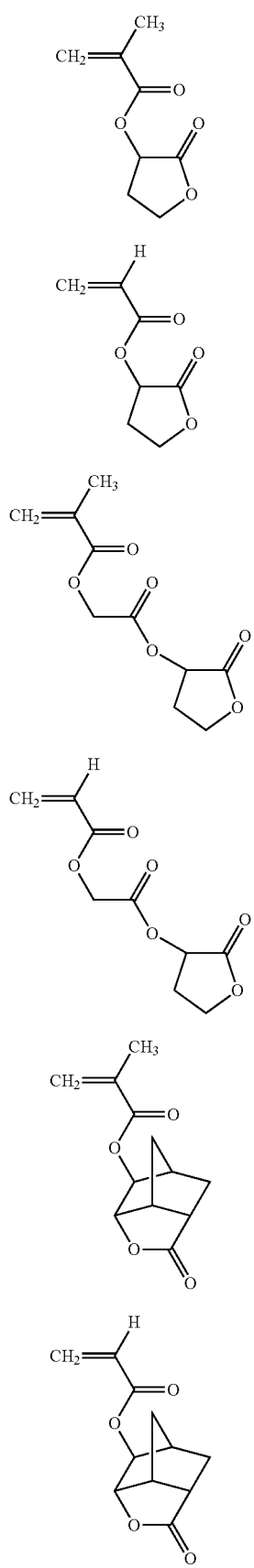
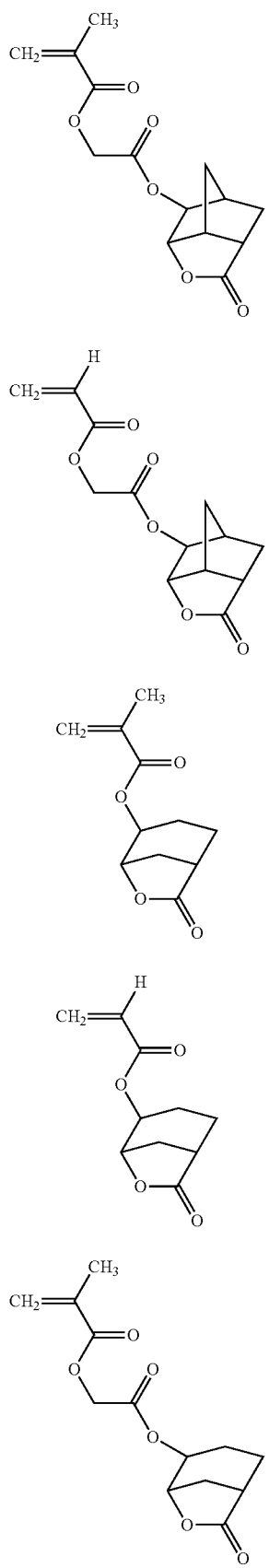

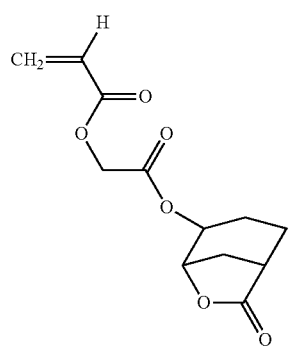

(a3-3-4)

Among them, preferred are the monomers represented by the formulae (a3-1-1) to (a3-1-2) and (a3-2-3) to (a3-2-4), and more preferred are the monomers represented by the formulae (a3-1-1) and (a3-2-3).

Examples of the monomers represented by the formulae (a3-1), (a3-2) and (a3-3) include the monomers described in JP 2010-204646 A.

When RESIN contains the structural unit derived from the monomer having no acid-labile group and having a lactone ring, the content thereof is usually 5 to 70% by mole based on total molar of all the structural units of RESIN, and preferably 10 to 65% by mole and more preferably 10 to 60% by mole, still more preferably 15 to 55% by mole and especially preferably 15 to 50% by mole.

When RESIN contains the structural unit represented by the formula (a3-1), (a3-2) or (a3-3), the content thereof is usually 5 to 60% by mole based on total molar of all the structural units of RESIN, respectively, and preferably 5 to 50% by mole, respectively, and more preferably 10 to 50% by mole, respectively.

Preferable RESIN is a resin containing the structural units derived from the monomer having an acid-labile group and the structural units derived from the monomer having no acid-labile group, and more preferable resin is a resin containing the structural units derived from the monomer having an acid-labile group and the structural units derived from the monomer having one or more hydroxyl groups and/or the monomer having a lactone ring. The monomer having an acid-labile group is preferably the monomer represented by the formula (a1-1) or the monomer represented by the formula (a1-2), and is more preferably the monomer represented by the formula (a1-1). The monomer having one or more hydroxyl groups is preferably the monomer represented by the formula (a2-1), and the monomer having a lactone ring is preferably the monomer represented by the formula (a3-1) or (a3-2).

RESIN can be produced according to known polymerization methods such as radical polymerization.

RESIN usually has 2,500 or more of the weight-average molecular weight, and 50,000 or less of the weight-average molecular weight.

RESIN preferably has 3,000 or more of the weight-average molecular weight, and 30,000 or less of the weight-average molecular weight.

RESIN more preferably has 4,000 or more of the weight-average molecular weight, and 15,000 or less of the weight-average molecular weight. The weight-average molecular weight can be measured with gel permeation chromatography.

The content of RESIN in the photoresist composition of the present invention is usually 80% by mass or more based on sum of solid component. The content of RESIN in the photoresist composition of the present invention is usually 99% by mass or less based on sum of solid component.

The photoresist compositions of the present invention can contain a basic compound as a quencher. The basic compound has the property that it can trap an acid, especially an acid generated from the acid generator by applying a radiation.

The basic compound is preferably a basic nitrogen-containing organic compound, and examples thereof include an amine compound such as an aliphatic amine and an aromatic amine and an ammonium salt. Examples of the aliphatic amine include a primary amine, a secondary amine and a tertiary amine. Examples of the aromatic amine include an aromatic amine in which aromatic ring has one or more amino groups such as aniline and a heteroaromatic amine such as pyridine. Preferable examples thereof include an aromatic amine represented by the formula (C2):

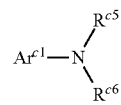

(C2)

wherein $Ar^{c1}$ represents an aromatic hydrocarbon group, and $R^{c5}$ and $R^{c6}$ independently represent a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group.

The aliphatic hydrocarbon group is preferably an alkyl group and the saturated cyclic hydrocarbon group is preferably a cycloalkyl group. The aliphatic hydrocarbon group preferably has 1 to 6 carbon atoms. The saturated cyclic hydrocarbon group preferably has 5 to 10 carbon atoms. The aromatic hydrocarbon group preferably has 6 to 10 carbon atoms.

As the aromatic amine represented by the formula (C2), an amine represented by the formula (C2-1):

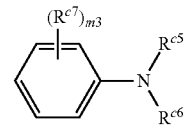

(C2-1)

wherein $R^{c5}$ and $R^{c6}$ are the same as defined above, and $R^{c7}$ is independently in each occurrence an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, and m3 represents an integer of 0 to 3, is preferable. The aliphatic hydrocarbon group is preferably an alkyl group and the saturated cyclic hydrocarbon group is preferably a cycloalkyl group. The aliphatic hydrocarbon group preferably has 1 to 6 carbon atoms.

The saturated cyclic hydrocarbon group preferably has 5 to 10 carbon atoms. The aromatic hydrocarbon group preferably has 6 to 10 carbon atoms. The alkoxy group preferably has 1 to 6 carbon atoms.

Examples of the aromatic amine represented by the formula (C2) include 1-naphthylamine, 2-naphthylamine, aniline, diisopropylaniline, 2-methylaniline, 3-methylaniline, 4-methylaniline, 4-nitroaniline, N-methylaniline, N,N-dimethylaniline, and diphenylamine, and among them, preferred is diisopropylaniline and more preferred is 2,6-diisopropylaniline.

Other examples of the basic compound include amines represented by the formulae (C3) to (C11);

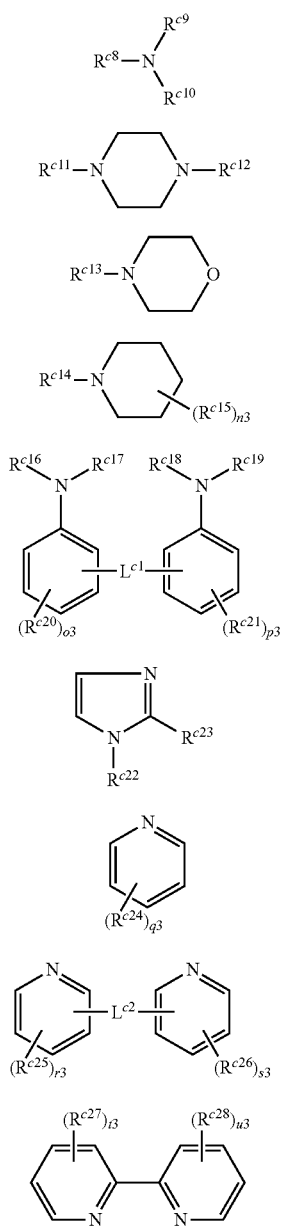

wherein $R^{c8}$, $R^{c20}$, $R^{c21}$, and $R^{c23}$ to $R^{c20}$ independently represent an aliphatic hydrocarbon group, an alkoxy group, a saturated cyclic hydrocarbon group or an aromatic hydrocarbon group, and the aliphatic hydrocarbon group, the alkoxy group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, $R^{c9}$, $R^{c10}$, $R^{c11}$ to $R^{c14}$, $R^{c16}$ to $R^{c19}$, and $R^{c22}$ independently represents a hydrogen atom, an aliphatic hydrocarbon group, a saturated cyclic hydrocarbon group or an aromatic hydrocarbon group, and the aliphatic hydrocarbon group, the saturated cyclic hydrocarbon group and the aromatic hydrocarbon group can have one or more substituents selected from the group consisting of a hydroxyl group, an amino group, an amino group having one or two C1-C4 alkyl groups and a C1-C6 alkoxy group, $R^{c15}$ is independently in each occurrence an aliphatic hydrocarbon group, a saturated cyclic hydrocarbon group or an alkanoyl group, $L^{c1}$ and $L^{c2}$ independently represents a divalent aliphatic hydrocarbon group, —CO—, —C(=NH)—, —C(=NR$^{c3}$)—, —S—, —S—S— or a combination thereof and $R^{c3}$ represents a C1-C4 alkyl group, O3 to u3 each independently represents an integer of 0 to 3 and n3 represents an integer of 0 to 8.

The aliphatic hydrocarbon group has preferably 1 to 6 carbon atoms, and the saturated cyclic hydrocarbon group has preferably 3 to 6 carbon atoms, and the alkanoyl group has preferably 2 to 6 carbon atoms, and the divalent aliphatic hydrocarbon group has preferably 1 to 6 carbon atoms. The divalent aliphatic hydrocarbon group is preferably an alkylene group.

Examples of the amine represented by the formula (C3) include hexylamine, heptylamine, octylamine, nonylamine, decylamine, dibutylamine, dipentylamine, dihexylamine, diheptylamine, dioctylamine, dinonylamine, didecylamine, trietylamine, trimethylamine, tripropylamine, tributylamine, tripentylamine, trihexylamine, triheptylamine, trioctylamine, trinonylamine, tridecylamine, methyldibutylamine, methyldipentylamine, methyldihexylamine, methyldicyclohexylamine, methyldiheptylamine, methyldioctylamine, methyldinonylamine, methyldidecylamine, ethyldibutylamine, ethydipentylamine, ethyldihexylamine, ethydiheptylamine, ethyldioctylamine, ethyldinonylamine, ethyldidecylamine, dicyclohexylmethylamine, tris[2-(2-methoxyethoxy)ethyl]amine, triisopropanolamine, ethylenediamine, tetramethylenediamine, hexamethylenediamine, 4,4'-diamino-1,2-diphenylethane, 4,4'-diamino-3,3'-dimethyldiphenylmethane and 4,4'-diamino-3,3'-diethyldiphenylmethane.

Examples of the amine represented by the formula (C4) include piperazine. Examples of the amine represented by the formula (C5) include morpholine. Examples of the amine represented by the formula (C6) include piperidine and hindered amine compounds having a piperidine skeleton as disclosed in JP 11-52575 A. Examples of the amine represented by the formula (C7) include 2,2'-methylenebisaniline. Examples of the amine represented by the formula (C8) include imidazole and 4-methylimidazole. Examples of the amine represented by the formula (C9) include pyridine and 4-methylpyridine. Examples of the amine represented by the formula (C10) include di-2-pyridyl ketone, 1,2-di(2-pyridyl)ethane, 1,2-di(4-pyridyl)ethane, 1,3-di(4-pyridyl)propane, 1,2-bis(2-pyridyl)ethene, 1,2-bis(4-pyridyl)ethene, 1,2-di(4-pyridyloxy)ethane, 4,4'-dipyridyl sulfide, disulfide, 2,2'-dipyridylamine and 2,2'-dipicolylamine. Examples of the amine represented by the formula (C11) include bipyridine.

Examples of the quaternary ammonium hydroxide include tetramethylammonium hydroxide, tetrabutylammonium hydroxide, tetrahexylammonium hydroxide, tetraoctylammonium hydroxide, phenyltrimethylammonium hydroxide, (3-trifluoromethylphenyl)trimethylammonium hydroxide and (2-hydroxyethyl)trimethylammonium hydroxide (so-called "choline").

When the photoresist composition contains the basic compound, the content thereof is usually 0.01 to 5% by mass based on sum of solid component, and preferably 0.01 to 3% by mass, and more preferably 0.01 to 1% by mass.

The photoresist compositions of the present invention usually contain one or more solvents. Examples of the solvent include a glycol ether ester such as ethyl cellosolve acetate, methyl cellosolve acetate and propylene glycol monomethyl ether acetate; a glycol ether such as propylene glycol monomethyl ether; an acyclic ester such as ethyl lactate, butyl acetate, amyl acetate and ethyl pyruvate; a ketone such as acetone, methyl isobutyl ketone, 2-heptanone and cyclohexanone; and a cyclic ester such as γ-butyrolactone.

The amount of the solvent is usually 90% by mass or more, preferably 92% by mass or more preferably 94% by mass or more based on total amount of the photoresist composition of the present invention. The amount of the solvent is usually 99.9% by mass or less and preferably 99% by mass or less based on total amount of the photoresist composition of the present invention.

The photoresist compositions of the present invention can contain, if necessary, a small amount of various additives such as a sensitizer, a dissolution inhibitor, other polymers, a surfactant, a stabilizer and a dye as long as the effect of the present invention is not prevented.

The photoresist compositions of the present invention are useful for a chemically amplified photoresist composition.

A photoresist pattern can be produced by the following steps (1) to (5):

(1) a step of applying the first or second photoresist composition of the present invention on a substrate,
(2) a step of forming a photoresist film by conducting drying,
(3) a step of exposing the photoresist film to radiation,
(4) a step of baking the exposed photoresist film, and
(5) a step of developing the baked photoresist film with an alkaline developer, thereby forming a photoresist pattern.

The applying of the photoresist composition on a substrate is usually conducted using a conventional apparatus such as spin coater. The photoresist composition is preferably filtrated with filter having a pore size of 0.003 to 0.2 μm before applying. Examples of the substrate include a silicon wafer or a quartz wafer on which a sensor, a circuit, a transistor or the like is formed.

The formation of the photoresist film is usually conducted using a heating apparatus such as hot plate or a decompressor, and the heating temperature is usually 50 to 200° C., and the operation pressure is usually 1 to $1.0*10^5$ Pa.

The photoresist film obtained is exposed to radiation using an exposure system. The exposure is usually conducted through a mask having a pattern corresponding to the desired photoresist pattern. Examples of the exposure source include a light source radiating laser light in a UV-region such as a KrF excimer laser (wavelength: 246 nm), an ArF excimer laser (wavelength: 193 nm) and a $F_2$ laser (wavelength: 157 nm), and a light source radiating harmonic laser light in a far UV region or a vacuum UV region by wavelength conversion of laser light frame solid laser light source (such as YAG or semiconductor laser).

The temperature of baking of the exposed photoresist film is usually 50 to 200° C., and preferably 70 to 150° C.

The development of the baked photoresist film is usually carried out using a development apparatus. The alkaline developer used may be any one of various alkaline aqueous solution used in the art. Generally, an aqueous solution of tetramethylammonium hydroxide or (2-hydroxyethyl)trimethylammonium hydroxide (commonly known as "choline") is often used. After development, the photoresist pattern formed is preferably washed with ultrapure water, and the remained water on the photoresist pattern and the substrate is preferably removed.

The photoresist composition of the present invention provides a photoresist pattern showing good Exposure Latitude (EL), and therefore, the photoresist composition of the present invention is suitable for ArF excimer laser lithography, KrF excimer laser lithography, ArF immersion lithography, EUV (extreme ultraviolet) lithography, EUV immersion lithography and EB (electron beam) lithography. Further, the photoresist composition of the present invention can especially be used for immersion lithography.

EXAMPLES

The present invention will be described more specifically by Examples, which are not construed to limit the scope of the present invention.

The "%" and "part(s)" used to represent the content of any component and the amount of any material used in the following examples and comparative examples are on a mass basis unless otherwise specifically noted. The weight-average molecular weight of any material used in the following examples is a value found by gel permeation chromatography [Apparatus: HLC-8120 GPC Type, manufactured by TOSOH CORPORATION, Column: Three of TSKgel Multipore HXL-M with guard column, manufactured by TOSOH CORPORATION, Solvent: tetrahydrofuran, Flow rate: 1.0 mL/min., Detector: RI Detector, Column temperature: 40° C., Injection volume: 100 μL] using standard polystyrene manufactured by TOSOH CORPORATION as a standard reference material.

Synthetic Example 1

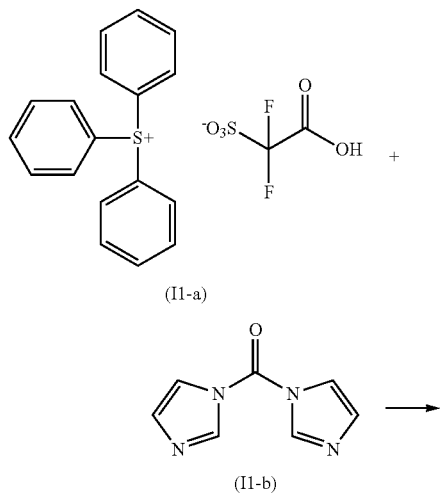

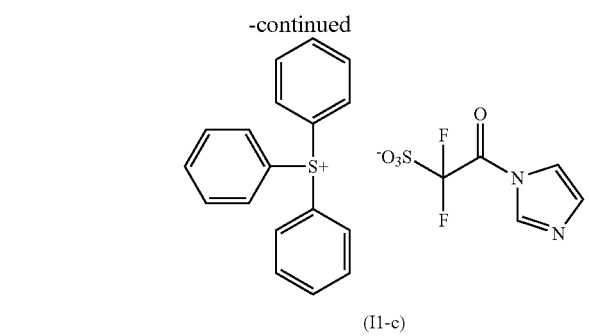

(I1-c)

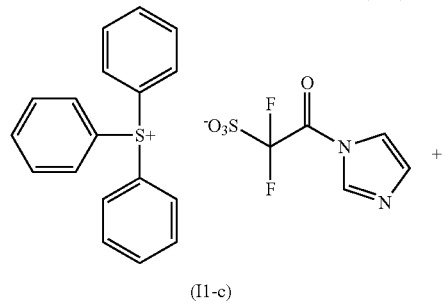

(I1-c)

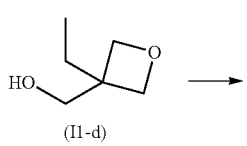

(I1-d)

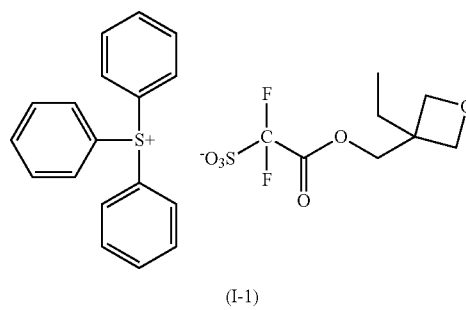

(I-1)

The salt represented by the formula (I1-a) was prepared according to the method described in JP 2008-127367 A.

Ten (10) parts of the salt represented by the formula (I1-a), 50.00 parts of acetonitrile and 4.44 parts of the compound represented by the formula (I1-b) were mixed, and the resultant mixture was stirred at 80° C. for 30 minutes. The mixture obtained was cooled down to 23° C., and then, filtrated to obtain 59.48 parts of the solution containing the salt represented by the formula (I1-c).

The solution obtained and 2.57 parts of the compound represented by the formula (I1-d) were mixed, and the resultant mixture was stirred at 23° C. for 1 hour. The reaction mixture obtained was filtrated. The filtrate obtained was concentrated. The concentrate obtained was mixed with 100 parts of chloroform and 30 parts of ion-exchanged water, and then the resultant mixture was stirred and separated to obtain an organic layer. This washing was repeated three times. The organic layer obtained was concentrated to obtain 8.73 parts of the salt represented by the formula (I-1). This is called as Salt I-1.

MS (ESI(+) Spectrum): M⁺ 263.1
MS (ESI(−) Spectrum): M⁻ 273.0

Synthetic Example 2

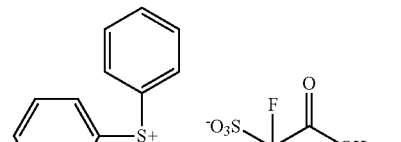

(I5-a)

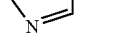

(I5-b)

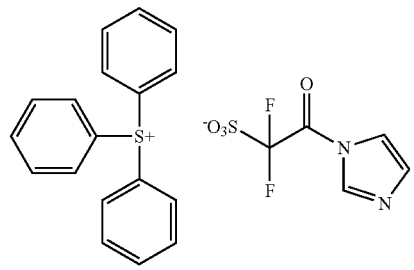

(I5-c)

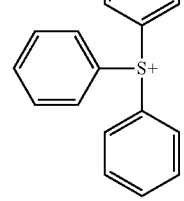

(I5-c)

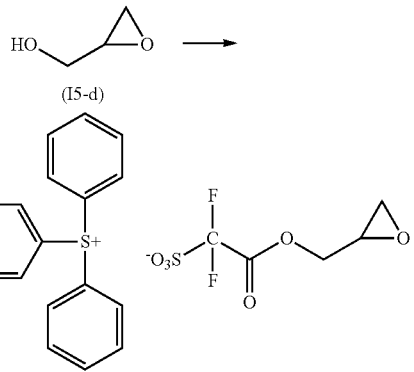

(I5-d)

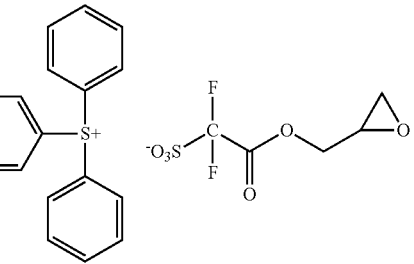

(I-5)

The salt represented by the formula (I5-a) was prepared according to the method described in JP 2008-127367 A.

Ten (10) parts of the salt represented by the formula (I5-a), 50.00 parts of acetonitrile and 4.44 parts of the compound represented by the formula (I5-b) were mixed, and the resultant mixture was stirred at 80° C. for 30 minutes. The mixture obtained was cooled down to 23° C., and then, filtrated to obtain 59.68 parts of the solution containing the salt represented by the formula (I5-c).

The solution obtained and 1.64 parts of the compound represented by the formula (I5-d) available from Alidrich were mixed, and the resultant mixture was stirred at 23° C. for 1 hour.

The reaction mixture obtained was filtrated. The filtrate obtained was concentrated. The concentrate obtained was mixed with 100 parts of chloroform and 30 parts of ion-exchanged water, and then the resultant mixture was stirred and separated to obtain an organic layer. This washing was repeated three times. The organic layer obtained was concentrated to obtain 5.80 parts of the salt represented by the formula (I-5). This is called as Salt I-5.

MS (ESI(+) Spectrum): M$^+$ 263.1
MS (ESI(−) Spectrum): M$^-$ 231.0

Synthetic Example 3

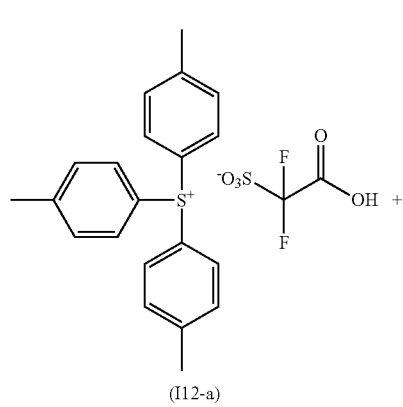
(I12-a)

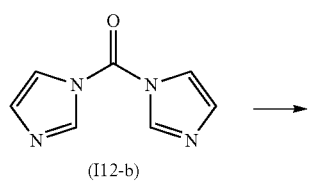
(I12-b)

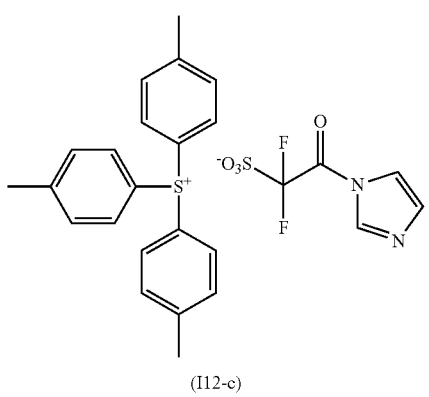
(I12-c)

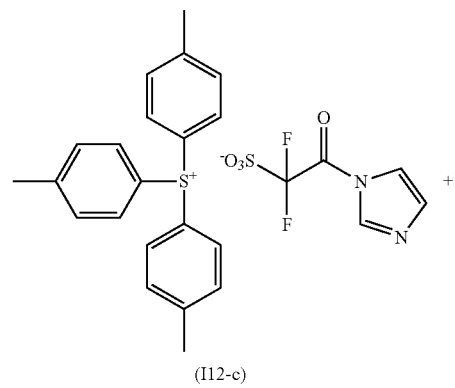
(I12-c)

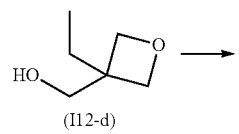
(I12-d)

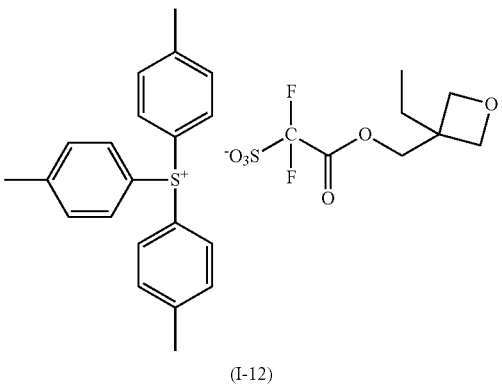
(I-12)

Ten point nine six (10.96) parts of the salt represented by the formula (I12-a), 50.00 parts of acetonitrile and 4.44 parts of the compound represented by the formula (I12-b) were mixed, and the resultant mixture was stirred at 80° C. for 30 minutes. The mixture obtained was cooled down to 23° C., and then, filtrated to obtain 60.54 parts of the solution containing the salt represented by the formula (I12-c).

The solution obtained and 2.57 parts of the compound represented by the formula (I12-d) available from Tokyo Chemical Industry Co., Ltd. were mixed, and the resultant mixture was stirred at 23° C. for 1 hour. The reaction mixture obtained was filtrated.

The filtrate obtained was concentrated. The concentrate obtained was mixed with 100 parts of chloroform and 30 parts of ion-exchanged water, and then the resultant mixture was stirred and separated to obtain an organic layer. This washing was repeated three times.

The organic layer obtained was concentrated to obtain 8.92 parts of the salt represented by the formula (I-12). This is called as Salt I-12.

MS (ESI(+) Spectrum): M+ 305.1
MS (ESI(−) Spectrum): M− 273.0

Synthetic Example 4

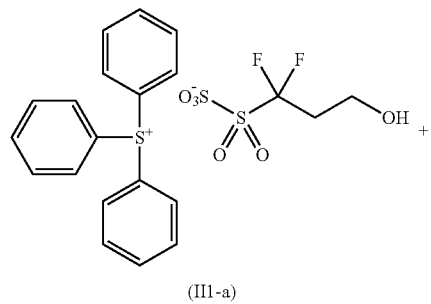
(III-a)

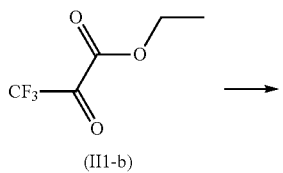
(III-b)

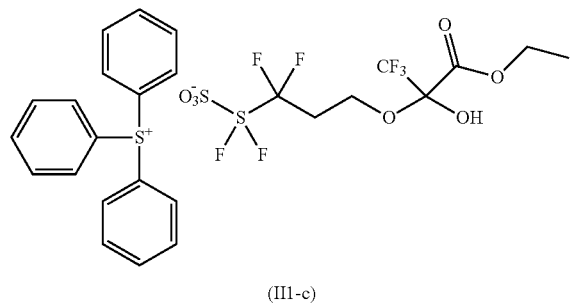
(III-c)

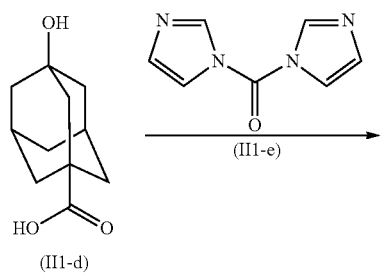
(III-d)   (III-e)

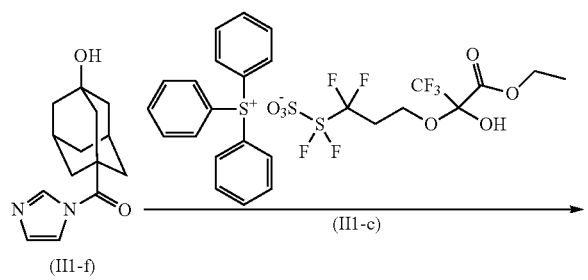
(III-f)   (III-c)

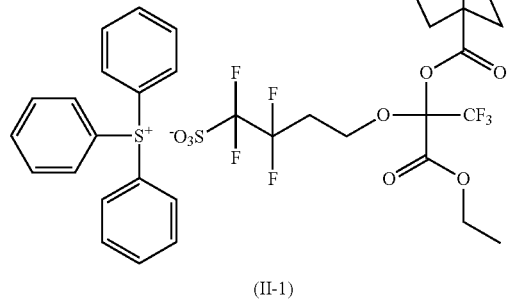
(II-1)

The salt represented by the formula (III-a) was prepared according to the method described in JP 2008-7409 A.

Ten (10) parts of the salt represented by the formula (III-a), 50.00 parts of N,N-dimethylformamide, 4.18 parts of the compound represented by the formula (III-b) and 0.70 part of p-toluenesulfonic acid were mixed, and the resultant mixture was stirred at 100° C. for 2 hours. The reaction mixture obtained was mixed with 200 parts of chloroform and 50 parts of ion-exchanged water, and then the resultant mixture was stirred for 30 minutes, and separated to obtain an organic layer. This washing was repeated three times.

The organic layer obtained was concentrated, and the concentrated was purified with column chromatography (silica gel available from Merck, silica gel 60-200 mesh, developer: chloroform/methanol=5/1) to obtain 2.40 parts of the salt represented by the formula (III-c).

A mixture prepared by mixing 0.63 part of the compound represented by the formula (III-d) with 10 parts of chloroform was stirred at 23° C. for 30 minutes. To the mixture, 0.55 part of the compound represented by the formula (III-e) was added, and the resultant mixture was stirred at 60° C. for 1 hour. The mixture obtained was cooled down to 23° C., and then, filtrated to obtain a solution containing the compound represented by the formula (III-f)

To the solution obtained, 2.10 parts of the salt represented by the formula (III-c) was added, and the resultant mixture was stirred at 60° C. for 6 hours. The reaction mixture obtained was mixed with 50 parts of chloroform and 20 parts of ion-exchanged water, and then the resultant mixture was stirred and separated to obtain an organic layer. This washing was repeated five times. The organic layer obtained was concentrated, and the concentrate was dissolved in 20 parts of acetonitrile. The solution obtained was concentrated.

To the concentrate obtained, 30 parts of tert-butyl methyl ether was added, and the resultant mixture was stirred and then, a supernatant was removed. The residue obtained was dissolved in acetonitrile, and the solution obtained was concentrated to obtain 1.69 parts of the salt represented by the formula (II-1). This is called as salt II-1.

MS (ESI(+) Spectrum): M+ 263.1
MS (ESI(−) Spectrum): M− 573.1

Synthetic Example 5

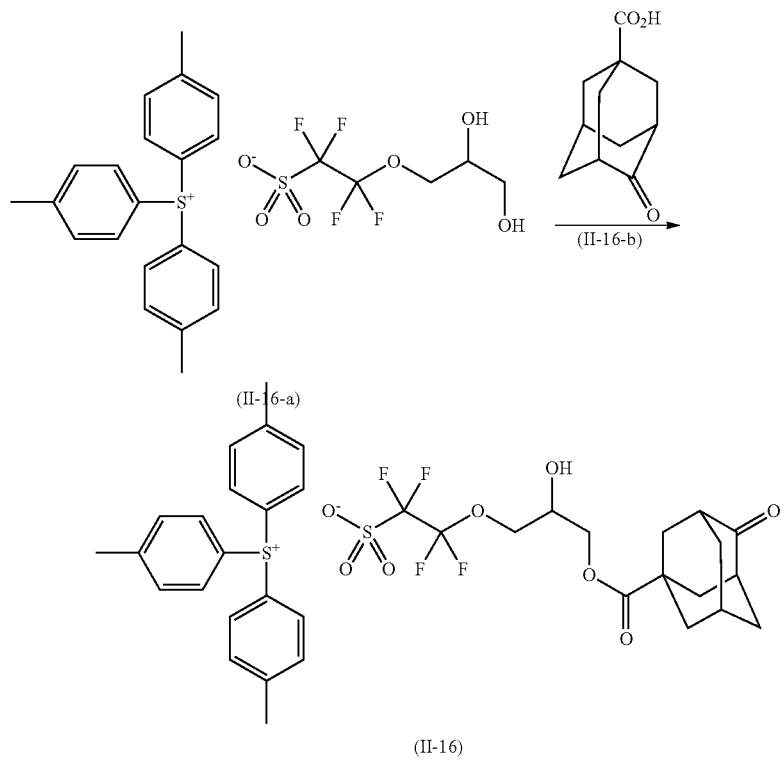

To the mixture obtained by mixing 7.12 parts of the compound represented by the formula (I1-16-b) with 28 parts of chloroform, 5.95 parts of 1,1'-carbonyldimidazole was added. The mixture obtained was stirred at 23° C. for 3 hours. To the reaction mixture obtained, a mixture obtained by mixing 14.10 parts of the salt represented by the formula (I1-16-a) with 50 parts of chloroform was added, and the resultant mixture was stirred at 23° C. for 1 hour.

The reaction mixture obtained was mixed with an aqueous potassium carbonate solution, and the mixture obtained was extracted with chloroform. The organic layer obtained was washed with ion-exchanged water, and then, concentrated under reduced pressure.

The residue obtained was mixed with a solution prepared by mixing acetonitrile, 2-methoxy-2-methylpropane and n-heptane, and the resultant mixture was stirred, and then, supernatant was removed.

The residue obtained was dried to obtain 12.00 parts of the salt represented by the formula (I1-16). This is called as Salt II-16.

MS (ESI(+) Spectrum): $M^+$ 305.1

MS (ESI(−) Spectrum): $M^-$ 447.1

Synthetic Example 6

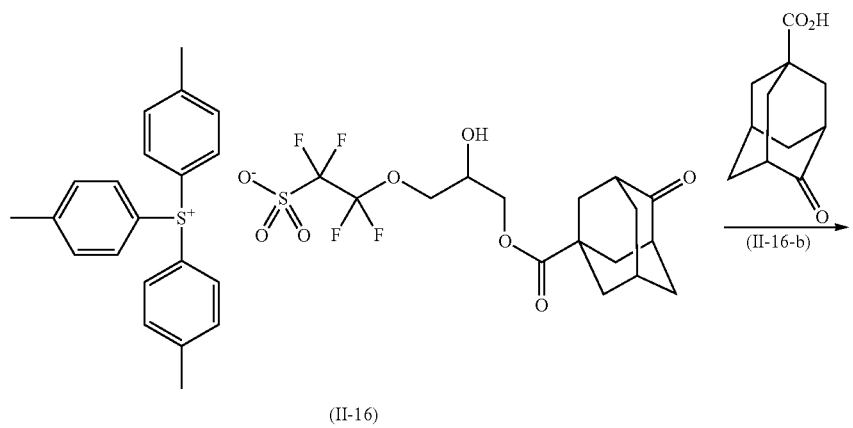

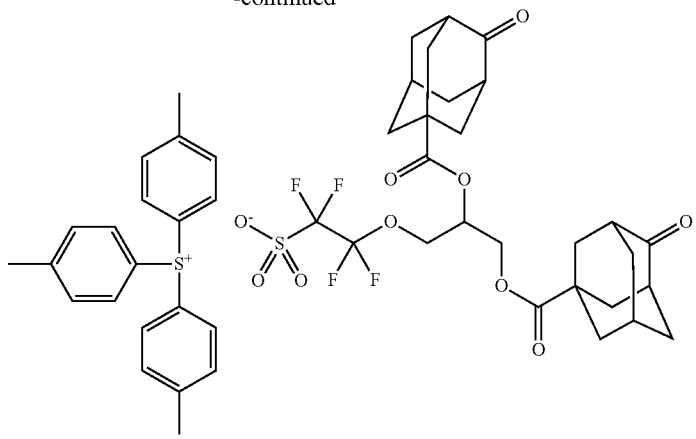

(II-19)

To the mixture obtained by mixing 1.90 parts of the compound represented by the formula (I1-16-b) with 7.6 parts of chloroform, 1.59 parts of 1,1'-carbonyldimidazole was added. The mixture obtained was stirred at 23° C. for 3 hours. To the reaction mixture obtained, a mixture obtained by mixing 4.9 parts of the salt represented by the formula (I1-16) with 7 parts of chloroform was added, and the resultant mixture was stirred under reflux for 3 hours. The reaction mixture obtained was mixed with an aqueous potassium carbonate solution, and the mixture obtained, was extracted with chloroform. The organic layer obtained was washed with ion-exchanged water, and then, concentrated under reduced pressure.

The residue obtained was mixed with a solution prepared by mixing acetonitrile, 2-methoxy-2-methylpropane and n-heptane, and the resultant mixture was stirred, and then, supernatant was removed.

The residue obtained was dried to obtain 5.90 parts of the salt represented by the formula (II-19). This is called as Salt II-19.

MS (ESI (+) Spectrum): M+ 305.1

MS (ESI (−) Spectrum): M− 623.2

Monomers used in the following Resin Synthesis Examples are following monomers represented by the formulae (A) to (G). The monomer represented by the formula (A) is called as Monomer (A).

The monomer represented by the formula (B) is called as Monomer (B). The monomer represented by the formula (C) is called as Monomer (C). The monomer represented by the formula (D) is called as Monomer (D) The monomer represented by the formula (E) is called as Monomer (E). The monomer represented by the formula (F) is called as Monomer (F). The monomer represented by the formula (G) is called as Monomer (G).

(A)

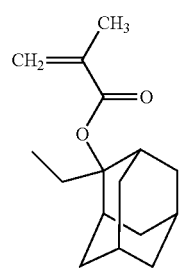

(B)

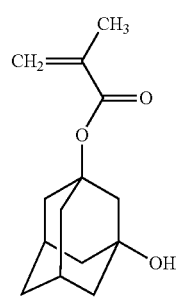

(C)

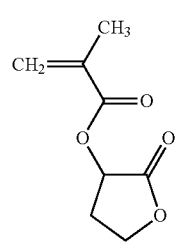

(D)

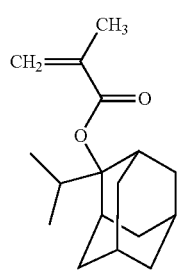

(E)

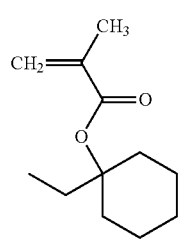

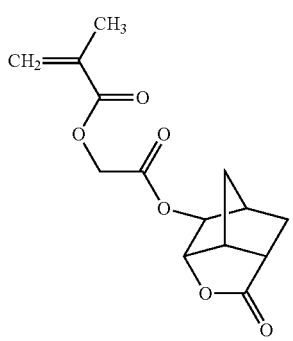

(F)

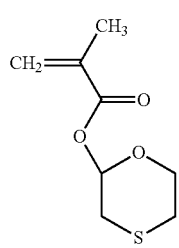

(G)

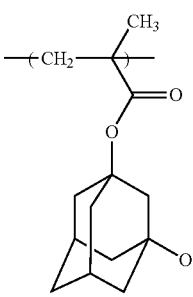

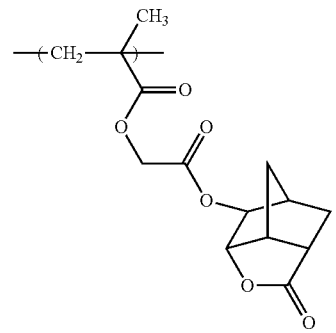

Resin Synthesis Example 1

The monomers (D), (E), (B), (C) and (F) were mixed in a molar ratio of 30/14/6/20/30 (monomer (D)/monomer (E)/monomer (B)/monomer (C)/monomer (F)), and 1,4-dioxane in 1.5 times part based on total parts of all monomers was added to prepare a solution. To the solution, azobisisobutyronitrile as an initiator in a ratio of 1 mol % based on all monomer molar amount and azobis(2,4-dimethylvaleronitrile) as an initiator in a ratio of 3 mol % based on all monomer molar amount were added, and the obtained mixture was heated at 73° C. for about 5 hours. The reaction mixture obtained was poured into a large amount of a mixture of methanol and water (ratio=4/1) to cause precipitation. The precipitate was collected by filtration and then, was dissolved in 1,4-dioxane followed by poured the resultant solution into a large amount of a mixture of methanol and water to cause precipitation. This operation was repeated three times for purification. As a result, a resin having a weight-average molecular weight of about $8.1 \times 10^3$ was obtained in a yield of 65%.

This resin is called as resin A1. Resin A1 had the following structural units.

Resin Synthesis Example 2

The monomers (A), (B) and (C) were mixed in a molar ratio of 50/25/25 (monomer (A)/monomer (B)/monomer (C)), and 1,4-dioxane in 1.5 times part based on total parts of all monomers was added to prepare a solution. To the solution, azobisisobutyronitrile as an initiator in a ratio of 1 mol % based on all monomer molar amount and azobis (2,4-dimethylvaleronitrile) as an initiator in a ratio of 3 mol % based on all monomer molar amount were added, and the obtained mixture was heated at 77° C. for about 5 hours. The reaction mixture obtained was poured into a large amount of a mixture of methanol and water (ratio=3/1) to cause precipitation.

The precipitate was collected by filtration and then, was dissolved in 1,4-dioxane followed by poured the resultant solution into a large amount of a mixture of methanol and water to cause precipitation.

This operation was repeated three times for purification. As a result, a resin having a weight-average molecular weight of about $8.0 \times 10^3$ was obtained in a yield of 60%. This resin is called as resin A2. Resin A2 had the following structural units.

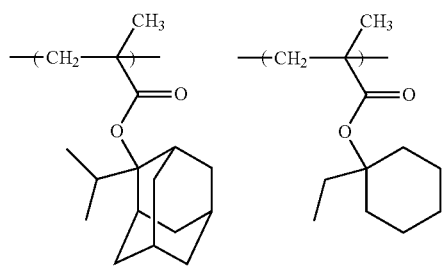

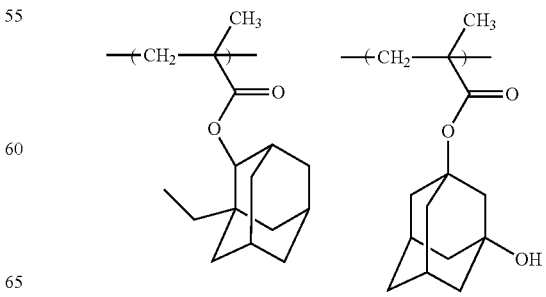

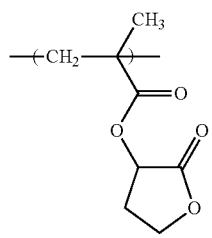

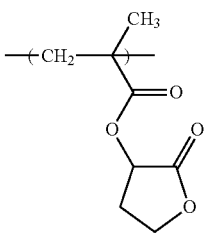

Resin Synthesis Example 3

The monomers (A), (E), (B), (D) and (C) were mixed in a molar ratio of 30/14/6/20/30 (monomer (A)/monomer (E)/monomer (B)/monomer (D)/monomer (C)), and 1,4-dioxane in 1.5 times part based on total parts of all monomers was added to prepare a solution. To the solution, azobisisobutyronitrile as an initiator in a ratio of 1 mol % based on all monomer molar amount and azobis(2,4-dimethylvaleronitrile) as an initiator in a ratio of 3 mol % based on all monomer molar amount were added, and the obtained mixture was heated at 75° C. for about 5 hours. The reaction mixture obtained was poured into a large amount of a mixture of methanol and water to cause precipitation.

The precipitate was collected by filtration and then, was dissolved in 1,4-dioxane followed by poured the resultant solution into a large amount of a mixture of methanol and water to cause precipitation.

This operation was repeated twice for purification. As a result, a resin having a weight-average molecular weight of about $7.2 \times 10^3$ was obtained in a yield of 78%. This resin is called as resin A3. Resin A3 had the following structural units.

Resin Synthesis Example 4

The monomers (A), (G), (B), (D) and (C) were mixed in a molar ratio of 30/14/6/20/30 (monomer (A)/monomer (G)/monomer (B)/monomer (D)/monomer (C)), and 1,4-dioxane in 1.5 times part based on total parts of all monomers was added to prepare a solution. To the solution, azobisisobutyronitrile as an initiator in a ratio of 1 mol % based on all monomer molar amount and azobis(2,4-dimethylvaleronitrile) as an initiator in a ratio of 3 mol % based on all monomer molar amount were added, and the obtained mixture was heated at 75° C. for about 5 hours. The reaction mixture obtained was poured into a large amount of a mixture of methanol and water to cause precipitation.

The precipitate was collected by filtration and then, was dissolved in 1,4-dioxane followed by poured the resultant solution into a large amount of a mixture of methanol and water to cause precipitation.

This operation was repeated twice for purification. As a result, a resin having a weight-average molecular weight of about $7.2 \times 10^3$ was obtained in a yield of 78%. This resin is called as resin A4. Resin A4 had the following structural units.

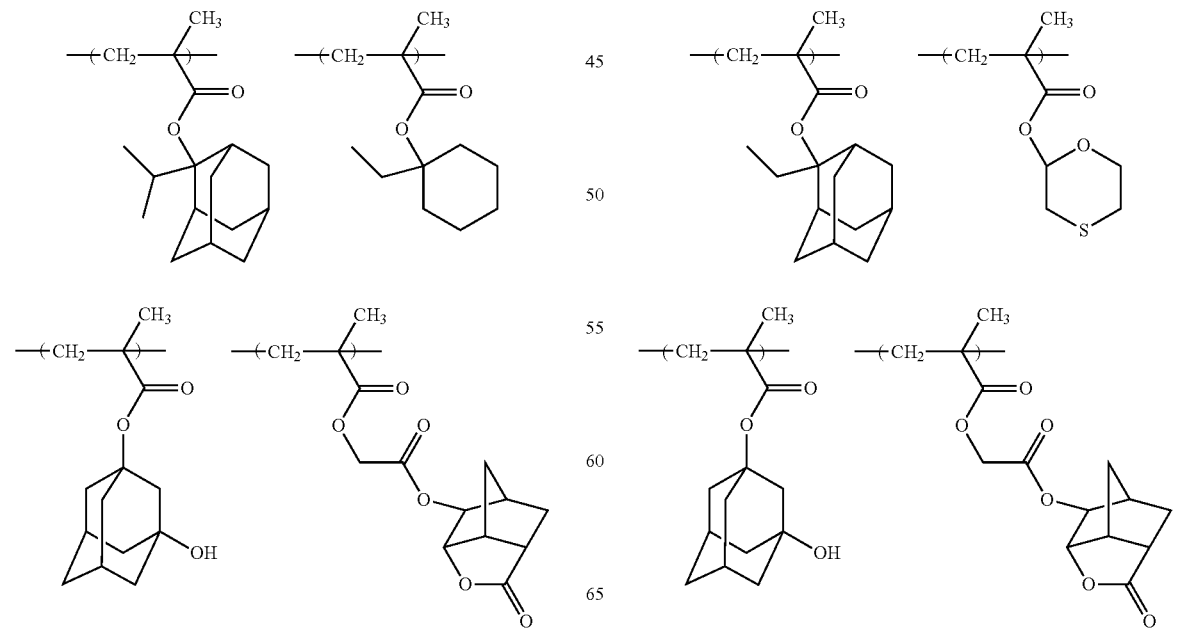

-continued

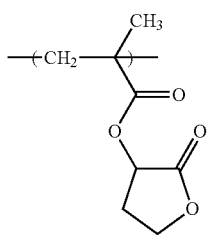

Examples 1 to 25 and Comparative Examples 1 to 3

Resin

Resin A1, A2, A3, A4

<Acid Generator>

I1: Salt I-1

I5: Salt I-5

I12: Salt I-12

II1: Salt II-1

II²: Salt represented by the following formula, which was manufactured by Central Glass Co., Ltd.

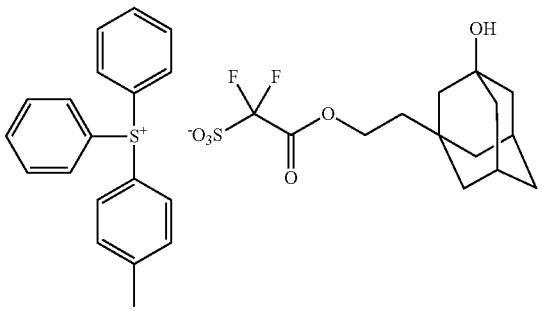

II16: Salt II-16

II19: Salt II-19

B1:

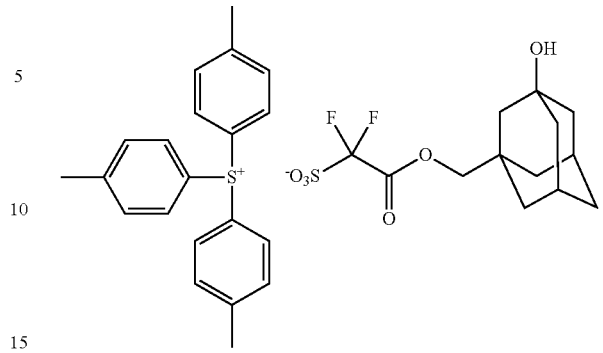

which was prepared according to the method described in JP 2010-152341 A

B2:

which was prepared according to the method described in JP 2007-161707 A

<Quencher>

C1: 2,6-diisopropylaniline

<Solvent>

E1:

| | |
|---|---|
| propylene glycol monomethyl ether acetate | 265 parts |
| propylene glycol monomethyl ether | 20 parts |
| 2-heptanone | 20 parts |
| γ-butyrolactone | 3.5 parts |

The following components were mixed and dissolved, further, filtrated through a fluorine resin filter having pore diameter of 0.2 μm, to prepare photoresist compositions.

Resin (kind and amount are described in Table 5 and Table 6)

Acid generator (kind and amount are described in Table 5 and Table 6)

Quencher (kind and amount are described in Table 5 and Table 6)

Solvent E1

TABLE 5

| Ex. No. | Resin (kind/amount (part)) | Acid generator (kind/amount (part)) | Quencher (kind/amount (part)) | PB (°C.) | PeB (°C.) |
|---|---|---|---|---|---|
| Ex. 1 | A1/10 | I1/0.3 II1/0.7 | C1/0.07 | 100 | 90 |
| Ex. 2 | A1/10 | I1/0.5 II1/0.5 | C1/0.07 | 100 | 90 |
| Ex. 3 | A1/10 | I1/0.7 II1/0.3 | C1/0.07 | 100 | 90 |
| Ex. 4 | A1/10 | I1/0.2 II1/0.5 B1/0.3 | C1/0.07 | 100 | 90 |
| Ex. 5 | A1/10 | I1/0.5 II2/0.5 | C1/0.07 | 100 | 90 |
| Ex. 6 | A2/10 | I1/0.5 II1/0.5 | C1/0.07 | 110 | 100 |
| Ex. 7 | A2/10 | I1/0.5 II2/0.5 | C1/0.07 | 110 | 100 |
| Ex. 8 | A3/10 | I1/0.3 II1/0.7 | C1/0.07 | 110 | 100 |
| Ex. 9 | A3/10 | I1/0.2 II1/0.6 B1/0.2 | C1/0.07 | 110 | 100 |
| Ex. 10 | A3/10 | I1/0.2 II2/0.6 B1/0.2 | C1/0.07 | 110 | 100 |
| Ex. 11 | A3/10 | I5/0.2 II1/0.6 B1/0.2 | C1/0.07 | 110 | 100 |

TABLE 5-continued

| Ex. No. | Resin (kind/amount (part)) | Acid generator (kind/amount (part)) | Quencher (kind/amount (part)) | PB (° C.) | PeB (° C.) |
|---|---|---|---|---|---|
| Ex. 12 | A3/10 | I12/0.2<br>II1/0.6<br>B1/0.2 | C1/0.07 | 110 | 100 |
| Ex. 13 | A3/10 | I12/0.2<br>II2/0.6<br>B1/0.2 | C1/0.07 | 110 | 100 |
| Ex. 14 | A4/10 | I1/0.3<br>II1/0.7 | C1/0.07 | 110 | 100 |
| Ex. 15 | A4/10 | I1/0.2<br>II1/0.6<br>B1/0.2 | C1/0.07 | 110 | 100 |
| Ex. 16 | A4/10 | I1/0.2<br>II2/0.6<br>B1/0.2 | C1/0.07 | 110 | 100 |

TABLE 6

| Ex. No. | Resin (kind/amount (part)) | Acid generator (kind/amount (part)) | Quencher (kind/amount (part)) | PB (° C.) | PeB (° C.) |
|---|---|---|---|---|---|
| Ex. 17 | A4/10 | I5/0.2<br>II1/0.6<br>B1/0.2 | C1/0.07 | 110 | 100 |
| Ex. 18 | A4/10 | I12/0.2<br>II1/0.6<br>B1/0.2 | C1/0.07 | 110 | 100 |
| Ex. 19 | A4/10 | I12/0.2<br>II2/0.6<br>B1/0.2 | C1/0.07 | 110 | 100 |
| Ex. 20 | A3/10 | I1/0.3<br>II16/0.7 | C1/0.07 | 110 | 100 |
| Ex. 21 | A3/10 | I1/0.3<br>II19/0.7 | C1/0.07 | 110 | 100 |
| Ex. 22 | A3/10 | I1/0.2<br>II16/0.6<br>B1/0.2 | C1/0.07 | 110 | 100 |
| Ex. 23 | A3/10 | I1/0.2<br>II19/0.6<br>B1/0.2 | C1/0.07 | 110 | 100 |
| Ex. 24 | A3/10 | I12/0.2<br>II16/0.6<br>B1/0.2 | C1/0.07 | 110 | 100 |
| Ex. 25 | A3/10 | I12/0.2<br>II19/0.6<br>B1/0.2 | C1/0.07 | 110 | 100 |
| Comp. Ex. 1 | A2/10 | B1/1.0 | C1/0.07 | 110 | 100 |
| Comp. Ex. 2 | A1/10 | I1/1.0 | C1/0.07 | 100 | 90 |
| Comp. Ex. 3 | A1/10 | II1/1.0 | C1/0.07 | 100 | 90 |

Silicon wafers were each coated with "ARC-29", which is an organic anti-reflective coating composition available from Nissan Chemical Industries, Ltd., and then baked at 205° C. for 60 seconds, to form a 78 nm-thick organic anti-reflective coating. Each of the photoresist compositions prepared as above was spin-coated over the anti-reflective coating so that the thickness of the resulting film became 85 nm after drying. The silicon wafers thus coated with the respective photoresist compositions were each prebaked on a direct hotplate at a temperature shown in the column "PB" in Table 5 or Table 6 for 60 seconds. Using an ArF excimer stepper for immersion exposure ("XT: 1900Gi" manufactured by ASML, NA=1.35, 3/4 Annular, X-Y polarization), each wafer thus formed with the respective resist film was subjected to line and space pattern and isolated pattern for correction at the corner of the line and space pattern exposure with the exposure quantity being varied stepwise. Ultrapure water was used as an immersion medium.

After the exposure, each wafer was subjected to post-exposure baking on a hotplate at a temperature shown in the column "PEB" in Table 5 and 6 for 60 seconds and then to paddle development for 60 seconds with an aqueous solution of 2.38% by mass tetramethylammonium hydroxide.

Each of patterns developed on the organic anti-reflective coating substrate after the development was observed with a scanning electron microscope, the results of which are shown in Table 7.

Effective sensitivity (ES): It was expressed as the amount of exposure that the line and space pattern of 50 nm became 1:1 after exposure through line and space pattern mask and development.

Pattern Profile: The photoresist pattern at the exposure amount of ES was observed with a scanning electron microscope. When 50 nm line and space pattern was resolved and the cross-section shape of the pattern is rectangle as shown in the following (a), the pattern profile is good and its evaluation is marked by "○", and when 50 nm line and space pattern was resolved but the upper side of the cross-section shape of the pattern is round as shown in the following (b), the pattern profile is bad and its evaluation is marked by "X"

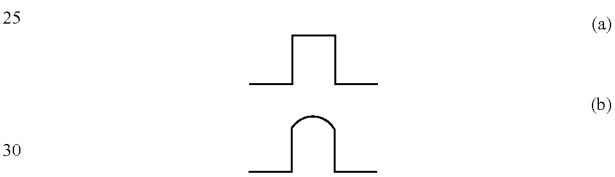

Evaluation of Isolated Pattern for Correction: The isolated pattern for correction of the line and space pattern of 50 nm was observed with a scanning electron microscope. When the isolated pattern for correction was not observed, the pattern profile is good and its evaluation is marked by "○", and when the isolated pattern for correction or the residue thereof was observed, the pattern profile is bad and its evaluation is marked by "X".

TABLE 7

| Ex. No. | Pattern Profile | Evaluation of Isolated Pattern for Correction |
|---|---|---|
| Ex. 1 | ○ | ○ |
| Ex. 2 | ○ | ○ |
| Ex. 3 | ○ | ○ |
| Ex. 4 | ○ | ○ |
| Ex. 5 | ○ | ○ |
| Ex. 6 | ○ | ○ |
| Ex. 7 | ○ | ○ |
| Ex. 8 | ○ | ○ |
| Ex. 9 | ○ | ○ |
| Ex. 10 | ○ | ○ |
| Ex. 11 | ○ | ○ |
| Ex. 12 | ○ | ○ |
| Ex. 13 | ○ | ○ |
| Ex. 14 | ○ | ○ |
| Ex. 15 | ○ | ○ |
| Ex. 16 | ○ | ○ |
| Ex. 17 | ○ | ○ |
| Ex. 18 | ○ | ○ |
| Ex. 19 | ○ | ○ |
| Ex. 20 | ○ | ○ |
| Ex. 21 | ○ | ○ |
| Ex. 22 | ○ | ○ |
| Ex. 23 | ○ | ○ |
| Ex. 24 | ○ | ○ |
| Ex. 25 | ○ | ○ |

TABLE 7-continued

| Ex. No. | Pattern Profile | Evaluation of Isolated Pattern for Correction |
|---|---|---|
| Comp. Ex. 1 | X | X |
| Comp. Ex. 2 | ○ | X |
| Comp. Ex. 3 | X | ○ |

The photoresist composition of the present invention provides a photoresist pattern having a good pattern profile and a good profile of isolated pattern for correction.

What is claimed is:

1. A photoresist composition comprising a salt represented by the formula (I):

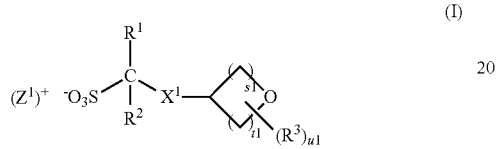

wherein $R^1$ and $R^2$ independently each represent a fluorine atom or a C1-C6 perfluoroalkyl group, $X^1$ represents a C1-C17 divalent saturated hydrocarbon group in which one or more hydrogen atoms can be replaced by a fluorine atom and in which one or more —CH$_2$— can be replaced by —O— or —CO—, s1 represents 1 or 2, and t1 represents 0 or 1, with proviso that the sum of s1 and t1 is 1 or 2, $R^3$ represents a C6-C18 aromatic hydrocarbon group or a C1-C12 saturated hydrocarbon group in which one or more hydrogen atoms can be replaced by a C1-C6 alkyl group or a nitro group and in which one or more —CH$_2$— can be replaced by —O—, u1 represents an integer of 0 to 5, and $(Z^1)^+$ represents an organic cation, a salt represented by the formula (II), the formula (III-A) or the formula (III-B):

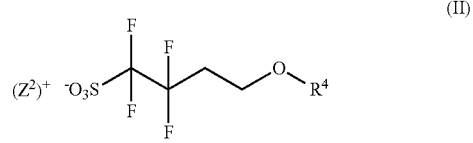

wherein $R^4$ in formula (II) is a group represented by the formula (II-A)

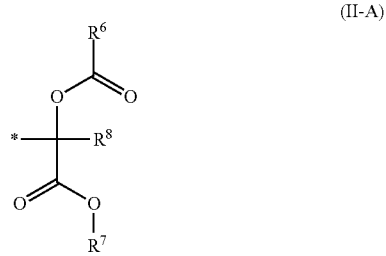

wherein $R^6$ represents a C1-C17 hydrocarbon group in which one or more hydrogen atoms can be replaced by a fluorine atom or —OH and in which one or more —CH$_2$— can be replaced by —O— or —CO—, $R^7$ represents a C1-C6 alkyl group, and $R^8$ represents a C1-C6 fluorinated alkyl group, and $(Z^2)^+$ represents an organic cation;

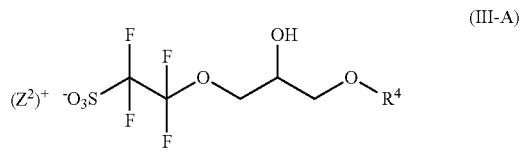

wherein $R^4$ in formula (III-A) represents a C1-C24 hydrocarbon group in which one or more hydrogen atoms can be replaced by a fluorine atom or —OH and in which one or more —CH$_2$— can be replaced by —O— or —CO—, and $(Z^2)^+$ is the same as defined above;

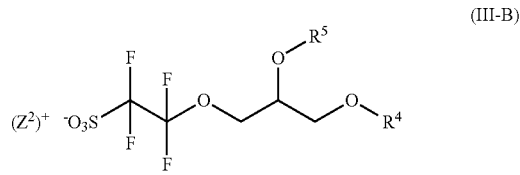

wherein $R^4$ in formula (III-B) represents a C1-C24 hydrocarbon group in which one or more hydrogen atoms can be replaced by a fluorine atom or —OH and in which one or more —CH$_2$— can be replaced by —O— or —CO—, and $(Z^2)^+$ is the same as defined above, and $R^5$ represents a C1-C24 hydrocarbon group in which one or more hydrogen atoms can be replaced by a fluorine atom or —OH and in which one or more —CH$_2$— can be replaced by —O— or —CO—, and a resin being insoluble or poorly soluble in an aqueous alkali solution but becoming soluble in an aqueous alkali solution by the action of an acid.

2. The photoresist composition according to claim 1, containing a salt represented by the formula (II).

3. The photoresist composition according to claim 1, wherein $X^1$ is *—CO—O—CH$_2$— in which * represents a binding position to —C($R^1$)($R^2$)—.

4. The photoresist composition according to claim 1, wherein $(Z^1)^+$ is a triarylsulfonium cation.

5. The photoresist composition according to claim 1, wherein $(Z^2)^+$ is a triarylsulfonium cation.

6. The photoresist composition according to claim 1 or 2, which further comprises a solvent.

7. The photoresist composition according to claim 1 or 2, which further comprises a basic compound.

8. A process for producing a photoresist pattern comprising:
(1) a step of applying the photoresist composition according to claim 1 or 2 on a substrate to form a photoresist composition layer,
(2) a step of forming a photoresist film by drying the photoresist composition layer formed,
(3) a step of exposing the photoresist film to radiation,
(4) a step of heating the photoresist film after exposing, and
(5) a step of developing the photoresist film after heating.

* * * * *